US007859627B2

(12) United States Patent
Nishida et al.

(10) Patent No.: US 7,859,627 B2
(45) Date of Patent: *Dec. 28, 2010

(54) ANTIREFLECTIVE FILM INCLUDING PYRAMIDAL PROJECTIONS AND DISPLAY DEVICE INCLUDING ANTIREFLECTIVE FILM COMPRISING PYRAMIDAL PROJECTIONS

(75) Inventors: Jiro Nishida, Kanagawa (JP); Yuji Egi, Kanagawa (JP); Takeshi Nishi, Kanagawa (JP); Shunpei Yamazaki, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 47 days.

This patent is subject to a terminal disclaimer.

(21) Appl. No.: 11/950,677

(22) Filed: Dec. 5, 2007

(65) Prior Publication Data

US 2008/0165315 A1    Jul. 10, 2008

(30) Foreign Application Priority Data

Dec. 5, 2006    (JP)    .............................. 2006-327787

(51) Int. Cl.
*G02F 1/1335*    (2006.01)
*G02B 27/00*    (2006.01)
*H01J 17/49*    (2006.01)

(52) U.S. Cl. ........................ 349/137; 313/582; 313/495; 359/601

(58) Field of Classification Search .................. 349/137; 359/586, 601, 613

See application file for complete search history.

(56) References Cited

U.S. PATENT DOCUMENTS

| 4,721,361 | A  | * | 1/1988 | van de Ven | ................ 359/457 |
| 6,635,986 | B2 |   | 10/2003 | Yaniv et al. | |
| 6,811,274 | B2 |   | 11/2004 | Olczak | |
| 6,825,896 | B2 |   | 11/2004 | Goto et al. | |
| 6,833,665 | B2 |   | 12/2004 | Wachi et al. | |

(Continued)

FOREIGN PATENT DOCUMENTS

JP    07168006    A    *    7/1995

(Continued)

OTHER PUBLICATIONS

Yamada et al., English language machine translation of JP 07-168006 A.*

(Continued)

*Primary Examiner*—Mark A Robinson
*Assistant Examiner*—Michael Inadomi
(74) *Attorney, Agent, or Firm*—Nixon Peabody LLP; Jeffrey L. Costellia

(57) ABSTRACT

An object of the present invention is to provide an antireflective film having an anti-reflection function with which reflection of external light which is incident on the antireflective film can be further reduced and a high-visibility display device having such an antireflective film. The tops of the plurality of pyramidal projections are evenly spaced and each side of the base of a pyramidal projection is in contact with one side of the base of an adjacent pyramidal projection. That is, one pyramidal projection is surrounded by other pyramidal projections, and the base of the pyramidal projection and the base of the adjacent pyramidal projection have a side in common.

22 Claims, 36 Drawing Sheets

U.S. PATENT DOCUMENTS

| | | |
|---|---|---|
| 6,951,400 B2 | 10/2005 | Chisholm et al. |
| 7,094,452 B2 | 8/2006 | Yamashita et al. |
| 7,151,580 B2 | 12/2006 | Ueki et al. |
| 7,297,386 B2 | 11/2007 | Suzuki et al. |
| 7,301,264 B2 | 11/2007 | Ohsawa |
| 7,659,669 B2 * | 2/2010 | Nishida et al. ............... 313/582 |
| 2002/0044356 A1 | 4/2002 | Arakawa et al. |
| 2003/0102286 A1 | 6/2003 | Takahara et al. |
| 2003/0169386 A1 * | 9/2003 | Goto et al. .................... 349/65 |
| 2003/0180476 A1 * | 9/2003 | Yamashita et al. ........... 428/1.1 |
| 2004/0109303 A1 | 6/2004 | Olczak |
| 2004/0109305 A1 | 6/2004 | Chisholm et al. |
| 2004/0227446 A1 | 11/2004 | Fujimoto et al. |
| 2005/0030461 A1 * | 2/2005 | Ono et al. .................... 349/141 |
| 2005/0053790 A1 * | 3/2005 | Kato ......................... 428/421 |
| 2005/0074579 A1 * | 4/2005 | Suzuki et al. ............... 428/141 |
| 2005/0190321 A1 | 9/2005 | Ohsawa |
| 2006/0050387 A1 | 3/2006 | Arakawa et al. |
| 2006/0172119 A1 | 8/2006 | Hayashi et al. |
| 2006/0250064 A1 * | 11/2006 | Park et al. ................... 313/112 |
| 2007/0284991 A1 | 12/2007 | Egi et al. |
| 2008/0042926 A1 * | 2/2008 | Egi et al. ...................... 345/32 |
| 2008/0129183 A1 | 6/2008 | Egi et al. |
| 2008/0129184 A1 | 6/2008 | Nishida et al. |
| 2008/0129188 A1 | 6/2008 | Egi et al. |
| 2008/0129933 A1 | 6/2008 | Nishida et al. |
| 2008/0130122 A1 * | 6/2008 | Egi et al. .................... 359/613 |
| 2008/0144180 A1 * | 6/2008 | Nishida et al. ............... 359/601 |
| 2008/0158682 A1 | 7/2008 | Egi et al. |

FOREIGN PATENT DOCUMENTS

| | | |
|---|---|---|
| JP | 08-297202 | 11/1996 |
| JP | 2003-177207 | 6/2003 |
| JP | 2003-248102 | 9/2003 |
| JP | 2003-279705 | 10/2003 |
| JP | 2003-295778 | 10/2003 |
| JP | 2004-085831 | 3/2004 |
| JP | 2004-177781 | 6/2004 |
| JP | 2004-291500 | 10/2004 |
| JP | 2005064324 A * | 3/2005 |
| JP | 2005-173457 | 6/2005 |
| JP | 2005-181740 | 7/2005 |
| JP | 2005-264099 | 9/2005 |
| JP | 2006-010831 | 1/2006 |
| JP | 2006-133617 | 5/2006 |
| JP | 2006-171229 | 6/2006 |
| JP | 2006-189784 | 7/2006 |
| WO | WO-2004/051325 A1 | 6/2004 |
| WO | WO-2005/010572 A1 | 2/2005 |
| WO | WO-2005/088355 A1 | 9/2005 |

OTHER PUBLICATIONS

International Search Report for International Application No. PCT/JP2007/073430; mailed Jan. 8, 2008.

Written Opinion for International Application No. PCT/JP2007/073430; mailed Jan. 8, 2008.

\* cited by examiner

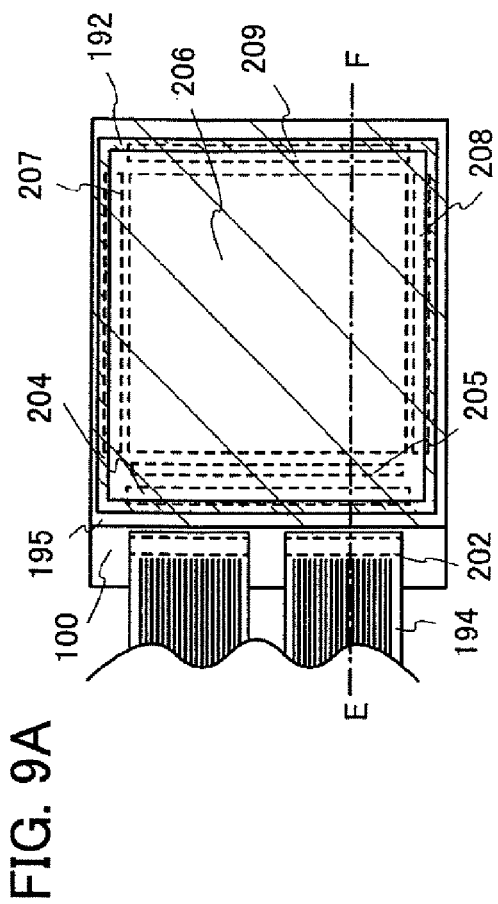
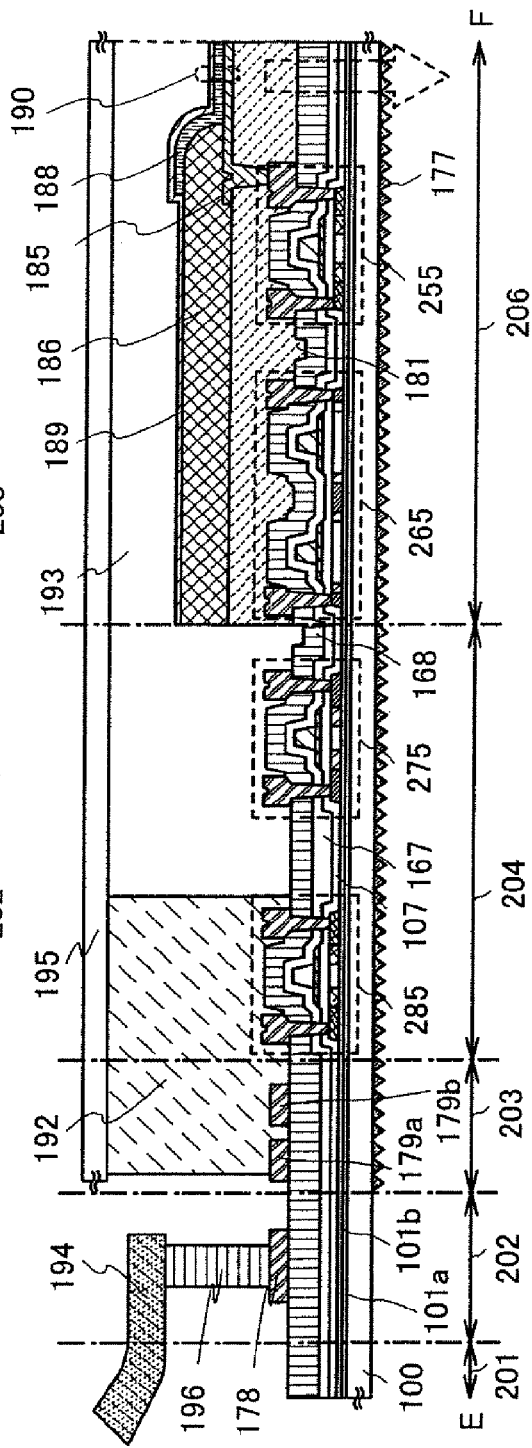
FIG. 9A
FIG. 9B

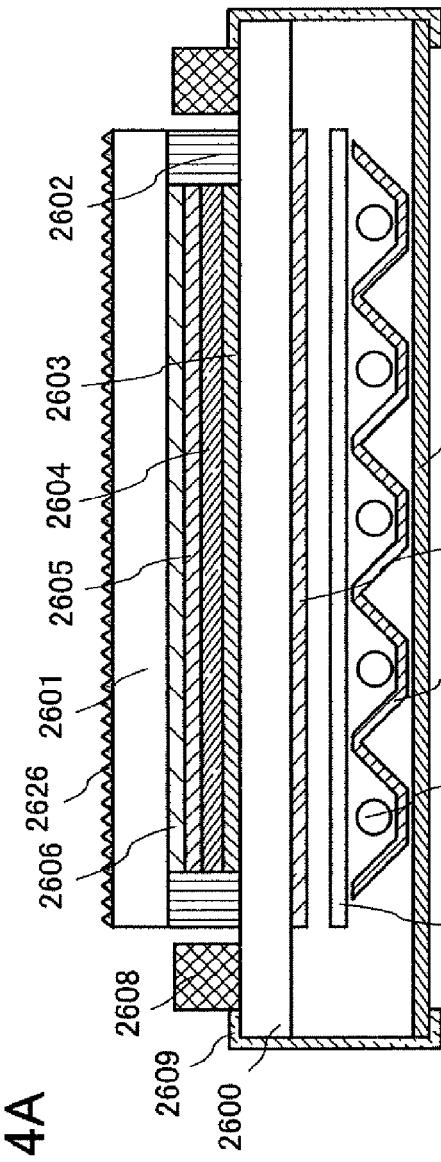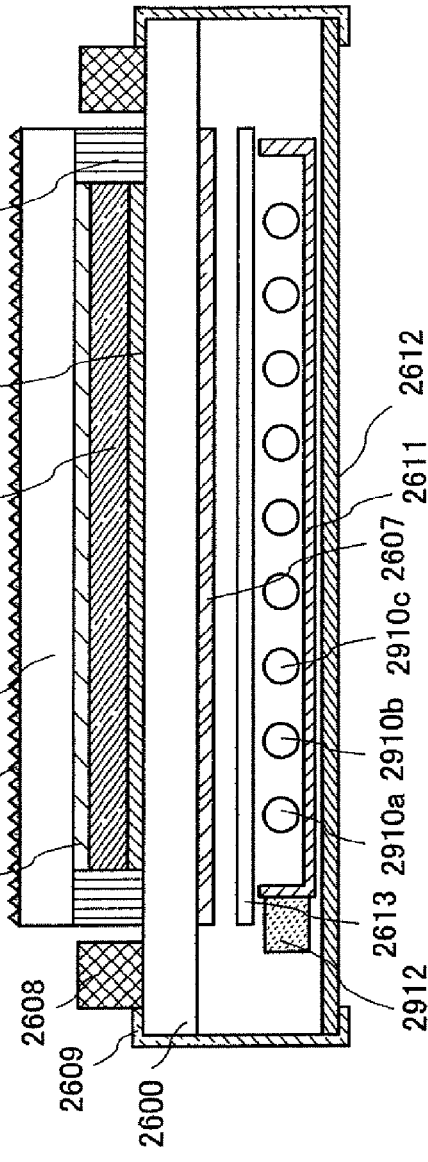
FIG. 14A
FIG. 14B

ANTIREFLECTIVE FILM INCLUDING PYRAMIDAL PROJECTIONS AND DISPLAY DEVICE INCLUDING ANTIREFLECTIVE FILM COMPRISING PYRAMIDAL PROJECTIONS

TECHNICAL FIELD

The present invention relates to an antireflective film having an anti-reflection function and a display device having the antireflective film.

BACKGROUND ART

As to some display devices having various displays (such as a liquid crystal display and an electroluminescent display (hereinafter also referred to as an EL display)), there may be a case where it becomes difficult to see a display screen due to reflection of its surroundings by surface reflection of incident light from external and thus visibility is decreased. This is a particularly significant problem when a display device grows in size or is used outside.

In order to prevent such reflection of external light incident on the antireflective film, a method of providing an antireflective film over a display screen surface of a display device has been employed. For example, there is a method of providing a multilayer structure of stacked layers having different refractive indices for an antireflective film so that the antireflective film is effective for a wide visible light wavelength range (see, for example, Patent Document 1: Japanese Published Patent Application No. 2003-248102). With a multilayer structure, incident light from external reflected at each interface between the stacked layers interfere and cancel each other, which provides an anti-reflection effect.

As to an antireflective structure, fine conical or pyramidal projections are arranged over a substrate to reduce reflectance of light on a surface of the substrate (for example, see Patent Document 2: Japanese Published Patent Application No. 2004-85831).

DISCLOSURE OF INVENTION

However, with the above-described multilayer structure, a light beam, which cannot be cancelled, of the incident light from external reflected at each layer interface is emitted to the viewer side as reflected light. In order to achieve mutual cancellation of incident light from external, it is necessary to precisely control optical characteristics of materials, thicknesses, and the like of films to be stacked, and it has been difficult to perform anti-reflection treatment on all incident light from external which are incident from various angles. Further an anti-reflection function of a conical or pyramidal antireflective structure has been not enough.

In view of the foregoing, a conventional antireflective film has a functional limitation, and an antireflective film having a higher anti-reflection function, and a display device having such an anti-reflection function have been demanded.

It is an object of the present invention to provide a high-visibility display device with an anti-reflection function with which reflection of light from external can be further reduced, and a method for manufacturing such a display device.

According to the present invention, since the plurality of pyramidal projections are densely arranged with no space therebetween, a refractive index varies from the display screen surface side to the outside (the air) due to the physical shape of a pyramidal projection. In the present invention, the tops of the plurality of pyramidal projections are evenly spaced and each side of the base of a pyramidal projection is in contact with one side of the base of an adjacent pyramidal projection. That is, one pyramidal projection is surrounded by other pyramidal projections, and the base of the pyramidal projection and the base of the adjacent pyramidal projection have a side in common.

Thus, since the pyramidal projections are densely arranged so that the tops thereof are evenly spaced, the antireflective film has a high anti-reflection function with which incident light can be efficiently scattered in many directions.

In the present invention, the distance between the tops of the plurality of pyramidal projections is preferably equal to or shorter than 350 nm, and the height of each of the plurality of pyramidal projections is preferably equal to or longer than 800 nm. The fill rate of bases of the plurality of pyramidal projections per unit area of a display screen (the rate of the display screen which is filled (occupied)) is equal to or more than 80%, preferably equal to or more than 90%. A fill rate is a rate of a formation region of pyramidal projections over a display screen surface. When the fill rate is equal to or more than 80%, the rate of plane portions where no pyramidal projection is formed (which is parallel to the display screen) is equal to or less than 20%. The ratio of the height of a pyramidal projection to the width of a base thereof is equal to or more than 5.

According to the present invention, an antireflective film (substrate) and a display device having a plurality of pyramidal projections which are adjacent to each other can be provided, and a high anti-reflection function can be provided.

The present invention can also be applied to a display device that is a device having a display function. A display device using the present invention may be a light-emitting display device in which a light-emitting element including a layer containing an organic material, an inorganic material, or a mixture of an organic material and an inorganic material which produces light emission called electroluminescence (hereinafter also referred to as EL) between electrodes is connected to a TFT; a liquid crystal display device using a liquid crystal element containing a liquid crystal material as a display element; or the like. In the present invention, a display device corresponds to a device including a display element (a liquid crystal element, a light-emitting element, or the like). It is to be noted that a display device may be a main body of a display panel in which a plurality of pixels including display elements such as liquid crystal elements or EL elements and a peripheral driver circuits for driving the pixels are formed over a substrate. Further, a display device may be the one provided with a flexible printed circuit (FPC) or a printed wiring board (PWB) which includes one or more of an IC, a resistor, a capacitor, an inductor, a transistor, and the like. Moreover, a display device may include an optical sheet such as a polarizing plate or a retardation film. In addition, a backlight (such as a light guide plate, a prism sheet, a diffusion sheet, a reflection sheet, a light source (an LED, a cold-cathode tube, or the like)) may be included.

Note that various modes can be applied to a display element and a display device, and they can have various elements. For example, a display medium in which contrast is changed by an electromagnetic effect can be used, such as an EL element (for example, an organic EL element, an inorganic EL element, an EL element containing an organic material and an inorganic material), an electron discharging element, a liquid crystal element, an electron ink, a grating light valve (GLV), a plasma display (PDP), a digital micromirror device (DMD), a piezoelectric ceramic display, or a carbon nanotube. It is to be noted that a display device using an EL element may be an EL display; a display device using an electron discharging element may be a field emission display (FED), an SED type flat panel display (Surface-conduction Electron-emitter Display), or the like; a display device using a liquid crystal element may be a liquid crystal display, a transmissive liquid crystal display, a semi-transmissive liquid crystal display, or a reflective liquid crystal display; and a display device using an electron ink may be electronic paper.

One mode of the antireflective film of the present invention has a plurality of pyramidal projections, wherein tops of the plurality of pyramidal projections are evenly spaced, and each side of the base of one pyramidal projection is in contact with one side of the base of an adjacent pyramidal projection.

Another mode of the antireflective film of the present invention has a plurality of pyramidal projections, wherein tops of the plurality of pyramidal projections are evenly spaced, six adjacent pyramidal projections are arranged around one pyramidal projection, and each side of the base of one pyramidal projection is in contact with one side of the base of an adjacent pyramidal projection.

Another mode of the antireflective film of the present invention has a plurality of pyramidal projections, wherein tops of the plurality of pyramidal projections are evenly spaced, each side of the base of one pyramidal projection is in contact with one side of the base of an adjacent pyramidal projection, the distance between the tops of the plurality of pyramidal projections is equal to or shorter than 350 nm, and the height of each of the plurality of pyramidal projections is equal to or longer than 800 nm.

Another mode of the antireflective film of the present invention has a plurality of pyramidal projections, wherein tops of the plurality of pyramidal projections are evenly spaced, six adjacent pyramidal projections are arranged around one pyramidal projection, each side of the base of one pyramidal projection is in contact with one side of the base of an adjacent pyramidal projection, the distance between the tops of the plurality of pyramidal projections is equal to or shorter than 350 nm, and the height of each of the plurality of pyramidal projections is equal to or longer than 800 nm.

Another mode of the antireflective film of the present invention has a plurality of pyramidal projections, wherein tops of the plurality of pyramidal projections are evenly spaced, each side of the base of one pyramidal projection is in contact with one side of the base of an adjacent pyramidal projection, the distance between the tops of the plurality of pyramidal projections is equal to or shorter than 350 nm, the height of each of the plurality of pyramidal projections is equal to or longer than 800 nm, and the fill rate of bases of the plurality of pyramidal projections per unit area is equal to or more than 80%.

Another mode of the antireflective film of the present invention has a plurality of pyramidal projections, wherein tops of the plurality of pyramidal projections are evenly spaced, six adjacent pyramidal projections are arranged around one pyramidal projection, each side of the base of one pyramidal projection is in contact with one side of the base of an adjacent pyramidal projection, the distance between the tops of the plurality of pyramidal projections is equal to or shorter than 350 nm, the height of each of the plurality of pyramidal projections is equal to or longer than 800 nm, and the fill rate of bases of the plurality of pyramidal projections per unit area is equal to or more than 80%.

Another mode of the antireflective film of the present invention has a plurality of pyramidal projections, wherein tops of the plurality of pyramidal projections are evenly spaced, each side of the base of one pyramidal projection is in contact with one side of the base of an adjacent pyramidal projection, the distance between the tops of the plurality of pyramidal projections is equal to or shorter than 350 nm, the height of each of the plurality of pyramidal projections is equal to or longer than 800 nm, the fill rate of bases of the plurality of pyramidal projections per unit area is equal to or more than 80%, and the ratio of the height of a pyramidal projection to the width of a base thereof is equal to or more than 5.

Another mode of the antireflective film of the present invention has a plurality of pyramidal projections, wherein tops of the plurality of pyramidal projections are evenly spaced, six adjacent pyramidal projections are arranged around one pyramidal projection, each side of the base of one pyramidal projection is in contact with one side of the base of an adjacent pyramidal projection, the distance between the tops of the plurality of pyramidal projections is equal to or shorter than 350 nm, the height of each of the plurality of pyramidal projections is equal to or longer than 800 nm, the fill rate of bases of the plurality of pyramidal projections per unit area is equal to or more than 80%, and the ratio of the height of a pyramidal projection to the width of a base thereof is equal to or more than 5.

One mode of the display device of the present invention includes a pair of substrates at least one of which is a light-transmitting substrate, a display element provided between the pair of substrates, and a plurality of pyramidal projections on an outer side of the light-transmitting substrate, wherein tops of the plurality of pyramidal projections are evenly spaced, and each side of the base of one pyramidal projection is in contact with one side of the base of an adjacent pyramidal projection.

Another mode of the display device of the present invention includes a pair of substrates at least one of which is a light-transmitting substrate, a display element provided between the pair of substrates, and a plurality of pyramidal projections on an outer side of the light-transmitting substrate, wherein tops of the plurality of pyramidal projections are evenly spaced, six adjacent pyramidal projections are arranged around one pyramidal projection, and each side of the base of one pyramidal projection is in contact with one side of the base of an adjacent pyramidal projection.

Another mode of the display device of the present invention includes a pair of substrates at least one of which is a light-transmitting substrate, a display element provided between the pair of substrates, and a plurality of pyramidal projections on an outer side of the light-transmitting substrate, wherein tops of the plurality of pyramidal projections are evenly spaced, each side of the base of one pyramidal projection is in contact with one side of the base of an adjacent pyramidal projection, the distance between the tops of the plurality of pyramidal projections is equal to or shorter than 350 nm, and the height of each of the plurality of pyramidal projections is equal to or longer than 800 nm.

Another mode of the display device of the present invention includes a pair of substrates at least one of which is a light-transmitting substrate, a display element provided between the pair of substrates, and a plurality of pyramidal projections on an outer side of the light-transmitting substrate, wherein tops of the plurality of pyramidal projections are evenly spaced, six adjacent pyramidal projections are arranged around one pyramidal projection, each side of the base of one pyramidal projection is in contact with one side of the base of an adjacent pyramidal projection, the distance between the tops of the plurality of pyramidal projections is equal to or shorter than 350 nm, and the height of each of the plurality of pyramidal projections is equal to or longer than 800 nm.

Another mode of the display device of the present invention includes a pair of substrates at least one of which is a light-transmitting substrate, a display element provided between the pair of substrates, and a plurality of pyramidal projections on an outer side of the light-transmitting substrate, wherein tops of the plurality of pyramidal projections are evenly spaced, each side of the base of one pyramidal projection is in contact with one side of the base of an adjacent pyramidal projection, the distance between the tops of the plurality of pyramidal projections is equal to or shorter than 350 nm, the height of each of the plurality of pyramidal projections is equal to or longer than 800 nm, and the fill rate of bases of the plurality of pyramidal projections per unit area is equal to or more than 80%.

Another mode of the display device of the present invention includes a pair of substrates at least one of which is a light-transmitting substrate, a display element provided between the pair of substrates, and a plurality of pyramidal projections on an outer side of the light-transmitting substrate, wherein tops of the plurality of pyramidal projections are evenly spaced, six adjacent pyramidal projections are arranged around one pyramidal projection, each side of the base of one pyramidal projection is in contact with one side of the base of an adjacent pyramidal projection, the distance between the tops of the plurality of pyramidal projections is equal to or shorter than 350 nm, the height of each of the plurality of pyramidal projections is equal to or longer than 800 nm, and the fill rate of bases of the plurality of pyramidal projections per unit area is equal to or more than 80%.

Another mode of the display device of the present invention includes a pair of substrates at least one of which is a light-transmitting substrate, a display element provided between the pair of substrates, and a plurality of pyramidal projections on an outer side of the light-transmitting substrate, wherein tops of the plurality of pyramidal projections are evenly spaced, each side of the base of one pyramidal projection is in contact with one side of the base of an adjacent pyramidal projection, the distance between the tops of the plurality of pyramidal projections is equal to or shorter than 350 nm, the height of each of the plurality of pyramidal projections is equal to or longer than 800 nm, the fill rate of bases of the plurality of pyramidal projections per unit area is equal to or more than 80%, and the ratio of the height of a pyramidal projection to the width of a base thereof is equal to or more than 5.

Another mode of the display device of the present invention includes a pair of substrates at least one of which is a light-transmitting substrate, a display element provided between the pair of substrates, and a plurality of pyramidal projections on an outer side of the light-transmitting substrate, wherein tops of the plurality of pyramidal projections are evenly spaced, six adjacent pyramidal projections are arranged around one pyramidal projection, each side of the base of one pyramidal projection is in contact with one side of the base of an adjacent pyramidal projection, the distance between the tops of the plurality of pyramidal projections is equal to or shorter than 350 nm, the height of each of the plurality of pyramidal projections is equal to or longer than 800 nm, the fill rate of bases of the plurality of pyramidal projections per unit area is equal to or more than 80%, and the ratio of the height of a pyramidal projection to the width of a base thereof is equal to or more than 5.

The pyramidal projection can be formed of a material having a refractive index which is nonuniform and varies from the side surface toward a display screen. For example, in each of the plurality of pyramidal projections, a portion closer to the side surface is formed of a material having a refractive index equivalent to that of the air to reduce reflection, by the side surface of the pyramidal projection, of light incident on each pyramidal projection from external through the air. On the other hand, a portion of each of the plurality of pyramidal projections, which is closer to the substrate on the display screen side, is formed of a material having a refractive index equivalent to that of the substrate to further reduce reflection by an interface between each pyramidal projection and the substrate, of incident light from external which propagates inside each pyramidal projection and is incident on the substrate.

Since the refractive index of air is smaller than that of a glass substrate, when a glass substrate is used as the substrate, each pyramidal projection may have such a structure in which a portion closer to the top of the pyramidal projection is formed of a material having a lower refractive index and a portion closer to the base of the pyramidal projection is formed of a material having a higher refractive index, so that the refractive index increases from the top to the base of the pyramidal projection. When glass is used for the substrate, each pyramidal projection can be formed of a film containing fluoride, oxide, or nitride.

The antireflective film and the display device of the present invention include a plurality of pyramidal projections densely arranged with no space therebetween on the surfaces of the antireflective film and the display device. Reflected incident light from external is reflected to not the viewer side but another adjacent pyramidal projection because a side surface of each pyramidal projection is not parallel to the display screen. Alternatively, reflected incident light propagates between the pyramidal projections. The pyramidal projections have shapes capable of being densely arranged with no space therebetween, which are optimal shapes each having the largest number of sides among pyramidal projections capable of being densely arranged with no space therebetween and a high anti-reflection function with which light can be scattered efficiently in many directions. Incident light from external is partly transmitted through a pyramidal projection, and the rest of the incident light from external, which is reflected light, is then incident on an adjacent pyramidal projection. In this manner, the incident light from external which is reflected by a side surface of the pyramidal projection repeats incidence on adjacent pyramidal projections.

That is, the number of times that incident light from external is incident on the pyramidal projections of the antireflective film, of the incident light from external which is incident on the antireflective film, is increased; therefore, the amount of light transmitted through the antireflective film is increased. Thus, the amount of light from external reflected to the viewer side is reduced, and the cause of a reduction in visibility such as reflection can be prevented.

The present invention can provide an antireflective film having an anti-reflection function with which reflection of incident light from external can be further reduced by being provided with a plurality of pyramidal projections on their surface, and a high-visibility display device having such an antireflective film. Accordingly, a more high-quality and high-performance display device can be manufactured.

BRIEF DESCRIPTION OF THE DRAWINGS

FIGS. 9A and 9B are a top plan view and a cross-sectional view which show a display device of the present invention.

FIGS. 14A and 14B are cross-sectional views each showing a display module of the present invention.

BEST MODE FOR CARRYING OUT THE INVENTION

Figure 1A:
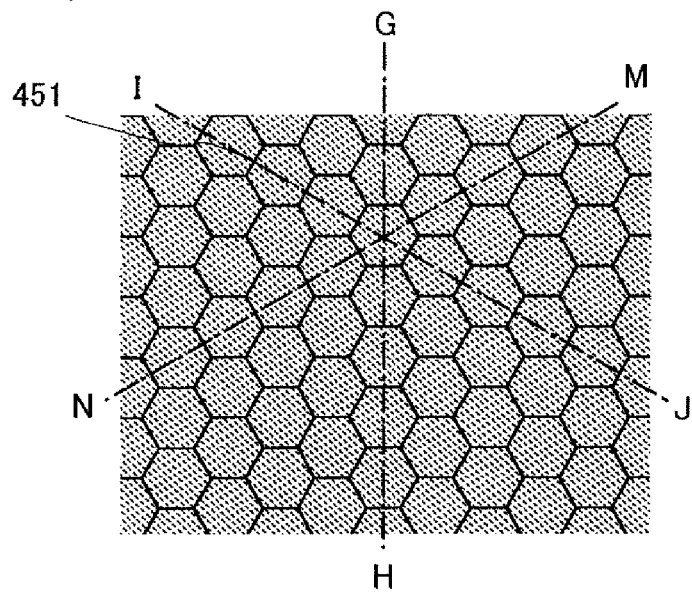
FIGS. 1A to 1D are schematic views of the present invention.

Although the invention will be fully described by way of embodiment modes with reference to the accompanying drawings, it is to be understood by those skilled in the art that various changes and modifications can be made without departing from the spirit and scope of the invention. Therefore, the present invention should not be construed as being limited to the description in the following embodiment modes. Note that common portions and portions having a similar function are denoted by the same reference numerals in all diagrams for describing embodiment modes, and description thereof is omitted.

Embodiment Mode 1

In this embodiment mode, an example of an antireflective film having an anti-reflection function with which reflection of incident light from external can be further reduced, for the purpose of providing excellent visibility, is described.

Figure 1B:
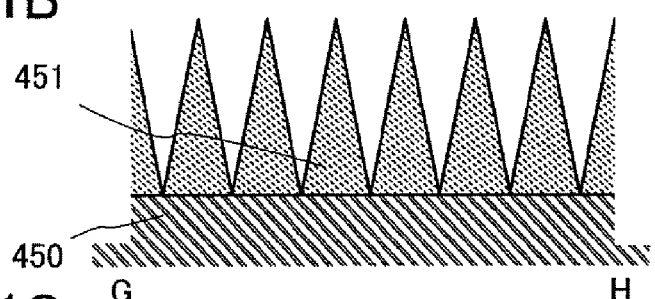
Figure 1C:
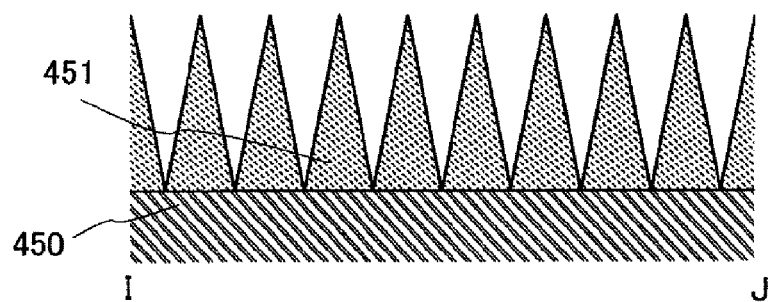
Figure 1D:
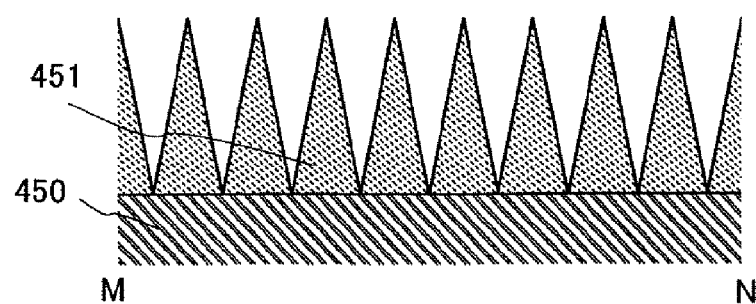

FIGS. 1A to 1D show a top plan view and cross-sectional views of the antireflective film of the present invention. In FIGS. 1A to 1D, a plurality of pyramidal projections 451 are provided over a display screen surface of a display device 450. FIG. 1A is a top plan view of the display device of this embodiment mode. FIG. 1B is a cross-sectional view taken along line G-H in FIG. 1A. FIG. 1C is a cross-sectional view taken along line I-J in FIG. 1A. FIG. 1D is a cross-sectional view taken along line M-N in FIG. 1A. As shown in FIGS. 1A and 1B, the plurality of pyramidal projections 451 are arranged so as to be adjacent to each other and densely arranged over the display screen surface.

In a case where the antireflective film has a plane with respect to incident light from external (a side parallel to the display screen surface), incident light from external are reflected to the viewer side. Therefore, the antireflective film having fewer plane regions has a higher anti-reflection function. In order that incident light from external are further scattered, a plurality of sides each forming an angle with respect to a surface of the antireflective film is preferably formed on the surface of the antireflective film.

In the present invention, since the plurality of pyramidal projections are geometrically arranged with no space therebetween, a refractive index varies from the display screen surface side to the outside (the air) due to the physical shape of a pyramidal projection. In this embodiment mode, the tops of the plurality of pyramidal projections are arranged so as to be evenly spaced and each side of the base of a pyramidal projection is in contact with one side of the base of an adjacent pyramidal projection. That is, one pyramidal projection is surrounded by other pyramidal projections, and the base of the pyramidal projection and the base of the adjacent pyramidal projection have a side in common.

Thus, since the pyramidal projections are arranged densely so that the tops thereof are evenly spaced, the antireflective film has a high anti-reflection function with which light from external can be efficiently scattered in many directions.

Since the plurality of pyramidal projections 451 of this embodiment mode are arranged so that the tops thereof are evenly spaced, the cross sectional surfaces of the plurality of the pyramidal projections 451 have the same shape as shown in FIGS. 1B to 1D. The plurality of pyramidal projections 451 are arranged so as to be in contact with each other and all sides of the base of the pyramidal projection are in contact with adjacent pyramidal projections. Therefore, in this embodiment mode, the plurality of pyramidal projections are arranged with no space therebetween and cover the display screen surface as shown in FIG. 1A. As shown in FIGS. 1B to 1D, a plane portion of the display screen surface is not exposed by the plurality of pyramidal projections and incident light from external is incident on sloped surfaces of the plurality of pyramidal projections, so that reflection of incident light from external on the plane portion can be reduced. When the fill rate of bases of the plurality of pyramidal projections per unit area of the display screen surface is equal to or more than 80%, preferably equal to or more than 90%, the rate of light incident from external on the plane portion is reduced and thus reflection to the viewer side can be prevented.

Further, the plurality of pyramidal projections preferably have as many sides each forming an angle with respect to the bases thereof as possible because incident light from external are scattered in many more directions. In this embodiment mode, a pyramidal projection has six sides which are in contact with and at an angle to a base. In addition, since the base of a pyramidal projection shares a vertex with bases of two other pyramidal projections and the pyramidal projection has a plurality of sides which are provided at an angle, incident light is more easily reflected in many directions. Therefore, the more vertices the base of a pyramidal projection has, the more easily an anti-reflection function thereof can be exerted, and the pyramidal projection of this embodiment mode has six vertices of the base. The pyramidal projections each having a hexagonal pyramidal base of this embodiment mode have shapes capable of being densely arranged with no space therebetween, which are optimal shapes each having the largest number of sides among pyramidal projections capable of being densely arranged with no space therebetween and a high anti-reflection function with which incident light can be scattered efficiently in many directions.

Since the plurality of pyramidal projections 451 of this embodiment mode are arranged so that tops thereof are evenly spaced, cross-sectional surfaces of the plurality of pyramidal projections 451 of this embodiment mode are the same shape as shown in FIGS. 1B to 1D.

Figure 3A:
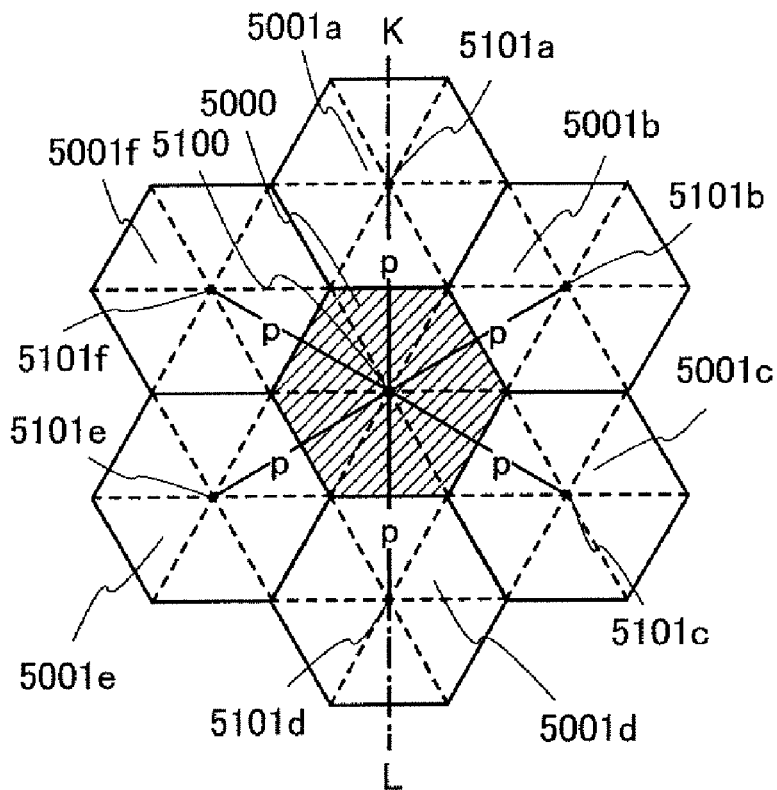
FIGS. 3A and 3B are schematic views of the present invention.
Figure 3B:
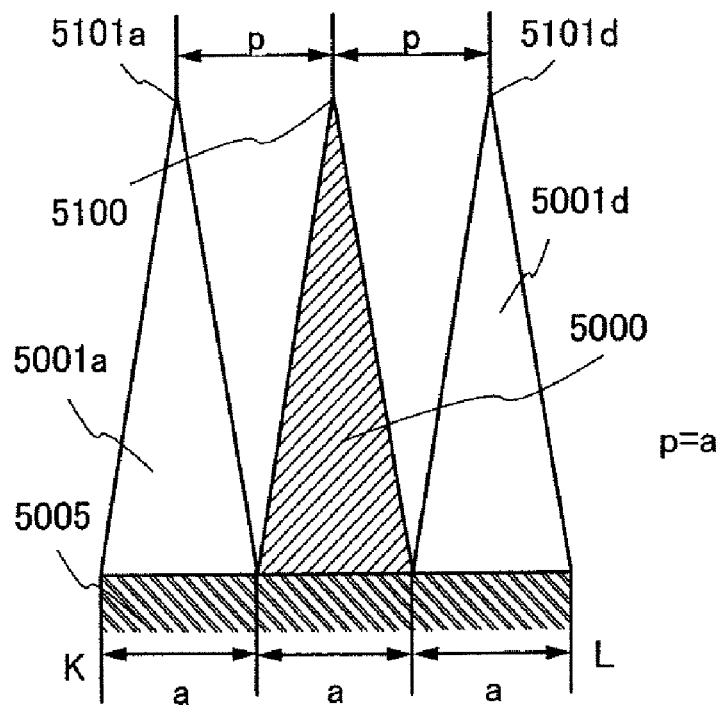

FIG. 3A shows a top plan view of an example of the pyramidal projections of the present invention, which are densely arranged so as to be adjacent to each other, and FIG. 3B shows a cross-sectional view taken along line K-L in FIG. 3A. A side of the base (a side of the base of a pyramidal shape) of the pyramidal projection 5000 is in contact with a side of the base of each of peripheral pyramidal projections 5001a to 5001f. Further, the pyramidal projection 5000 and the pyramidal projections 5001a to 5001f arranged densely so as to surround the pyramidal projection 5000 have regular hexagonal bases and tops 5100 and 5101a to 5101f respectively at the center of each of the regular hexagonal bases. Therefore, the top 5100 of the pyramidal projection 5000 is arranged at a distance p from the tops 5101a to 5101f of the pyramidal projections 5001a to 5001f. In this case, the distance p between the tops of the pyramidal projections is equal to a width a of the pyramidal projection.

Figure 28A:
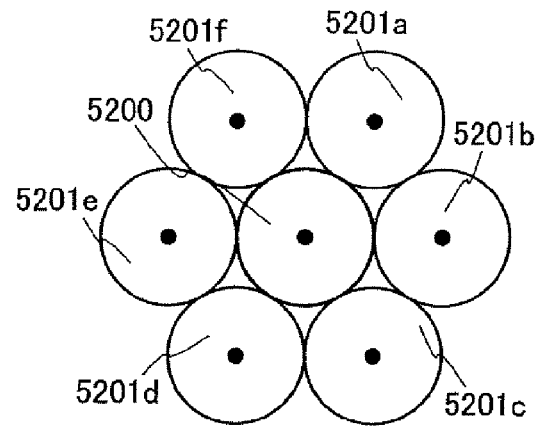
FIGS. 28A to 28C are views each showing an experimental model of a comparative example.
Figure 28B:
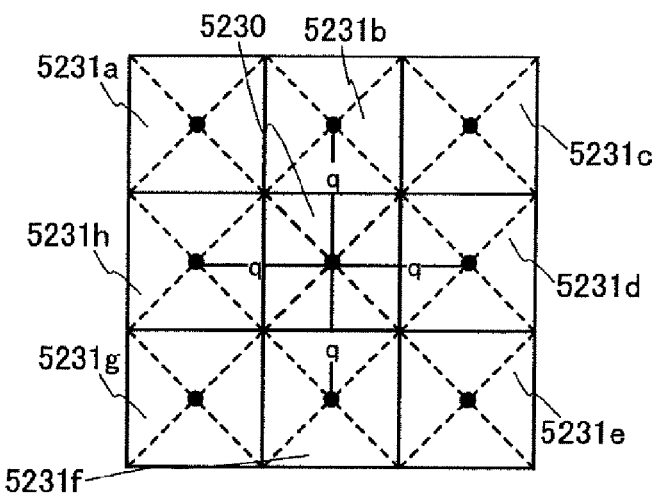
Figure 28C:
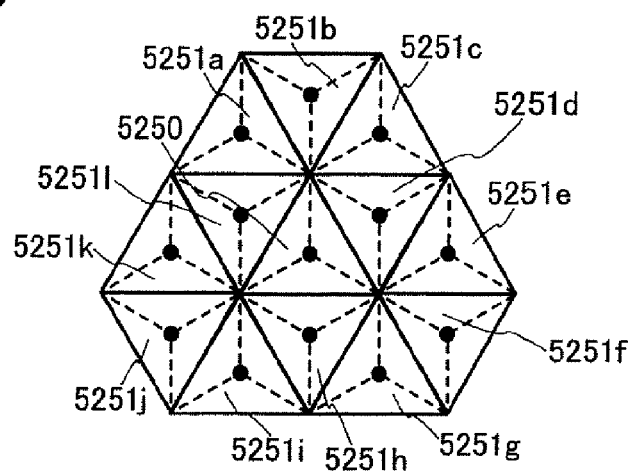

FIGS. 28A to 28C show comparative examples in a case where the present invention is not applied. FIG. 28A shows a structure where conical projections each having a circular base are densely arranged (referred to as Comparative Example 1), FIG. 28B shows a structure where pyramidal projections each having a square base and four sides are densely arranged (referred to as Comparative Example 2), and FIG. 28C shows a structure where pyramidal projections each having a regular triangle base and three sides (referred to as Comparative Example 3). FIGS. 28A to 28C are top plan views seen from above the projections. As shown in FIG. 28A, conical projections 5201a to 5201f are densely arranged around a central conical projection 5200. However, since bases of the conical projection 5200 and the conical projections 5201a to 5201f are circular, spaces are left between the conical projection 5200 and the conical projections 5201a to 5201f and accordingly a plane display screen is exposed even when the conical projections are densely arranged. Incident light from external is reflected by a plane to the viewer side; therefore, with antireflective films of the adjacent conical projections in Comparative Example 1, an anti-reflection function is reduced.

In FIG. 28B, pyramidal projections 5231a to 5231h each having a square base and four sides are densely arranged in contact with a square base of a central pyramidal projection 5230 having a square base and four sides. Similarly, in FIG. 28C, pyramidal projections 5251a to 5251l each having a regular triangle base and three sides are densely arranged in contact with a regular triangle base of a central pyramidal projection 5250 having a regular triangle base and three sides. Although the pyramidal projections each having a regular hexagonal base and six sides of this embodiment mode can be arranged so that the tops of adjacent pyramidal projections are evenly spaced, pyramidal projections shown in Comparative Examples 2 and 3 cannot be arranged so that tops shown by dots in FIGS. 28B and 28C are evenly spaced. Since the pyramidal projections shown in Comparative Examples 2 and 3 have a smaller number of sides than the pyramidal projection of this embodiment mode, incident light cannot be easily scattered in many directions.

Figure 29:
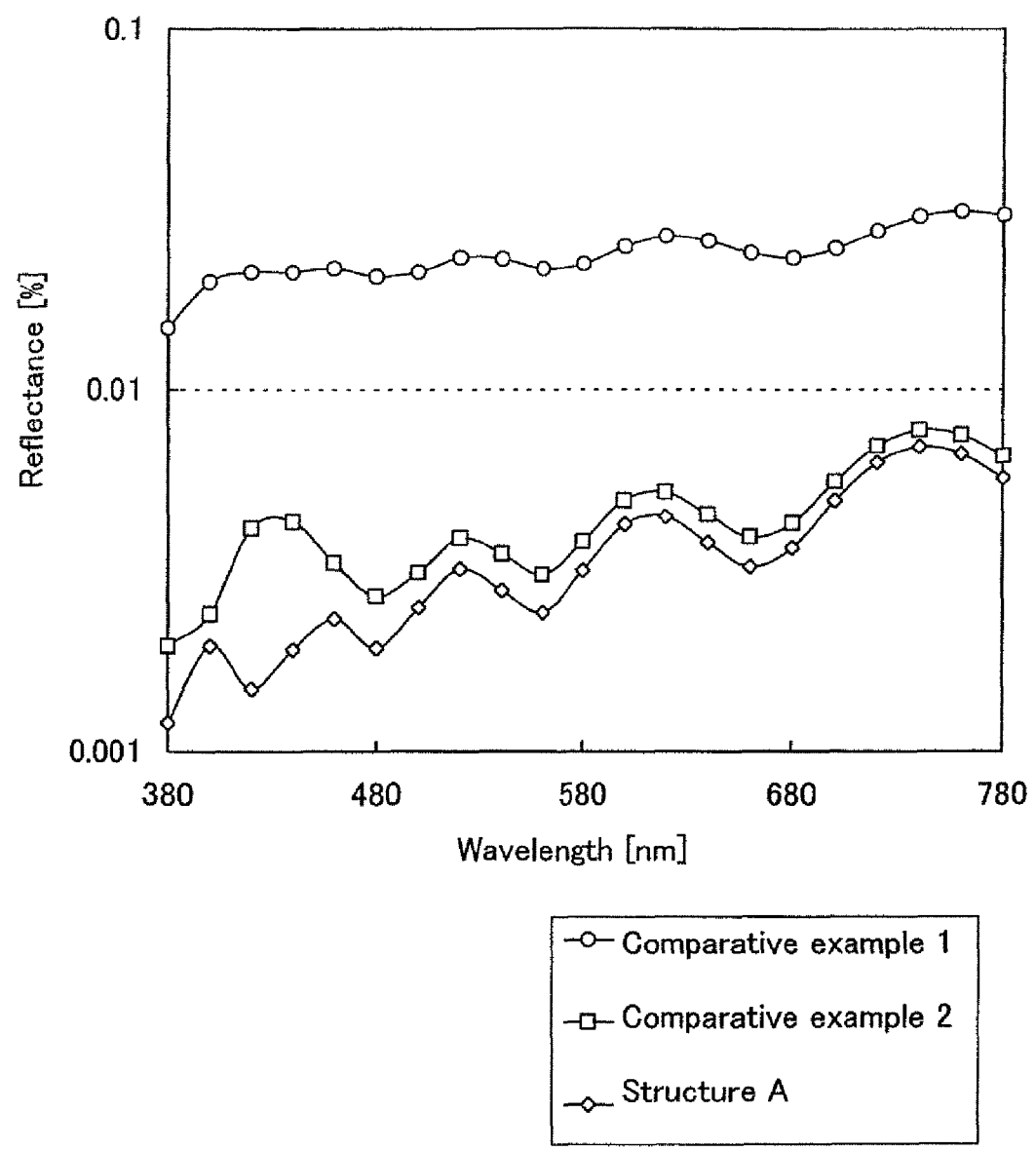
FIG. 29 is a graph showing an experimental data of Embodiment Mode 1.

Optical calculations of Comparative Example 1, Comparative Example 2, and the pyramidal projection having a hexagonal base and six sides (referred to as Structure A) of this embodiment mode were performed. An optical calculation simulator for an optical device, Diffract MOD (manufactured by Rsoft Design Group Inc.) is used in the calculation of this embodiment mode. Each reflectance is calculated by 3D optical calculation. FIG. 29 shows a relation between the wavelength of light and the reflectance in each of Comparative Example 1, Comparative Example 2, and Structure A. Calculation conditions are as follows. Harmonics for both of an X direction and a Y direction, which are parameters of the above-described calculation simulator, are set to 3. In the cases of a conical projection and a hexagonal pyramidal projection, assuming that the distance between the tops of conical/pyramidal projections is p and the height of the conical/pyramidal projection is b, Index Res. for the X direction, the Y direction, and a Z direction, which are parameters of the above-described calculation simulator, are set to $\sqrt{3} \times p/128$, $p/128$, and $b/80$, respectively. In the case of a square pyramidal projection, assuming that the distance between the tops of pyramidal projections is q, Index Res. for the X direction, the Y direction, and the Z direction, which are parameters of the above-described calculation simulator, are set to $q/64$, $q/64$, and $b/80$, respectively.

In FIG. 29, Comparative Example 1 is represented by circular dots, Comparative Example 2 is represented by quadrangular dots, and Structure A is represented by rhombic dots, and FIG. 29 shows the relation between the wavelength and the reflectance in each example. Results of the optical calculation also shows that the model in which the pyramidal projections of Structure A, to which the present invention is applied, are densely arranged has lower reflectance than the model in which Comparative Example 1 are densely arranged and the model in which Comparative Example 2 are densely arranged in a wavelength range of 380 nm to 780 nm and can reduce the reflection most largely. The refractive indices, the heights, and the widths of Comparative Example 1, Comparative Example 2, and Structure A are 1.492, 1500 nm, and 300 nm, respectively.

When the fill rate of bases of a plurality of pyramidal projections per unit area in a surface of a display screen (that is, the substrate surface to serve as a display screen) is 80% or more, and preferably 90% or more, the percentage of incident light from external which enters a plane portion is reduced. Accordingly, incident light from external can be prevented from being reflected to the viewer side, which is preferable. The fill rate is a percentage of a formation region of the pyramidal projection over the substrate to serve as the display screen. When the fill rate is 80% or more, the percentage of the plane portion (which is parallel to the display screen) where the pyramidal projection having a hexagonal base is not formed on the substrate surface to serve as a display screen is 20% or less.

Figure 30:
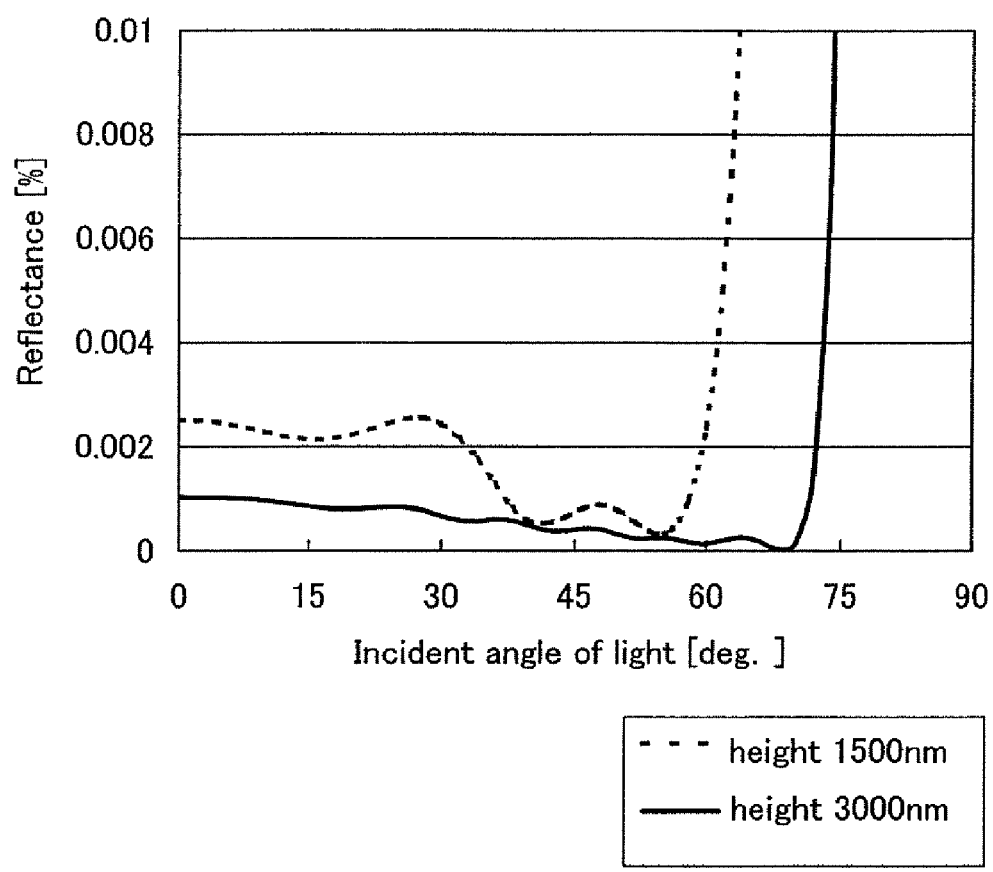
FIG. 30 is a graph showing an experimental data of Embodiment Mode 1.

Further, FIG. 30 shows optical calculation results of a relation between the incident angle of light and the reflectance of the models in which the pyramidal projections each having a hexagonal base and six sides in this embodiment mode are densely arranged. A dotted line shows the relation between the incident angle and the reflectance of a model having a width of 300 nm and a height of 1500 nm, and a solid line shows that of a model having a width of 300 nm and a height of 3000 nm. When the incident angle is 60 degrees or smaller, the reflectances of the models are suppressed to be as low as 0.003% or less. Even when the incident angle is approximately 75 degrees, the reflectances of the models are approximately 0.01%. Thus, it can be shown that the models of the present invention, in which the pyramidal projections are densely arranged, can have reduced reflectances in a wide range of incident angle.

Figure 31A:
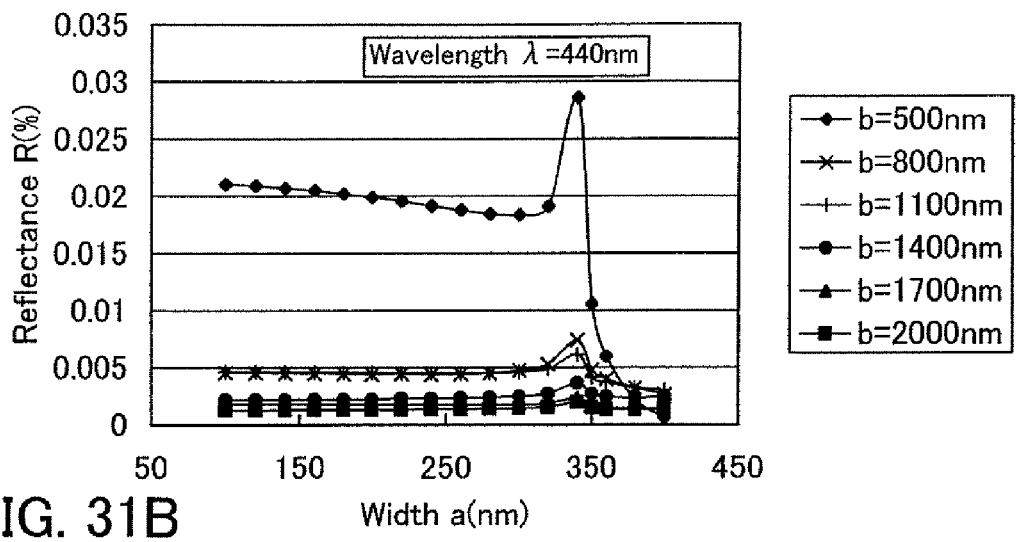
FIGS. 31A to 31C are graphs each showing an experimental data of Embodiment Mode 1.
Figure 31B:
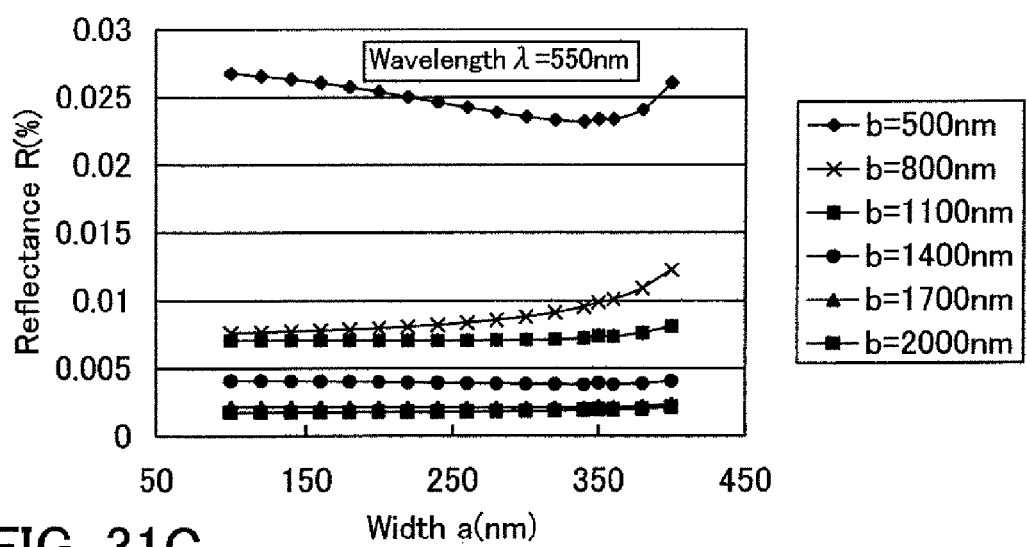
Figure 31C:
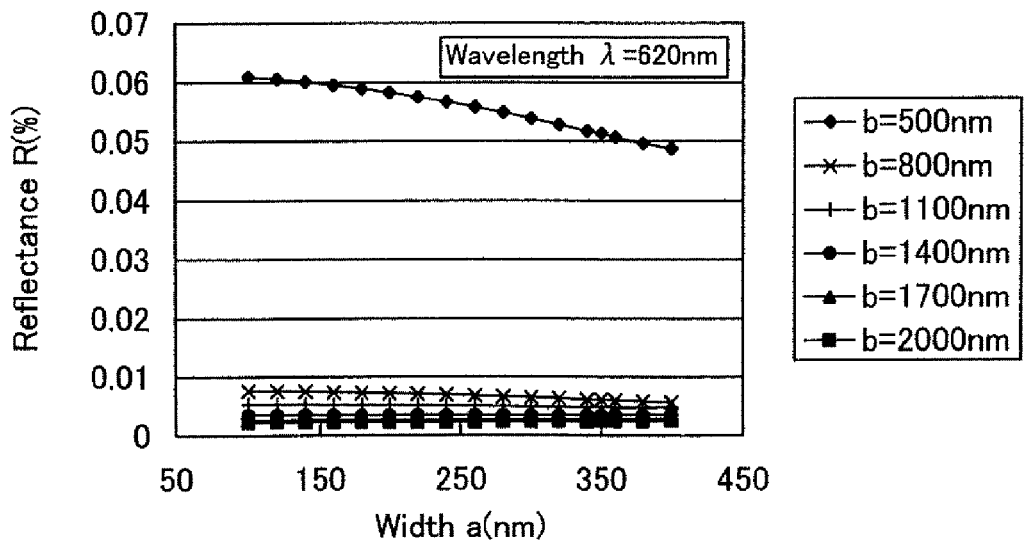
Figure 33A:
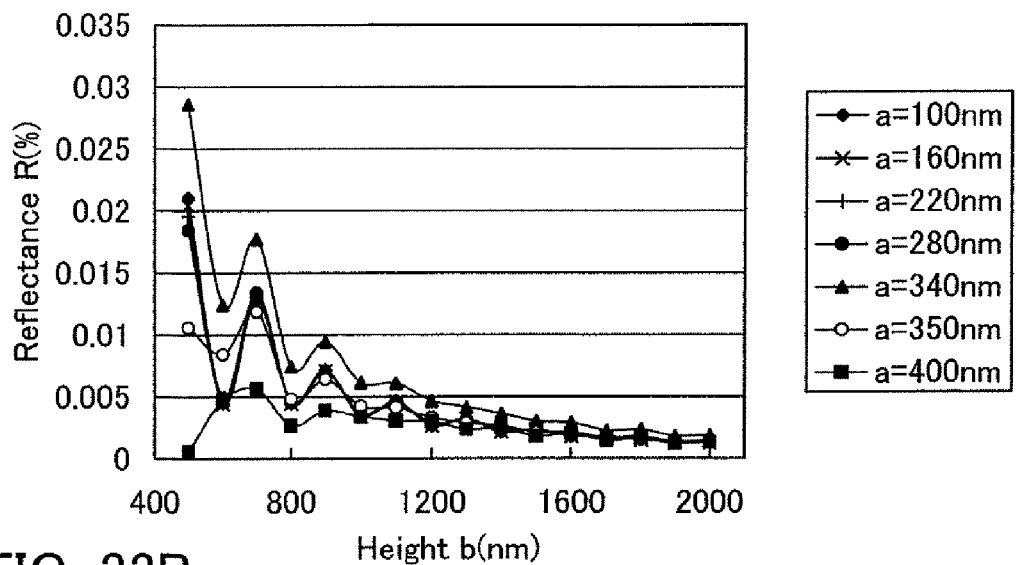
FIGS. 33A to 33C are graphs each showing an experimental data of Embodiment Mode 1.
Figure 33B:
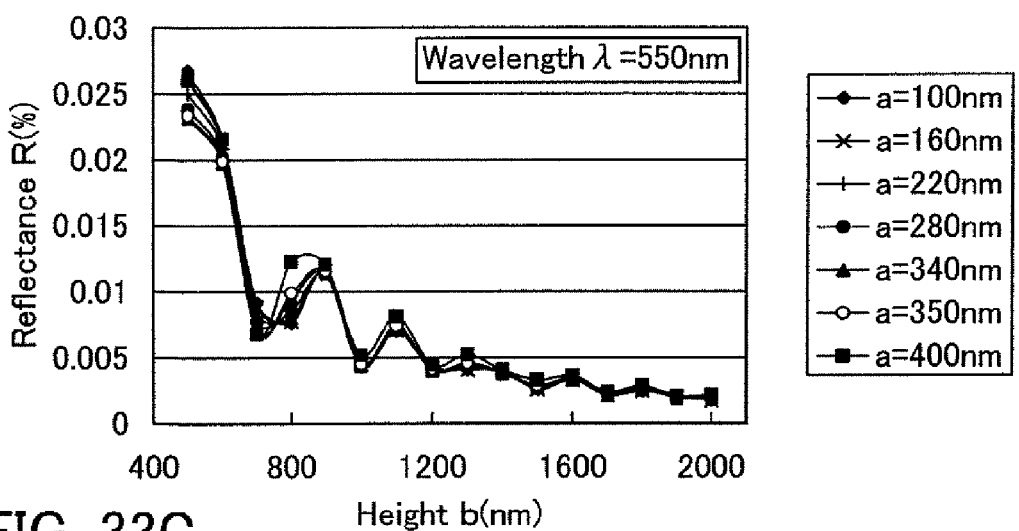
Figure 33C:
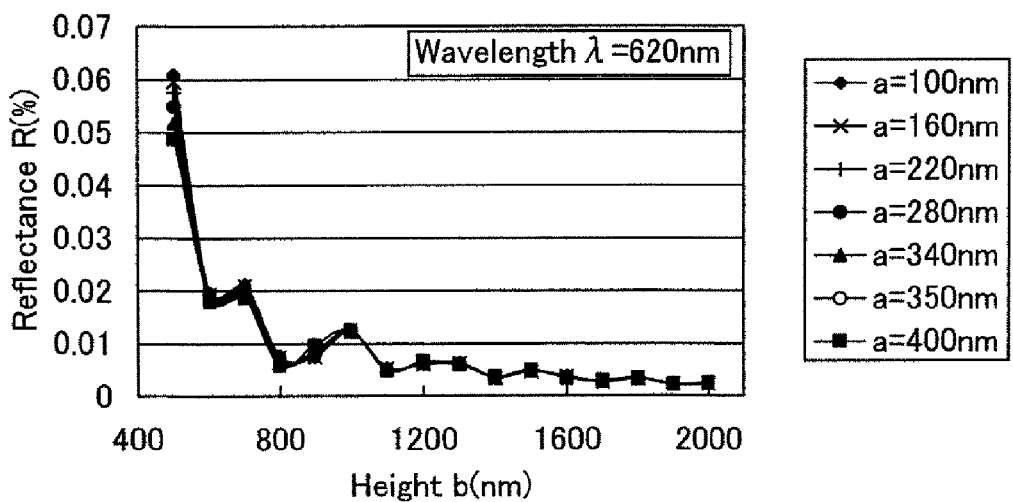

Similarly, the change in the reflectances of the models in which the pyramidal projections each having a hexagonal base and six sides in this embodiment mode are densely arranged, in the case of each wavelength, is calculated while the width a and the height b of the pyramidal projection are changed. FIGS. 31A to 31C show the change in the reflectance R with respect to the width a when the height b is changed to 500 nm (rhombic dots), 800 nm (x dots), 1100 nm (cross dots), 1400 nm (circular dots), 1700 nm (triangular dots), and 2000 nm (quadrangular dots). FIGS. 33A to 33C show the change in the reflectance R with respect to the height b when the width a is changed to 100 nm (rhombic dots), 160 nm (x dots), 220 nm (cross dots), 280 nm (black circular dots), 340 nm (triangular dots), 350 non (white circular dots), and 400 nm (quadrangular dots). The calculations are performed in each of the cases where in a visible light range, light having a wavelength of 440 nm exhibits blue color (FIGS. 31A and 33A), light having a wavelength of 550 nm exhibits green color (FIGS. 31B and 33B), and light having a wavelength of 620 nm exhibits red color (FIGS. 31C and 33C), and results of the calculations are shown.

As shown in FIGS. 31A to 31C, when the height b is 800 nm or more and the width a is 350 nm or less (more preferably, a width a of 300 nm or less as shown in FIG. 31A), the reflectance is 0.01% or less at each wavelength. As shown in FIGS. 33A to 33C, when the height A is 800 nm or more, the reflectance is suppressed to be as low as 0.015% or less. In addition, when the height b is 1600 nm or more, the reflectance is further suppressed to be as low as 0.005% or less at any width a in the measurement range.

Figure 32A:
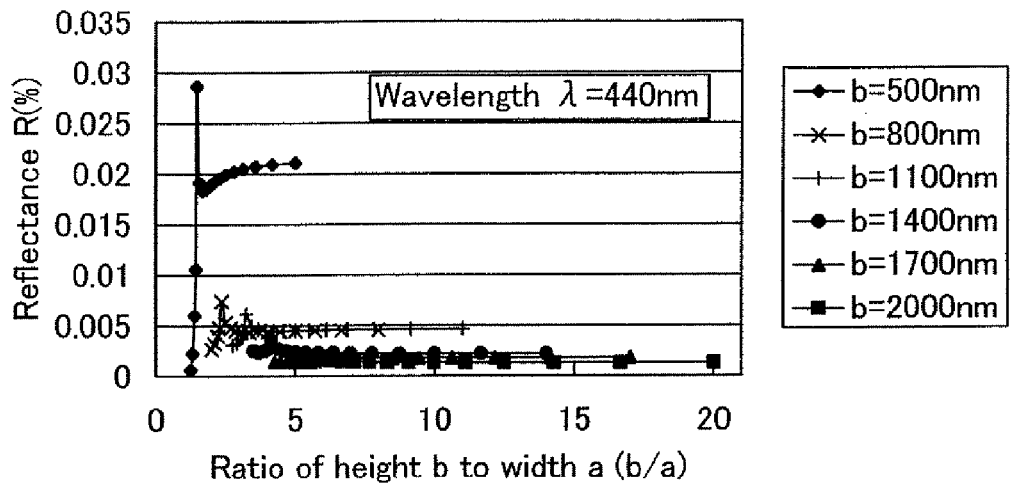
FIGS. 32A to 32C are graphs each showing an experimental data of Embodiment Mode 1.
Figure 32B:
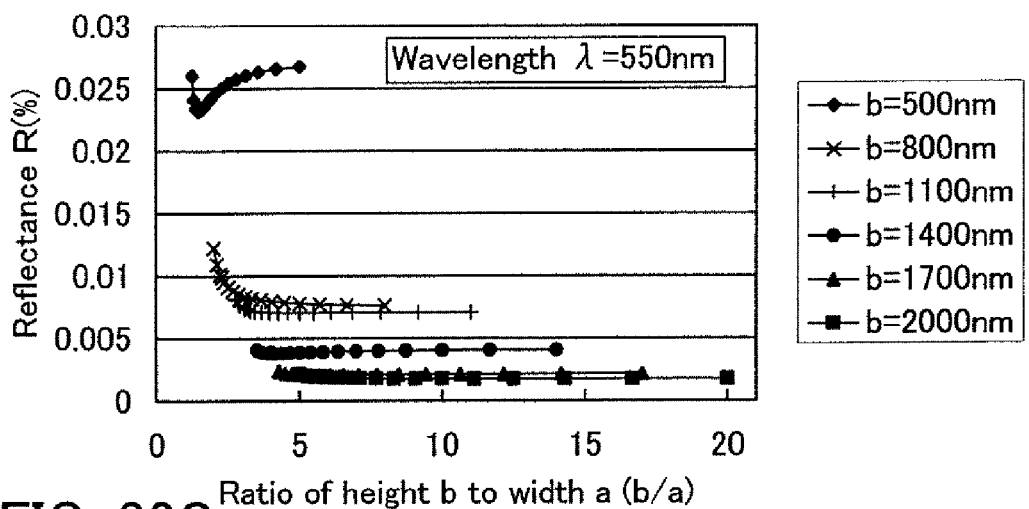
Figure 32C:
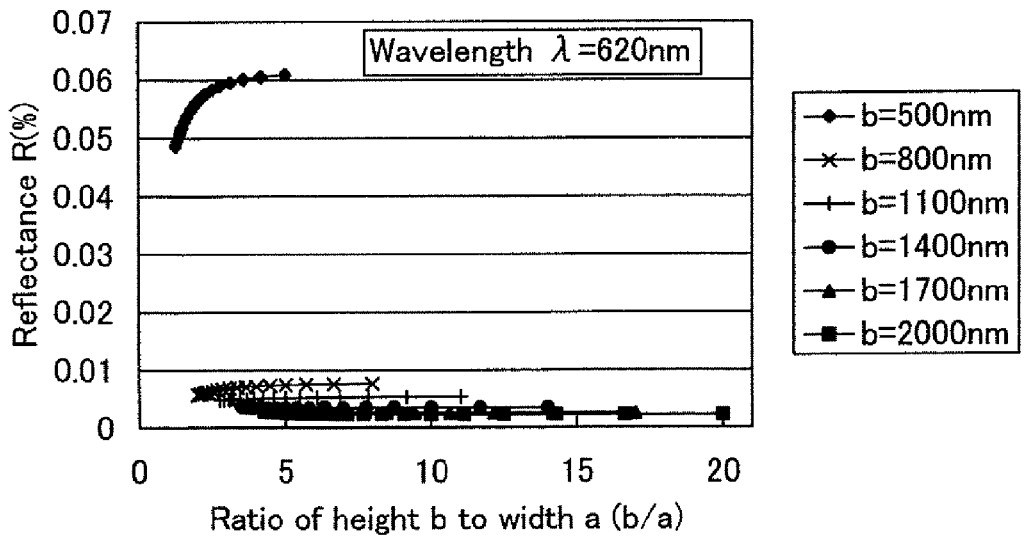
Figure 34A:
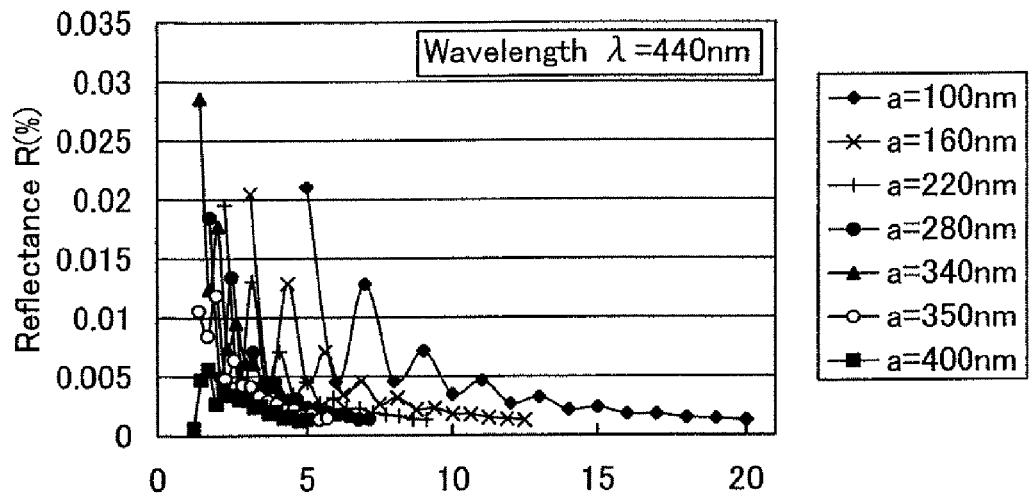
FIGS. 34A to 34C are graphs each showing an experimental data of Embodiment Mode 1.
Figure 34B:
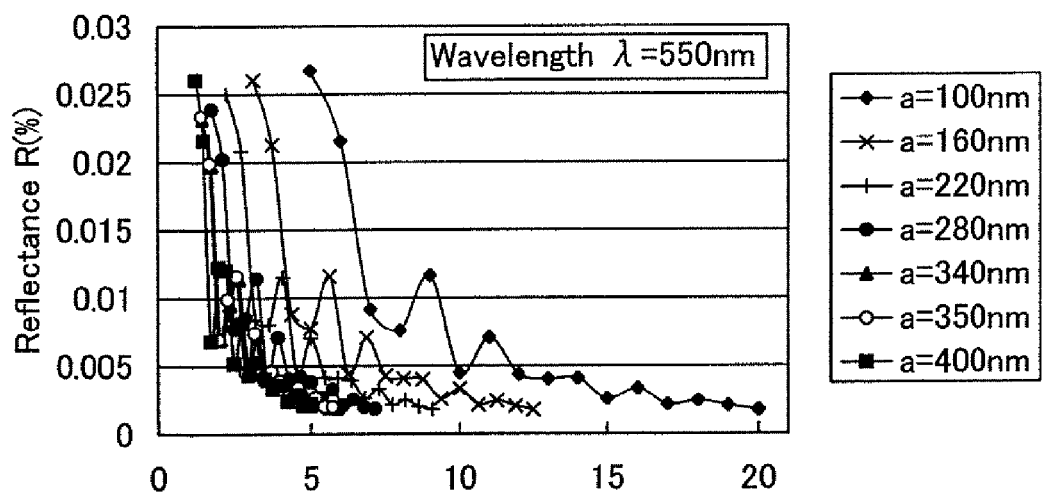
Figure 34C:
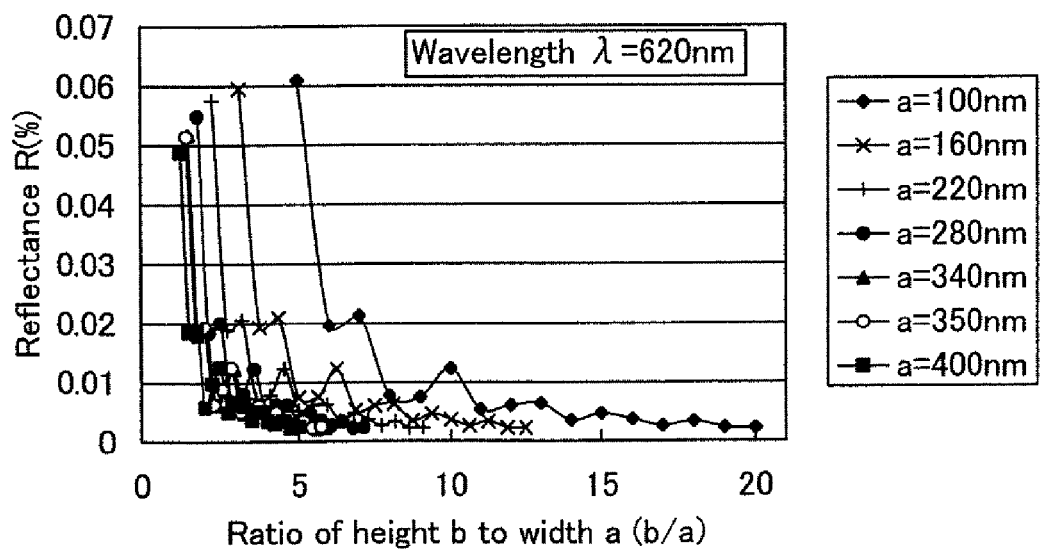

FIGS. 32A to 32C show the change in the reflectance R with respect to the ratio of the height b to the width a (b/a) when the height b is changed to 500 nm (rhombic dots), 800 nm (x dots), 1100 nm (cross dots), 1400 nm (circular dots), 1700 nm (triangular dots), and 2000 nm (quadrangular dots). FIGS. 34A to 34C show the change in the reflectance R with respect to the ratio of the height b to the width a (A/a) when the width a is changed to 100 nm (rhombic dots), 160 nm (x dots), 220 nm (cross dots), 280 nm n (black circular dots), 340 nm (triangular dots), 350 nm (white circular dots), and 400 nun (quadrangular dots). The calculations are performed in each of the cases where in a visible light range, light having a wavelengths of 440 nm exhibits blue color (FIGS. 32A and 34A), light having a wavelengths of 550 nm exhibits green color (FIGS. 32B and 34B), and light having a wavelengths of 620 nm exhibits red color (FIGS. 32C and 34C), and results of the calculations are shown.

Figure 35:
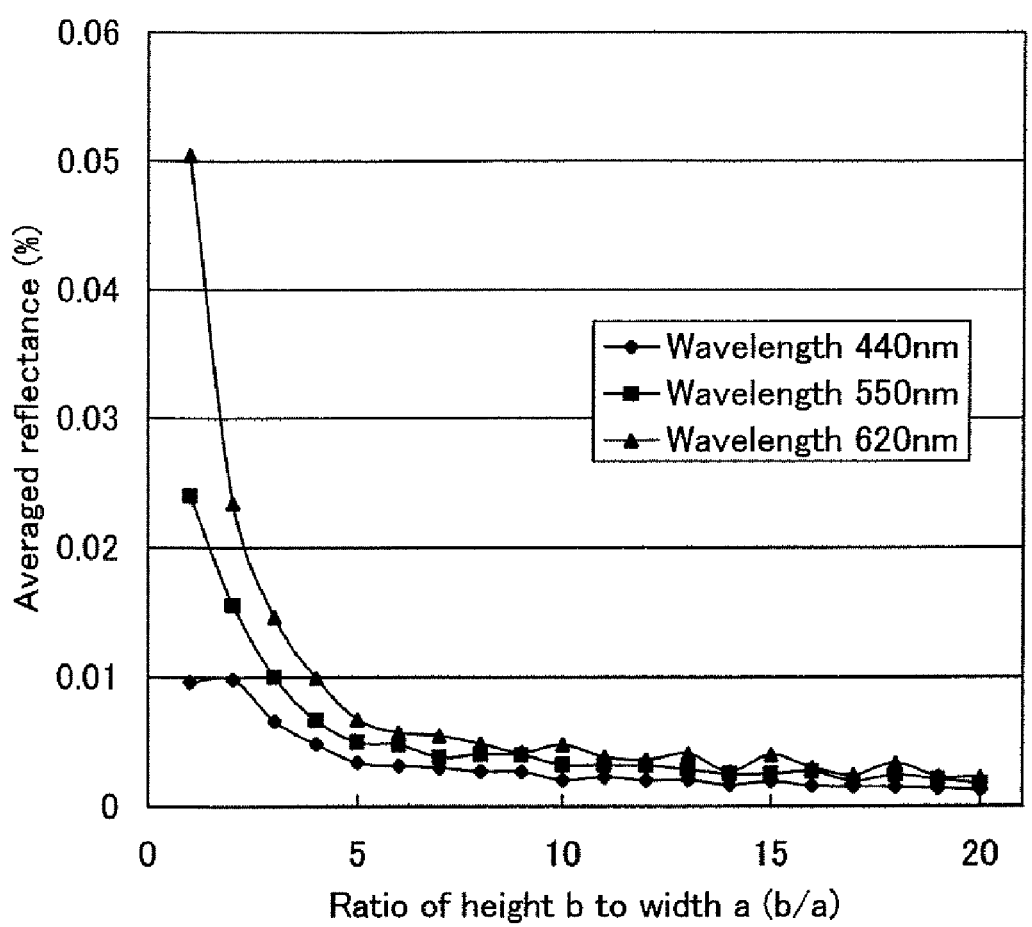
FIG. 35 is a graph showing an experimental data of Embodiment Mode 1.
Figure 36A:
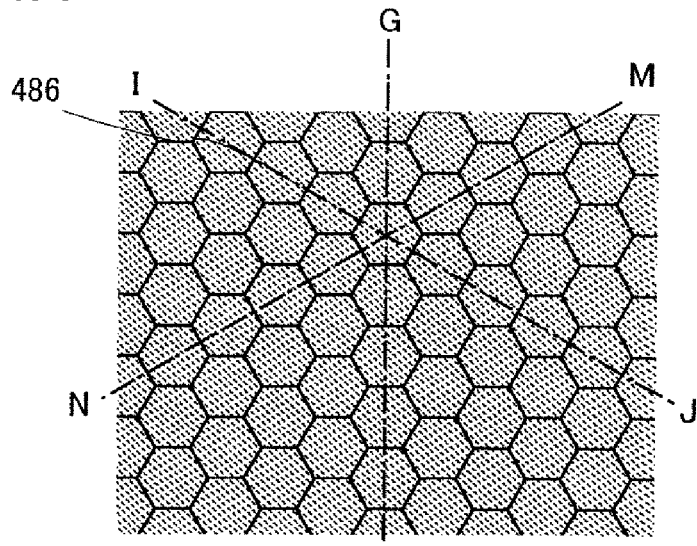
FIGS. 36A to 36D are schematic views of the present invention.
Figure 36B:
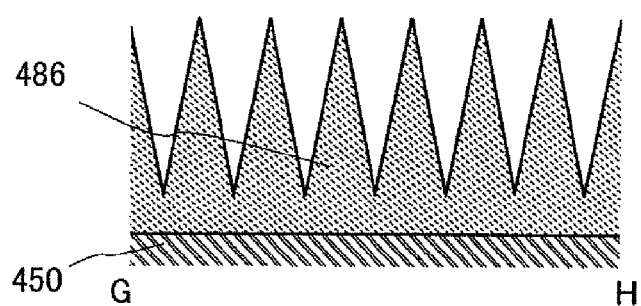
Figure 36C:
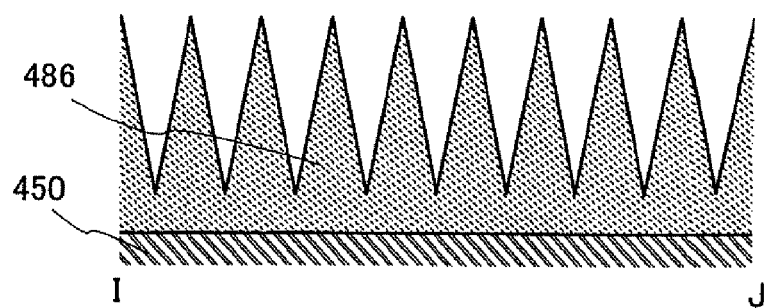
Figure 36D:
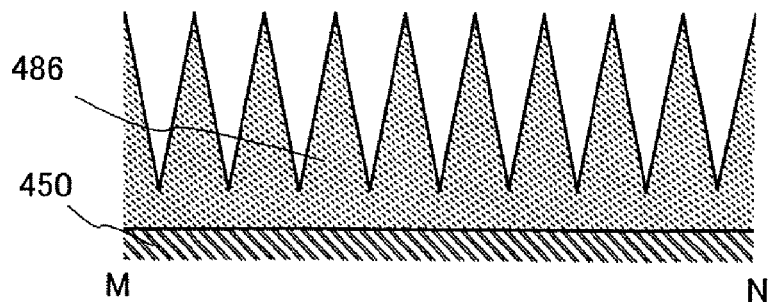

FIG. 35 shows averaged data of the reflectance R, which includes data shown in FIGS. 34A to 34C, with respect to the ratio of the height b to the width a (b/a) when the width a is changed from 100 nm to 400 nm. FIG. 35 shows a relation between the ratio of the height b to the width a (b/a) and the averaged reflectance in each of the cases where the wavelength is 440 nm (rhombic dots), 550 nm (quadrangular dots), or 620 mm (triangular dots). As shown in FIGS. 34A to 34C, with a height b of 800 nm or more, when the ratio of the height b to the width a (b/a) is increased, the reflectance is decreased. As shown in FIG. 35, when the ratio of the height (to the width a (b/a) is equal to or more than 5, the averaged reflectance is 0.01% or less at each measurement wavelength, and thus it can be shown that the pyramidal projection in this embodiment mode has an effect of suppressing reflection of light.

Since the distance between the tops of the plurality of pyramidal projections is the same as the width of the plurality of pyramidal projections, in consideration of the above, it is preferable that the distance between the tops of the plurality of pyramidal projections be 350 nm or less (more preferably, 100 nm or more and 300 nm or less) and the height of the plurality of pyramidal projections be 800 nm or more (more preferably 1000 nm or more, and still more preferably 1600 nm or more and 2000 nm or less). In addition, in the pyramidal projection, the ratio of the height to the width of a base is preferably equal to or more than 5.

Figure 2A:
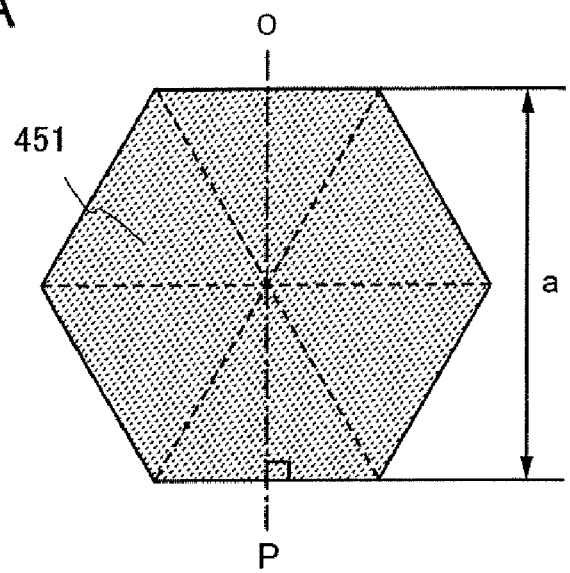
FIGS. 2A and 2B are schematic views of the present invention.
Figure 2B:
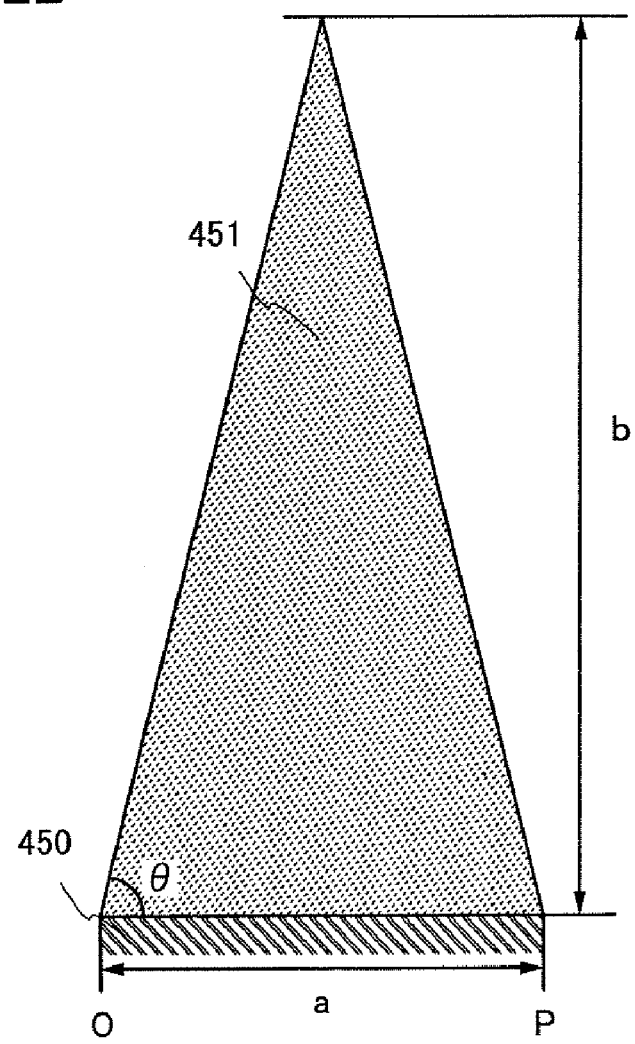

FIGS. 2A and 2B are enlarged views of the pyramidal projection having an anti-reflection function shown in FIGS. 1A to 1D. FIG. 2A is a top plan view of the pyramidal projection and FIG. 2B is a cross-sectional view taken along line O-P of FIG. 2A. The line O-P passes through the center of the base of the pyramidal projection and is perpendicular to a side of the base. As shown in FIG. 2B, a side and the base of the pyramidal projection form an angle θ. In this specification, the length of the line which passes through the center of the base of the pyramidal projection and is perpendicular to the side of the base is referred to as a width a of the base of the pyramidal projection. In addition, the distance from the base of the hexagonal pyramidal projection to the top thereof is referred to as a height b of the pyramidal projection.

Figure 27A:
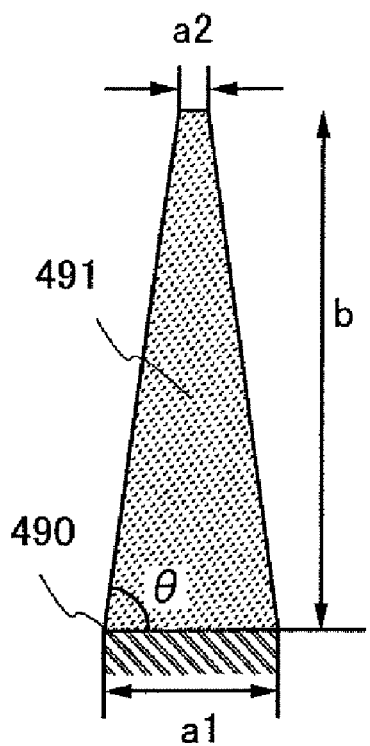
FIGS. 27A to 27C are cross-sectional views each showing a pyramidal projection applicable to the present invention.
Figure 27B:
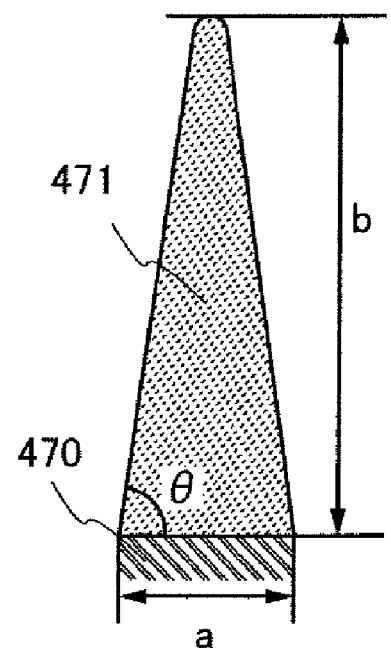
Figure 27C:
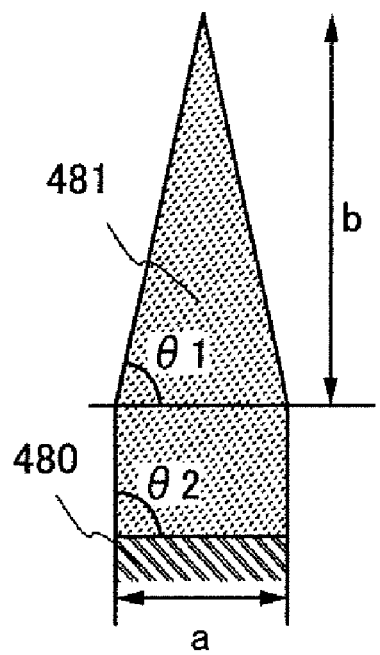

The shapes of a pyramidal projection may include a shape in which the top surface of a pyramidal projection is plane and the cross section thereof is trapezoidal (truncated pyramid), a dome shape in which a top of a pyramidal projection is rounded, or a shape in which a prism and a pyramidal projection are staked. FIGS. 27A to 27C show examples of shapes of pyramidal projections. FIG. 27A shows the shape of a pyramidal projection whose top is not sharp unlike the shape of the pyramidal projection and which has a top surface (a width $a_2$) and a base (a width $a_1$). Accordingly, a cross-sectional view showing a face which is perpendicular to the base is trapezoidal. In a pyramidal projection 491 provided on a display device 490 as in FIG. 27A, the distance between a lower base and an upper base is referred to as a height b in the present invention.

FIG. 27B shows an example in which a pyramidal projection 471 whose top is rounded is provided on a display device 470. In this manner, the pyramidal projection may have a shape with a rounded top and a curvature. In this case, a height b of the pyramidal projection corresponds to the distance between the base and the highest point of a top portion.

FIG. 27C shows an example in which a pyramidal projection 481 having a plurality of angles $\theta_1$ and $\theta_2$ is provided on a display device 480. In this manner, the pyramidal projection may have the shape of a stack of a hexagonal cylinder shape and a pyramidal projection shape. In this case, angles made by two sides and a base are different as shown by angles $\theta_1$ and $\theta_2$. In the case of the projection 481 in FIG. 27C, the height b corresponds to the height of the pyramidal shape with a sloped side of the pyramidal projection.

FIGS. 1A to 1D show the structure in which the plurality of pyramidal projections are densely arranged so that bases thereof are in contact with each other. Alternatively, a structure may be employed in which a plurality of pyramidal projections are provided on a surface which is an upper part of a film (substrate). FIGS. 36A to 36D show an example in which, unlike in FIGS. 1A to 1D, sides of pyramidal projections do not reach a display screen and the hexagonal pyramidal projections are provided with the shape of a film 486 having a plurality of pyramidal projections on the surface thereof. The antireflective film of the present invention is acceptable as long as it has a structure having pyramidal projections which are densely arranged so as to be adjacent to each other. A structure may also be employed in which pyramidal projections are formed directly into a surface part of a film (substrate), as an integrated continuous structure. For example, a surface of a film (substrate) may be processed so that pyramidal projections are formed thereinto, or a shape with pyramidal projections may be selectively formed by a printing method such as nanoimprinting. Alternatively, pyramidal projections may be formed on a film (substrate) in another step.

The plurality of pyramidal projections may be formed as an integrated continuous film, or may be provided on a substrate. Alternatively, pyramidal projections may be formed into a substrate in advance. A glass substrate, a quartz substrate, or the like can be used as a substrate on which the pyramidal projections are provided. Alternatively, a flexible substrate may be used. The flexible substrate refers to a substrate which can be bent. For example, in addition to a plastic substrate made of polycarbonate, polyarylate, polyethersulfone, or the like, elastomer which is a high molecular weight material, or the like, with a property of being plasticized at high temperature to be shaped similarly to plastic and a property of being an elastic body like a rubber at a room temperature can be given. Alternatively, a film (made of polypropylene, polyester, vinyl, polyvinyl fluoride, vinyl chloride, or the like), an inorganic film formed by evaporation, or the like can be used. A substrate may be processed so that the plurality of pyramidal projections is formed thereinto, or the plurality of pyramidal projections may be formed on a substrate by film formation or the like. Alternatively, the plurality of pyramidal projections may be formed in another step and then attached to a substrate by a bonding adhesive or the like. In the case where the antireflective film is provided on a screen of another display device, the antireflective film can be attached by an adhesive, a bonding adhesive, or the like. As described above, the antireflective film of the present invention can be formed by application of various shapes having a plurality of pyramidal projections.

The pyramidal projection can be formed of a material having a refractive index which is nonuniform and varies from the side surface toward a display screen. For example, in each of the plurality of pyramidal projections, a portion closer to the side surface is formed of a material having a refractive index equivalent to that of the air to reduce reflection, by the side surface of the pyramidal projection, of light incident on each pyramidal projection from external through the air. On the other hand, a portion of each of the plurality of pyramidal projections, which is closer to the substrate on the display screen side, is formed of a material having a refractive index equivalent to that of the substrate to further reduce reflection by an interface between each pyramidal projection and the substrate, of incident light from external which propagates inside each pyramidal projection and is incident on the substrate Since the refractive index of air is smaller than that of a glass substrate, when a glass substrate is used as the substrate, each pyramidal projection may have such a structure in which a portion closer to the top of the pyramidal projection is formed of a material having a lower refractive index and a portion closer to the base of the pyramidal projection is formed of a material having a higher refractive index, so that the refractive index increases from the top to the base of the pyramidal projection.

A material used for forming the pyramidal projection may be appropriately selected in accordance with a material of the substrate forming a display screen surface, such as silicon, nitrogen, fluorine, oxide, nitride, or fluoride. As the oxide, the following can be used: silicon oxide ($SiO_2$), boric oxide ($B_2O_3$), sodium oxide ($NaO_2$), magnesium oxide (MgO), aluminum oxide (alumina) ($Al_2O_3$), potassium oxide ($K_2O$), calcium oxide (CaO), diarsenic trioxide (arsenious oxide) ($AS_2O_3$), strontium oxide (SrO), antimony oxide ($Sb_2O_3$), barium oxide (BaO), indium tin oxide (ITO), zinc oxide (ZnO), indium zinc oxide (IZO) in which indium oxide is mixed with zinc oxide (ZnO), a conductive material in which indium oxide is mixed with silicon oxide ($SiO_2$), organoindium, organotin, indium oxide containing tungsten oxide, indium zinc oxide containing tungsten oxide, indium oxide containing titanium oxide, indium tin oxide containing titanium oxide, or the like. As the nitride, aluminum nitride (AlN), silicon nitride (SiN), or the like can be used. As the fluoride, lithium fluoride (LiF), sodium fluoride (NaF), magnesium fluoride ($MgF_2$), calcium fluoride ($CaF_2$), lanthanum fluoride ($LaF_3$), or the like can be used. The antireflective film may include one or more kinds of the above-described silicon, nitrogen, fluorine, oxide, nitride, and fluoride. The mixing ratio thereof may be appropriately set in accordance with the ratio of components (a composition ratio) of the substrate.

The pyramidal projection can be formed in such a manner that a thin film is formed by a sputtering method, a vacuum evaporation method, a PVD (physical vapor deposition) method, or a CVD (chemical vapor deposition) method such as a low-pressure CVD (LPCVD) method or a plasma CVD method, and then etched to have a desired shape. Alternatively, a droplet discharging method by which a pattern can be selectively formed, a printing method by which a pattern can be transferred or drawn (a method for forming a pattern such as screen printing or offset printing), a coating method such as a spin coating method, a dipping method, a dispensing method, a brush coating method, a spraying method, a flow coating method, or the like may be employed. Still alternatively, an imprinting technique or a nanoimprinting technique with which a nanoscale three-dimensional structure can be formed by a transfer technology may be employed. Imprinting and nanoimprinting are techniques with which a minute three-dimensional structure can be formed without using a photolithography process.

Figure 25:
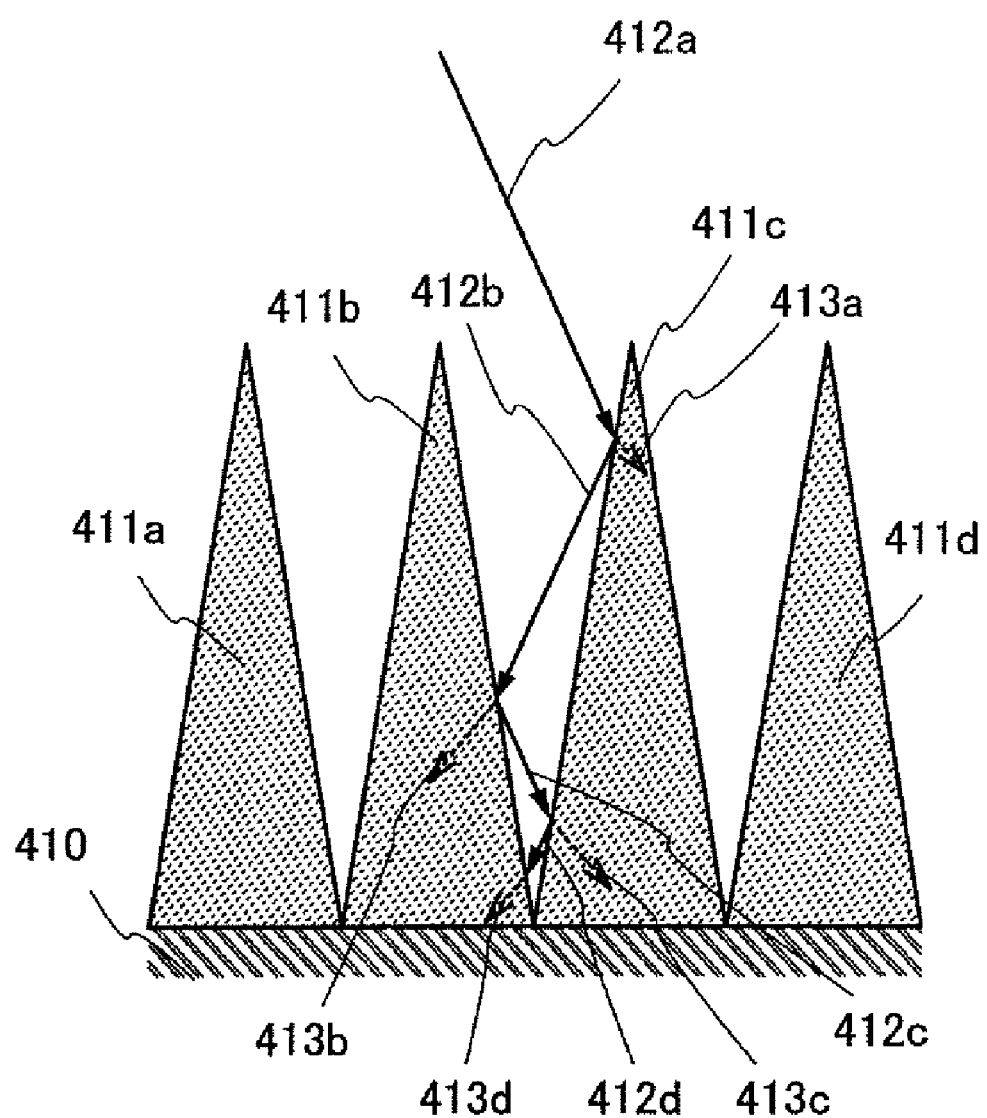
FIG. 25 is a schematic view of the present invention.

The anti-reflection function of the antireflective film having the plurality of pyramidal projections of the present invention is explained with reference to FIG. 25. In FIG. 25, adjacent pyramidal projections 411a, 411b, 411c, and 411d are densely provided on a display screen of a display device 410. An incident light ray 412a from external is incident on the pyramidal projection 411c, part of the incident light ray is transmitted through the pyramidal projection 411c as a transmitted light ray 413a, and the rest of the incident light ray 412a is reflected by a side surface of the pyramidal projection 411c as a reflected light ray 412b. The reflected light ray 412b is then incident on the pyramidal projection 411b which is adjacent to the pyramidal projection 411c, part of the reflected light ray 412b is transmitted through the pyramidal projection 411b as a transmitted light ray 413b, and the rest of the reflected light ray 412b is reflected by the side surface of the pyramidal projection 411b as a reflected light ray 412c. The reflected light ray 412c is then incident on the pyramidal projection 411c which is adjacent to the pyramidal projection 411b, part of the incident light ray 412c enters the pyramidal projection 411c as a transmitted light ray 413c, and the rest of the incident light ray 412c is reflected by the side surface of the pyramidal projection 411c as a reflected light ray 412d. The reflected light ray 412d is then incident on the pyramidal projection 411b which is adjacent to the pyramidal projection 411c, and part of the reflected light ray 412d is transmitted through the pyramidal projection 411b as a transmitted light ray 413d.

As described above, the antireflective film of this embodiment mode has a plurality of pyramidal projections on the surface thereof. Reflected incident light from external is reflected to not the viewer side but another adjacent pyramidal projection because a side surface of each pyramidal projection is not horizontal. Alternatively, reflected incident light propagates between the pyramidal projections. Incident light from external is partly transmitted through a pyramidal projection, and the rest of the incident light from external, which is reflected light, is then incident on an adjacent pyramidal projection. In this manner, the incident light from external which is reflected by a side surface of the pyramidal projection repeats incidence on adjacent pyramidal projections.

That is, the number of times that light from external is incident on the pyramidal projections of the antireflective film, of the incident light from external which is incident on the antireflective film, is increased; therefore, the amount of light transmitted through the antireflective film is increased. Thus, the amount of incident light from external which is reflected to the viewer side is reduced, and the cause of a reduction in visibility such as reflection can be prevented.

The present invention can provide an antireflective film having an anti-reflection function with which reflection of incident light from external can be further reduced by being provided with a plurality of pyramidal projections on their surface, and a high-visibility display device having such an antireflective film. Accordingly, a more high-quality and high-performance display device can be manufactured.

Embodiment Mode 2

In this embodiment mode, an example of a display device having an anti-reflection function with which reflection of incident light from external can be further reduced, for the purpose of providing excellent visibility, is described. More specifically, a case where the display device has a passive-matrix structure is described.

Figure 5A:
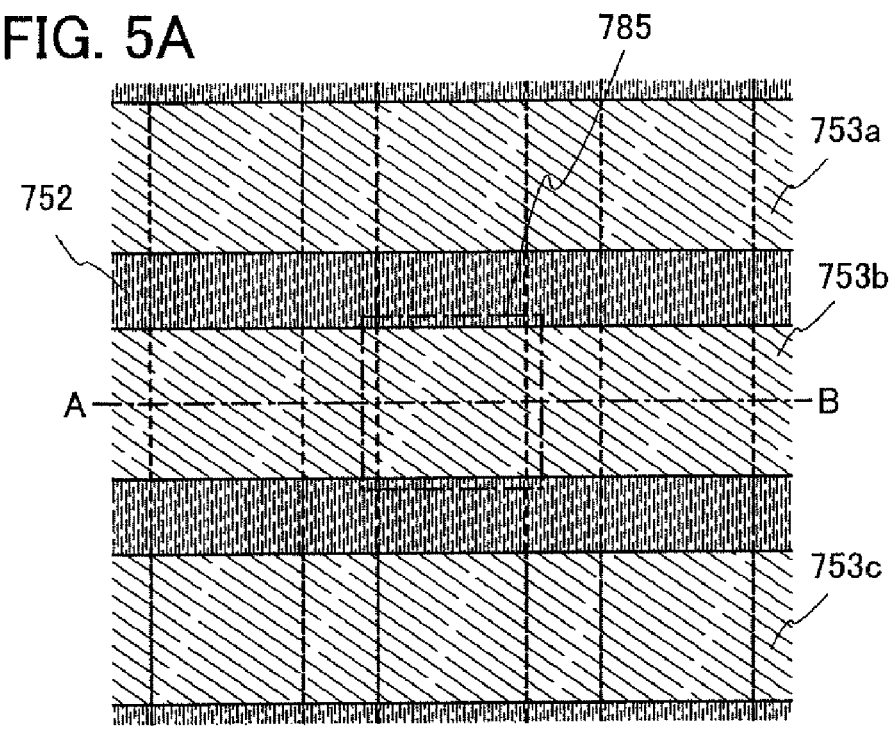
FIGS. 5A to 5C are a top plan view and cross-sectional views each of which shows a display device of the present invention.
Figure 5B:
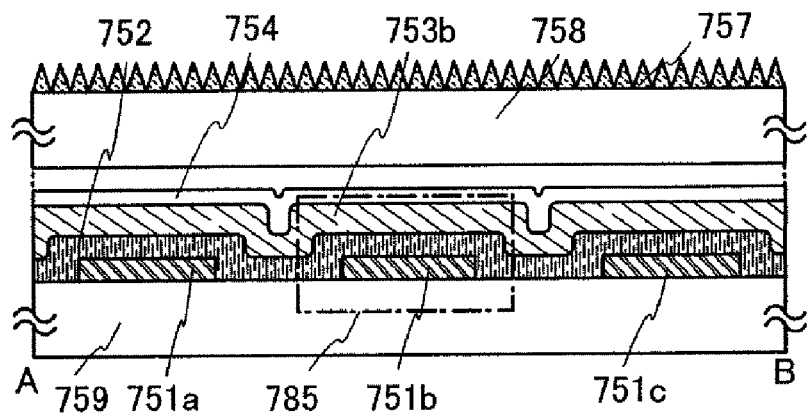

The display device includes a first electrode layer 751a, a first electrode layer 751b, and a first electrode layer 751c which extend in a first direction; an electroluminescent layer 752 which is provided to cover the first electrode layer 751a, the first electrode layer 751b, and the first electrode layer 751c; and a second electrode layer 753a, a second electrode layer 753b, and a second electrode layer 753c which extend in a second direction perpendicular to the first direction (see FIGS. 5A and 5B). The electroluminescent layer 752 is provided between the first electrode layer 751a, the first electrode layer 751b, and the first electrode layer 751c and the second electrode layer 753a, the second electrode layer 753b, and the second electrode layer 753c. In addition, an insulating layer 754 functioning as a protective film is provided to cover the second electrode layer 753a, the second electrode layer 753b, and the second electrode layer 753c (see FIGS. 5A and 5B). A reference numeral 785 indicates a display element. Note that when there is concern about the influence of a transverse electric field between adjacent light-emitting elements, the electroluminescent layer 752 provided in each light-emitting element may be separated.

Figure 5C:
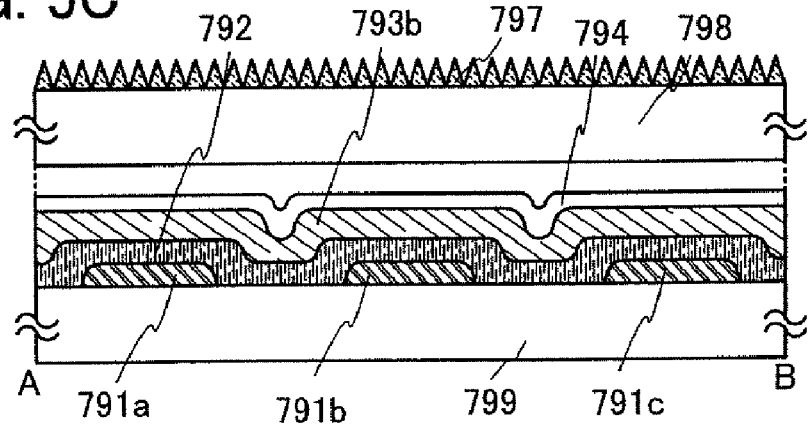

FIG. 5C shows a variation on FIG. 5B, in which a first electrode layer 791a, a first electrode layer 791b, a first electrode layer 791c, an electroluminescent layer 792, a second electrode layer 793b, and an insulating layer 794 that is a protective layer are provided on a substrate 799. Like the first electrode layer 791a, the first electrode layer 791b, and the first electrode layer 791c in FIG. 5C, the first electrode layer may have a tapered shape or a shape in which a radius of curvature changes continuously. Shapes like the first electrode layer 791a, the first electrode layer 791b, and the first electrode layer 791c can be formed by a droplet discharging method or the like. When the first electrode layer has such a curved surface with a curvature, the coverage thereof with an insulating layer or a conductive layer which is stacked is favorable.

In addition, a partition (insulating layer) may be formed so as to cover an end portion of the first electrode layer. The partition (insulating layer) functions like a wall which separates between light-emitting elements, Each of FIGS. 6A and 6B shows a structure in which an end portion of the first electrode layer is covered with a partition (insulating layer).

Figure 6A:
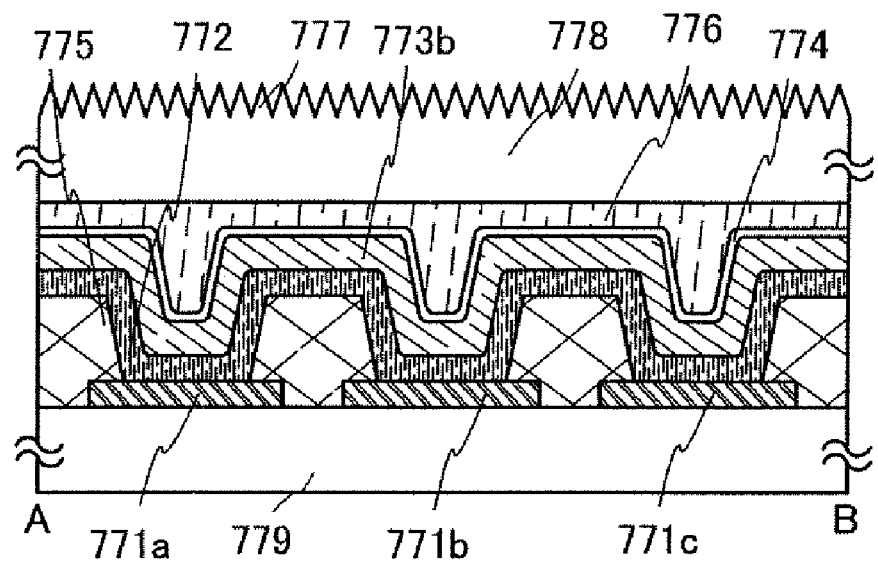
FIGS. 6A and 6B are cross-sectional views each showing a display device of the present invention.
Figure 6B:
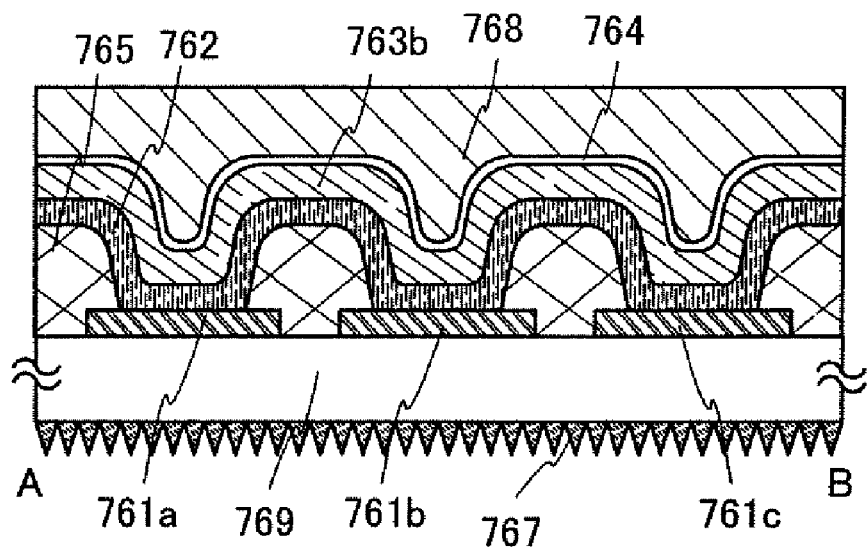

In one example of a light-emitting element shown in FIG. 6A, a partition (insulating layer) 775 is formed to have a tapered shape so as to cover end portions of a first electrode layer 771a, a first electrode layer 771b, and a first electrode layer 771c. The partition (insulating layer) 775 is formed over the first electrode layer 771a, the first electrode layer 771b, and the first electrode layer 771c which are provided in contact with a substrate 779, and an electroluminescent layer 772, a second electrode layer 773b, an insulating layer 774, an insulating layer 776, and a substrate 778 are provided.

In one example of a light-emitting element shown in FIG. 613, a partition (insulating layer) 765 has a shape having a curvature, in which a radius of curvature changes continuously. The partition 765 is provided in contact with a first electrode layer 761a, a first electrode layer 761b, a first electrode layer 761c, an electroluminescent layer 762, a second electrode layer 763b, an insulating layer 764, and a protective layer 768.

Figure 4:
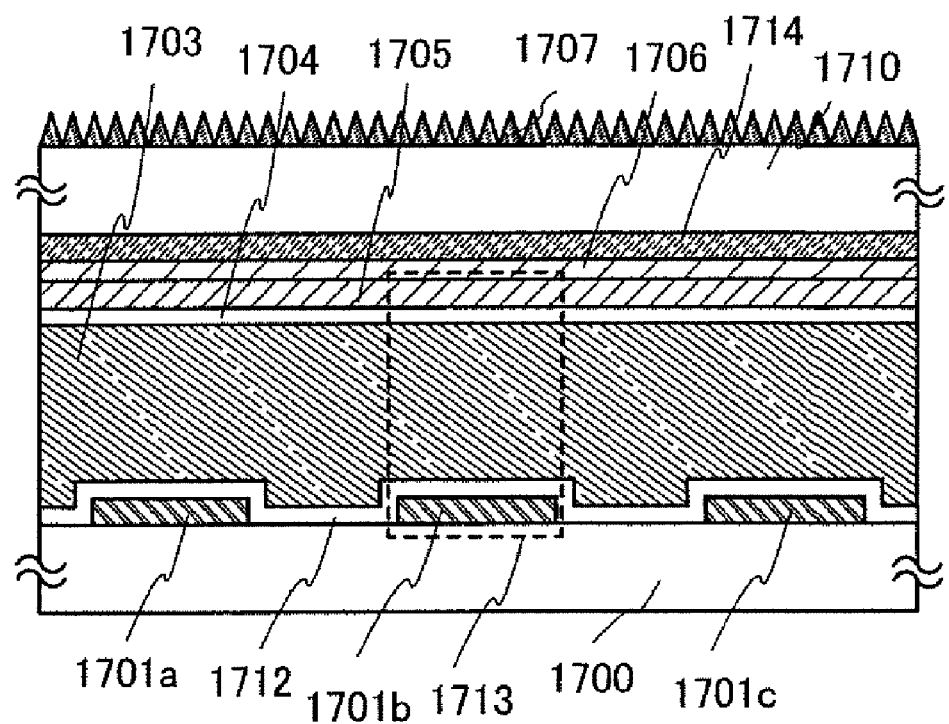
FIG. 4 is a cross-sectional view showing a display device of the present invention.

FIG. 4 shows a passive-matrix liquid crystal display device to which the present invention is applied. In FIG. 4, a substrate 1700 provided with first pixel electrode layers 1701a, 1701b, and 1701c, and an insulating layer 1712 functioning as an orientation film faces a substrate 1710 provided with an insulating layer 1704 functioning as an orientation film, a counter electrode layer 1705, a colored layer 1706 functioning as a color filter, and a polarizing plate 1714, with a liquid crystal layer 1703 interposed therebetween.

In the present invention, in order that the display screen surface of the display device may be provided with an anti-reflection function with which reflection of incident light from external is prevented, a plurality of pyramidal projections are densely arranged on the display screen surface. In this embodiment mode, pyramidal projections 757, 797, 777, 767, and 1707 are provided on surfaces of substrates 758, 798, 778, 769, and 1710, respectively.

The display device of this embodiment mode is acceptable as long as it has a structure having pyramidal projections which are densely arranged so as to be adjacent to each other. A structure may be employed in which pyramidal projections are formed directly into a surface part of a substrate (film) forming the display screen, as an integrated continuous structure. For example, a surface of a substrate (film) may be processed so that pyramidal projections are formed thereinto, or a shape with pyramidal projections may be selectively formed by a printing method such as nanoimprinting. Alternatively, pyramidal projections may be formed on a substrate (film) in another step.

The plurality of pyramidal projections may be formed as an integrated continuous film, or may be densely arranged on a substrate. Alternatively, pyramidal projections may be formed into a substrate in advance. FIG. 6A is an example in which a plurality of pyramidal projections 777 are provided on a surface of a substrate 778 as an integrated continuous structure.

In a case where the display screen has a plane with respect to incident light from external (a side parallel to the display screen), incident light from external are reflected to the viewer side. Therefore, the display screen having fewer plane regions has a higher anti-reflection function. In order that incident light from external are further scattered, a plurality of sides each forming an angle with respect to a surface of the display screen are preferably formed on the surface of the display screen.

In the present invention, since the plurality of pyramidal projections are densely arranged with no space therebetween, a refractive index varies from the display screen surface side to the outside (the air) due to the physical shape of a pyramidal projection. In this embodiment mode, the tops of the plurality of pyramidal projections are arranged so as to be evenly spaced and each side of the base of a pyramidal projection is in contact with one side of the base of an adjacent pyramidal projection. That is, one pyramidal projection is surrounded by other pyramidal projections, and the base of the pyramidal projection and the base of the adjacent pyramidal projection have a side in common.

Thus, since the pyramidal projections are arranged densely so that the tops thereof are evenly spaced, the display screen has a high anti-reflection function with which incident light from external can be efficiently scattered in many directions.

Since a plurality of the pyramidal projections 451 of this embodiment mode are arranged so that the tops thereof are evenly spaced, the cross sectional surfaces of the plurality of the pyramidal projections 451 have the same shape as shown in FIGS. 4, 5A to 5C, 6A, and 6B. The plurality of the pyramidal projections 451 are arranged so as to be in contact with each other and each side of the base of the pyramidal projection is in contact with one side of the base of the adjacent pyramidal projection. Therefore, in this embodiment mode, the plurality of pyramidal projections are arranged with no space therebetween and cover the display screen surface as shown in FIGS. 4, 5A to 5C, 6A, and 6B. A plane portion of the display screen surface is not exposed by the plurality of pyramidal projections and incident light from external is incident on sloped surfaces of the plurality of pyramidal projections, so that reflection of incident light from external on the plane portion can be reduced.

In this embodiment mode, the distance between the tops of the plurality of pyramidal projections and the width of the base of the pyramidal projection are preferably equal to or shorter than 350 nm, and the height of each of the plurality of pyramidal projections is preferably equal to or longer than 800 nm. The fill rate of bases of the plurality of pyramidal projections per unit area of a display screen (the rate of the display screen which is filled (occupied)) is equal to or more than 80%, preferably equal to or more than 90%. A fill rate is a rate of a formation region of pyramidal projections on a display screen. When the fill rate is equal to or more than 80%, the rate of plane portions where no pyramidal projection is formed (which is parallel to the display screen) is equal to or less than 20%. The ratio of the height of a pyramidal projection to the width of a base thereof is preferably equal to or more than 5. Under the above-described condition, the rate of light incident from external on the plane portion is reduced and thus reflection with respect to the viewer side can be prevented.

Further, the plurality of pyramidal projections preferably have as many sides each forming an angle with respect to the bases thereof as possible because incident light from external are scattered in many more directions. In this embodiment mode, a pyramidal projection has six sides which are in contact with and at an angle to a base. In addition, since the base of a pyramidal projection shares a vertex with bases of two other pyramidal projections and the pyramidal projection has a plurality of sides which are provided at an angle, incident light is more easily reflected in many directions. Therefore, the more vertices the base of a pyramidal projection has, the more easily an anti-reflection function thereof can be exerted, and the pyramidal projection of this embodiment mode has six vertices of the base. The pyramidal projections each having a hexagonal pyramidal base of this embodiment mode have shapes capable of being densely arranged with no space therebetween, which are optimal shapes each having the largest number of sides among pyramidal projections capable of being densely arranged with no space therebetween and a high anti-reflection function with which incident light can be scattered efficiently in many directions.

Since the plurality of pyramidal projections 757, 797, 777, 767, and 1707 are provided so that the tops thereof are evenly spaced, the cross-sectional views thereof are isosceles triangles. Each of the cross-sectional views is taken along line O-P in the top plan view of FIG. 2A of Embodiment Mode 1. In this specification, when the cross-sectional view of the pyramidal projection is shown, it is a cross section taken along line including a perpendicular line dropped from a center of the base (an intersection of diagonal lines) of the pyramidal projection to a side of the base as the pyramidal projection 451 is cut along line O-P in FIG. 2A.

The pyramidal projection can be formed of a material having a refractive index which is nonuniform and varies from the side surface toward a display screen. For example, in each of the plurality of pyramidal projections, a portion closer to the side surface is formed of a material having a refractive index equivalent to that of the air to reduce reflection, by the side surface of the pyramidal projection, of light incident on each pyramidal projection from external through the air. On the other hand, a portion of each of the plurality of pyramidal projections, which is closer to the substrate on the display screen side, is formed of a material having a refractive index equivalent to that of the substrate to further reduce reflection by an interface between each pyramidal projection and the substrate, of incident light from external which propagates inside each pyramidal projection and is incident on the substrate Since the refractive index of air is smaller than that of a glass substrate, when a glass substrate is used as the substrate, each pyramidal projection may have such a structure in which a portion closer to the top of the pyramidal projection is formed of a material having a lower refractive index and a portion closer to the base of the pyramidal projection is formed of a material having a higher refractive index, so that the refractive index increases from the top to the base of the pyramidal projection.

A material used for forming the pyramidal projection may be appropriately selected in accordance with a material of the substrate forming a display screen surface, such as silicon, nitrogen, fluorine, oxide, nitride, or fluoride. As the oxide, the following can be used: silicon oxide ($SiO_2$), boric oxide ($B_2O_3$), sodium oxide ($NaO_2$), magnesium oxide (MgO), aluminum oxide (alumina) ($Al_2O_3$), potassium oxide ($K_2O$), calcium oxide (CaO), diarsenic trioxide (arsenious oxide) ($As_2O_3$), strontium oxide (SrO), antimony oxide ($Sb_2O_3$), barium oxide (BaO), indium tin oxide (ITO), zinc oxide (ZnO), indium zinc oxide (IZO) in which indium oxide is mixed with zinc oxide (ZnO), a conductive material in which indium oxide is mixed with silicon oxide ($SiO_2$), organoindium, organotin, indium oxide containing tungsten oxide, indium zinc oxide containing tungsten oxide, indium oxide containing titanium oxide, indium tin oxide containing titanium oxide, or the like. As the nitride, aluminum nitride (AlN), silicon nitride (SiN), or the like can be used. As the fluoride, lithium fluoride (LiF), sodium fluoride (NaF), magnesium fluoride ($MgF_2$), calcium fluoride ($CaF_2$), lanthanum fluoride ($LaF_3$), or the like can be used. The antireflective film may include one or more kinds of the above-described silicon, nitrogen, fluorine, oxide, nitride, and fluoride. The mixing ratio thereof may be appropriately set in accordance with the ratio of components (a composition ratio) of the substrate. Alternatively, a material, which is described above as a material of the substrate, may be used.

The pyramidal projection can be formed in such a manner that a thin film is formed by a sputtering method, a vacuum evaporation method, a PVD (physical vapor deposition) method, or a CVD (chemical vapor deposition) method such as a low-pressure CVD (LPCVD) method or a plasma CVD method, and then etched to have a desired shape. Alternatively, a droplet discharging method by which a pattern can be selectively formed, a printing method by which a pattern can be transferred or drawn (a method for forming a pattern such as screen printing or offset printing), a coating method such as a spin coating method, a dipping method, a dispensing method, a brush coating method, a spraying method, a flow coating method, or the like may be employed. Still alternatively, an imprinting technique or a nanoimprinting technique with which a nanoscale three-dimensional structure can be formed by a transfer technology may be employed. Imprinting and nanoimprinting are techniques with which a minute three-dimensional structure can be formed without using a photolithography process.

The display device of this embodiment mode has a plurality of pyramidal projections on the surface thereof. Reflection of external light incident on the antireflective film is not reflected to the viewer side but to an adjacent pyramidal projection because a side surface of each pyramidal projection is not horizontal. Alternatively, reflected incident light propagates between adjacent pyramidal projections. External light incident on the antireflective film is partly transmitted through a pyramidal projection, and the rest of the external light incident on the antireflective film, which is reflected light, is then incident on an adjacent pyramidal projection. In this manner, the external light incident on the antireflective film which is reflected by a side surface of the pyramidal projection repeats incidence on adjacent pyramidal projections.

That is, the number of times that external light incident on the antireflective film is incident on the pyramidal projections, of the external light incident on the antireflective film which is incident on the display device, is increased; therefore, the amount of light transmitted through the pyramidal projections is increased. Thus, the amount of external light incident on the antireflective film which is reflected to the viewer side is reduced, and the cause of a reduction in visibility such as reflection can be prevented.

A glass substrate, a quartz substrate, or the like can be used as each of the substrates 758, 759, 769, 778, 779, 798, 799, 1700, and 1710. Alternatively, a flexible substrate may be used. The flexible substrate refers to a substrate which can be bent. For example, in addition to a plastic substrate made of polycarbonate, polyarylate, polyethersulfone, or the like, elastomer which is a high molecular weight material, or the like, with a property of being plasticized at high temperature to be shaped similarly to plastic and a property of being an elastic body like a rubber at a room temperature can be given. Alternatively, a film (made of polypropylene, polyester, vinyl, polyvinyl fluoride, vinyl chloride, or the like), an inorganic film formed by evaporation, or the like can be used.

The partition (insulating layer) 765 and the partition (insulating layer) 775 may be formed using an inorganic insulating material such as silicon oxide, silicon nitride, silicon oxynitride, aluminum oxide, aluminum nitride, or aluminum oxynitride; an acrylic acid, a methacrylic acid, or a derivative thereof; a heat-resistant high molecule such as polyimide, aromatic polyamide, or polybenzimidazole; or a siloxane resin may be used. Other resin materials such as a vinyl resin, for example, polyvinyl alcohol or polyvinyl butyral, an epoxy resin, a phenol resin, a novolac resin, an acrylic resin, a melamine resin, and a urethane resin may be used. Alternatively, an organic material such as benzocyclobutene, parylene, fluorinated arylene ether, or polyimide, or a composition material containing water-soluble homopolymers and water-soluble copolymers may be used. As a manufacturing method, a vapor deposition method such as a plasma CVD method or a thermal CVD method, or a sputtering method can be used. Alternatively, a droplet discharging method or a printing method (a method for forming a pattern, such as screen printing or offset printing) may be used. A film obtained by a coating method, an SOG film, or the like may be used.

After a conductive layer, an insulating layer, or the like is formed by discharging a composition by a droplet-discharging method, a surface thereof may be planarized by being pressed with pressure to enhance a level of planarity. As a pressing method, scanning of the surface by a roller-shaped object to reduce concavity and convexity of the surface; using a flat plate-shaped object to press the surface; or the like can be given. When pressing the surface, a heating step may be performed. Alternatively, concavity and convexity of the surface may be removed with an air knife after the surface is softened or melted with a solvent or the like. Alternatively, a CMP method may be used for polishing the surface. This step can be employed to planarize the surface when the surface becomes uneven due to a droplet-discharging method.

This embodiment mode can provide a high-visibility display device having an anti-reflection function with which reflection of incident light from external can be further reduced by being provided with a plurality of pyramidal projections on their surface. Accordingly, a more high-quality and high-performance display device can be manufactured.

This embodiment mode can be freely combined with Embodiment Mode 1.

Embodiment Mode 3

In this embodiment mode, an example of a display device having an anti-reflection function with which reflection of incident light from external can be further reduced, for the purpose of providing excellent visibility, is described. In this embodiment mode, a display device having a different structure from that of Embodiment Mode 2 is described. Specifically, a case where the display device has an active-matrix structure is described.

Figure 26A:
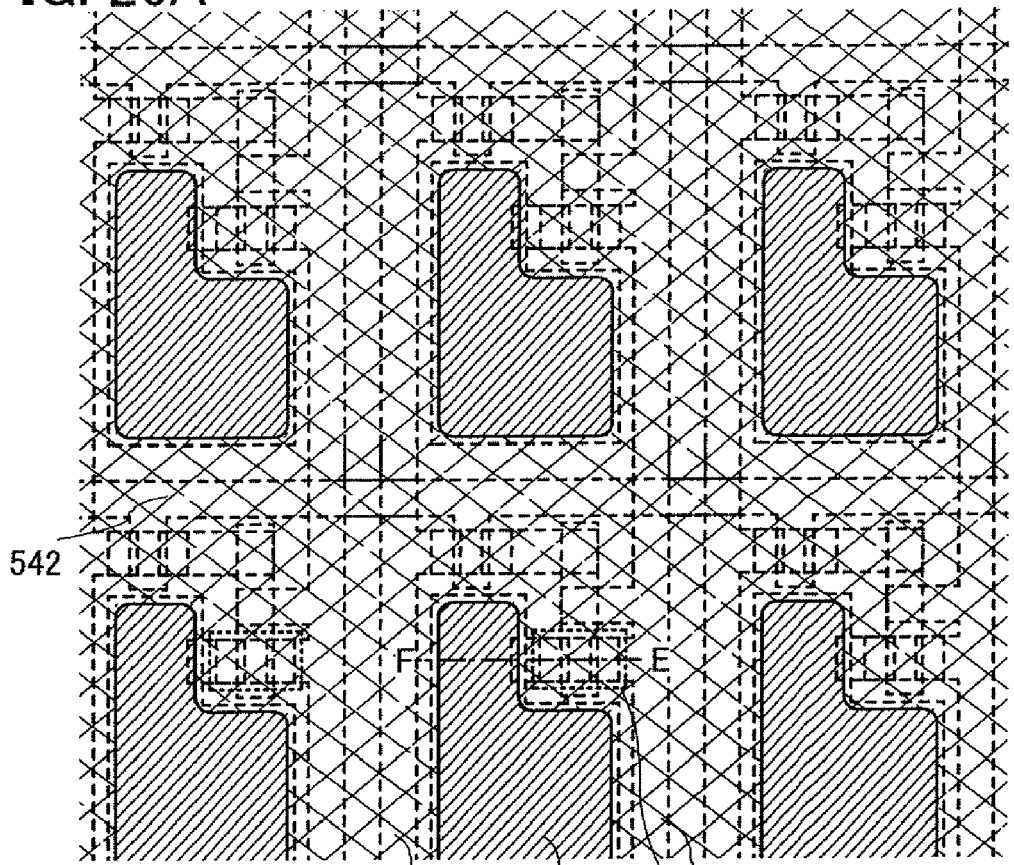
FIGS. 26A and 26B are a top plan view and a cross-sectional view which show a display device of the present invention.
Figure 26B:
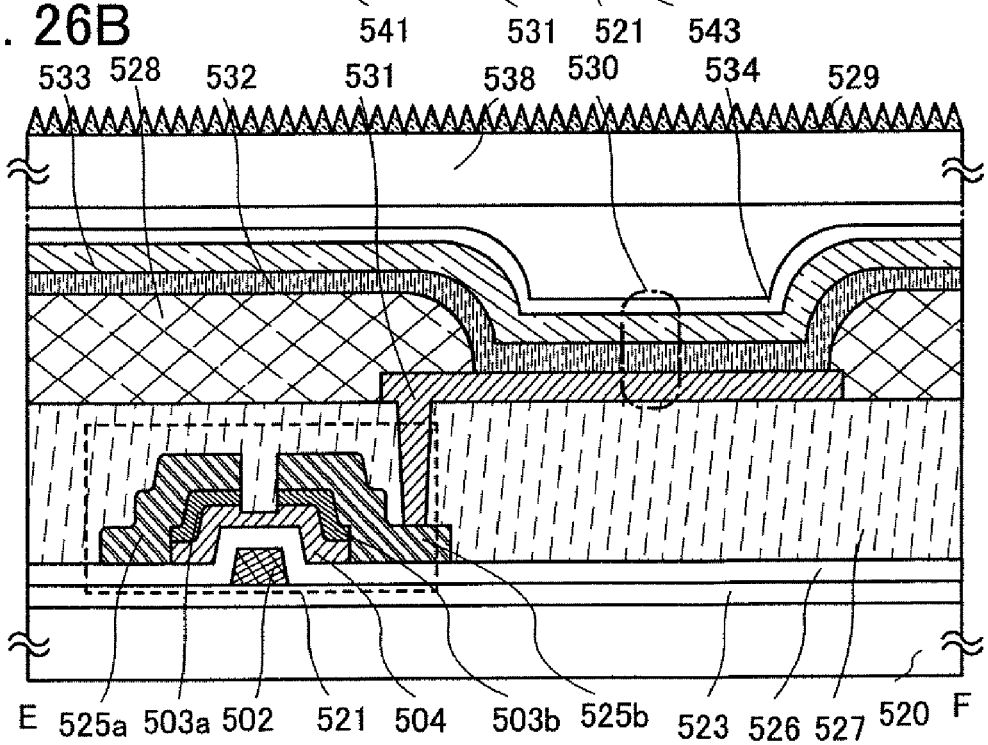

FIG. 26A shows a top plan view of the display device, and FIG. 26B shows a cross-sectional view taken along line E-F in FIG. 26A. Although an electroluminescent layer 532, a second electrode layer 533, and an insulating layer 534 are omitted and not shown in FIG. 26A, each of them is provided as shown in FIG. 26B.

First wirings that extend in a first direction and second wirings that extend in a second direction perpendicular to the first direction are provided over a substrate 520 provided with an insulating layer 523 as a base film. One of the first wirings is connected to a source electrode or a drain electrode of a transistor 521, and one of the second wirings is connected to a gate electrode of the transistor 521. A first electrode layer 531 is connected to a wiring layer 525b that is the source electrode or the drain electrode of the transistor 521, which is not connected to the first wiring, and a light-emitting element 530 is formed using a stacked-layer structure of the first electrode layer 531, the electroluminescent layer 532, and the second electrode layer 533. A partition (insulating layer) 528 is provided between adjacent light-emitting elements, and the electroluminescent layer 532 and the second electrode layer 533 are stacked over the first electrode layer and the partition (insulating layer) 528. An insulating layer 534 functioning as a protective layer and a substrate 538 functioning as a sealing substrate are provided over the second electrode layer 533. As the transistor 521, an inversed staggered thin film transistor is used (see FIGS. 26A and 26B). Light emitted from the light-emitting element 530 is extracted from the substrate 538 side. Thus, a surface of the substrate 538 on the viewer side is provided with a plurality of pyramidal projections 529 of the present invention.

FIGS. 26A and 26B in this embodiment mode show an example in which the transistor 521 is a channel-etch inversed-staggered transistor. In FIGS. 26A and 26B, the transistor 521 includes a gate electrode layer 502, a gate insulating layer 526, a semiconductor layer 504, semiconductor layers 503a and 503b having one conductivity type, and wiring layers 525a and 525b serving as source and drain electrode layers.

A material for forming the semiconductor layer can be an amorphous semiconductor (hereinafter also referred to as "AS") formed by a vapor deposition method using a semiconductor material gas typified by silane or germane or a sputtering method, a polycrystalline semiconductor formed by crystallization of the amorphous semiconductor with the use of light energy or thermal energy, a semi-amorphous semiconductor (also referred to as microcrystal and hereinafter also referred to as "SAS"), or the like.

An SAS is a semiconductor having an intermediate structure between an amorphous structure and a crystalline structure (including single crystal and polycrystal) and a third state which is stable in free energy. Moreover, an SAS includes a crystalline region with a short-distance order and lattice distortion. An SAS is formed by glow discharge decomposition (plasma CVD) of a gas containing silicon. As the gas containing silicon, $SiH_4$, $Si_2H_6$, $SiH_2Cl_2$, $SiHCl_3$, $SiCl_4$, $SiF_4$, or the like can be used. Further, $F_2$ or $GeF_4$ may be mixed. The gas containing silicon may be diluted with $H_2$, or $H_2$ and one or a plurality of kinds of rare gas elements selected from He, Ar, Kr, and Ne. Further, when a rare gas element such as helium, argon, krypton, or neon is contained to further promote the lattice distortion, stability can be enhanced, and a favorable SAS can be obtained. Further, as the semiconductor layer, an SAS layer formed using a hydrogen-based gas may be stacked over an SAS layer formed using a fluorine-based gas.

As a typical example of an amorphous semiconductor, hydrogenated amorphous silicon can be given, and polysilicon or the like can be given as a typical example of a crystalline semiconductor. Polysilicon (polycrystalline silicon) may be so-called high-temperature polysilicon formed using polysilicon which is formed at processing temperatures of 800° C. or higher as a main material, so-called low-temperature polysilicon formed using polysilicon which is formed at processing temperatures of 600° C. or lower as a main material, polysilicon crystallized by the addition of an element which promotes crystallization, or the like. It is needless to say that a semi-amorphous semiconductor or a semiconductor which includes a crystalline phase in a portion thereof may be used as described above.

When a crystalline semiconductor layer is used for the semiconductor layer, the crystalline semiconductor layer may be formed by known methods (a laser crystallization method, a thermal crystallization method, a thermal crystallization method using an element such as nickel which promotes crystallization, and the like). Further, a microcrystalline semiconductor that is an SAS may be crystallized by laser irradiation to enhance crystallinity. In the case where an element which promotes crystallization is not introduced, before the amorphous silicon layer is irradiated with laser light, the amorphous semiconductor layer is heated at 500° C. for one hour in a nitrogen atmosphere to discharge hydrogen so that a hydrogen concentration in the amorphous semiconductor layer is $1\times10^{20}$ atoms/cm$^3$ or lower. This is because, if the amorphous semiconductor layer contains a lot of hydrogen, the amorphous semiconductor layer may be damaged by laser beam irradiation. The heat treatment for crystallization can be performed using a heating furnace, laser irradiation, irradiation with light emitted from a lamp (also referred to as lamp annealing), or the like. An example of a heating method is an RTA method such as a GRTA (gas rapid thermal annealing) method or an LRTA (lamp rapid thermal annealing) method. GRTA is a method for performing a heat treatment using a high-temperature gas, and LRTA is a method for performing a heat treatment by lamp light.

In a crystallization step in which an amorphous semiconductor layer is crystallized to form a crystalline semiconductor layer, an element which promotes crystallization (also referred to as a catalytic element or a metal element) is added to the amorphous semiconductor layer, and crystallization may be performed by heat treatment (at 550 to 750° C. for 3 minutes to 24 hours). As an element which promotes crystallization of silicon, one or a plurality of kinds of metals selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

There is no particular limitation on a method for introducing a metal element into the amorphous semiconductor layer as long as it is a method for introducing the metal element to a surface or inside of the amorphous semiconductor layer. For example, a sputtering method, a CVD method, a plasma treatment method (including a plasma CVD method), an adsorption method, or a method for applying a solution of metal salt can be used. Among these methods, a method using a solution is simple and advantageous in that the concentration of the metal element can be easily controlled. At this time, it is desirable to form an oxide film by UV light irradiation in an oxygen atmosphere, a thermal oxidation method, treatment with ozone water containing hydroxyl radical or hydrogen peroxide, or the like to improve wettability of the surface of the amorphous semiconductor layer so that an aqueous solution is diffused on the entire surface of the amorphous semiconductor layer.

In order to remove the element which promotes crystallization from the crystalline semiconductor layer or reduce the amount of the element which promotes crystallization in the crystalline semiconductor layer, a semiconductor layer containing an impurity element is formed to be in contact with the crystalline semiconductor layer and is made to function as a gettering sink. As the impurity element, an impurity element imparting n-type conductivity, an impurity element imparting p-type conductivity, a rare gas element, or the like can be used. For example, one or a plurality of kinds of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor layer containing a rare gas element is formed to be in contact with the crystalline semiconductor layer containing the element which promotes crystallization, and heat treatment (at 550 to 750° C. for 3 minutes to 24 hours) is performed. The element which promotes crystallization contained in the crystalline semiconductor layer moves into the semiconductor Layer containing a rare gas element, and the element which promotes crystallization contained in the crystalline semiconductor layer is removed or reduced. After that, the semiconductor layer containing a rare gas element, which is made to function as a gettering sink, is removed.

Laser irradiation can be performed by relatively moving a laser beam and the semiconductor layer. In laser irradiation, a marker can also be formed in order to overlap a beam with high accuracy or control a start position or an end position of laser irradiation. The marker may be formed over the substrate at the same time as the formation of the amorphous semiconductor layer.

In the case of using laser irradiation, a continuous wave laser beam (a CW laser beam) or a pulsed wave laser beam (a pulsed laser beam) can be used. As a laser beam which can be used here, a laser beam emitted from one or more of the following can be used: a gas laser such as an Ar laser, a Kr laser, or an excimer laser; a laser of which medium is single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$, added with one or more of Nd, Yb, Cr, Ti, Ho, Er, Tm, and Ta as a dopant; a glass laser; a ruby laser; an alexandrite laser; a Ti:sapphire laser; a copper vapor laser; or a gold vapor laser. It is possible to obtain crystals with a large grain size when fundamental waves of such laser beams or second to fourth harmonics of the fundamental waves are used. For example, the second harmonic (532 nm) or the third harmonic (355 nm) of an Nd:YVO$_4$ laser (fundamental wave of 1064 nm) can be used. The laser beam may be either a CW laser beam or a pulsed laser beam. In the case of a CW laser beam, a power density of approximately 0.01 to 100 MW/cm$^2$ (preferably, 0.1 to 10 MW/cm$^2$) is necessary. Irradiation is conducted at a scanning rate of approximately 10 to 2000 cm/sec.

It is to be noted that, a laser using, as a medium, single crystalline YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ added with one or more of Nd, Yb, Cr, Ti, Ho, Er, Tm, and Ta as a dopant; an Ar ion laser; or a Ti:sapphire laser can be continuously oscillated. Furthermore, pulse oscillation thereof can be performed at a repetition rate of 10 MHz or more by carrying out Q switch operation, mode locking, or the like. In a case where a laser beam is oscillated at a repetition rate of 10 MHz or more, after a semiconductor layer is melted by a laser and before it is solidified, the semiconductor layer is irradiated with a next pulse. Therefore, unlike a case of using a pulsed laser with a low repetition rate, a solid-liquid interface can be continuously moved in the semiconductor layer, so that crystal grains which continuously grow in a scanning direction can be obtained.

When ceramic (polycrystal) is used as a medium, the medium can be formed into a desired shape in a short time at low cost. In the case of using a single crystal, a columnar medium having a diameter of several millimeters and a length of several tens of millimeters is generally used. However, in the case of using ceramic, a larger medium can be formed.

A concentration of a dopant such as Nd or Yb in a medium, which directly contributes to light emission, cannot be changed largely either in a single crystal or a polycrystal. Therefore, there is limitation to some extent on improvement in laser output by increasing the concentration. However, in the case of using ceramic, the size of the medium can be significantly increased compared with the case of using a single crystal, and thus, significant improvement in output can be achieved.

Furthermore, in the case of using ceramic, a medium having a parallelepiped shape or a rectangular solid shape can be easily formed. When a medium having such a shape is used and emitted light propagates inside the medium in zigzags, an emitted light path can be extended. Therefore, the light is amplified largely and can be emitted with high output. In addition, since a laser beam emitted from a medium having such a shape has a quadrangular shape in cross section at the time of emission, it has an advantage over a circular beam in being shaped into a linear beam. By shaping the laser beam emitted as described above using an optical system, a linear beam having a length of 1 mm or less on a shorter side and a length of several millimeters to several meters on a longer side can be easily obtained. Further, by uniformly irradiating the medium with excited light, the linear beam has a uniform energy distribution in a long-side direction. Moreover, the semiconductor layer is preferably irradiated with the laser beam at an incident angle θ (0°<θ<90°) because laser interference can be prevented.

By irradiating the semiconductor layer with this linear beam, the entire surface of the semiconductor layer can be annealed more uniformly. When uniform annealing is needed to both ends of the linear beam, a devisal such as utilization of slits for shielding a portion where energy is decayed against light is necessary.

When the linear beam with uniform intensity, which is obtained as described above, is used for annealing the semiconductor layer and a display device is manufactured using this semiconductor layer, the display device have favorable and uniform characteristics.

Alternatively, laser light irradiation may be performed in an inactive gas atmosphere of a rare gas, nitrogen, or the like.

By the laser light irradiation, unevenness of a surface of the semiconductor layer can be suppressed, and variation in the threshold voltage of a transistor, which is caused due to variation in interface state density, can be suppressed.

The amorphous semiconductor layer may be crystallized by a combination of heat treatment and laser light irradiation, or several times of heat treatment or laser light irradiation.

The gate electrode layer can be formed by a sputtering method, an evaporation method, a CVD method, or the like. The gate electrode layer may be formed using an element selected from tantalum (Ta), tungsten (W), titanium (Ti), molybdenum (Mo), aluminum (Al), copper (Cu), chromium (Cr), and neodymium (Nd), or an alloy material or a compound material containing these elements as its main component. Alternatively, as the gate electrode layer, a semiconductor film typified by a polycrystalline silicon film doped with an impurity element such as phosphorus, or AgPdCu alloy may be used. The gate electrode layer may have a single-layer structure or a stacked-layer structure.

In this embodiment mode, the gate electrode layer is formed into a tapered shape; however, the present invention is not limited thereto. The gate electrode layer may have a stacked layer structure, where only one layer has a tapered shape while the other is given a perpendicular side surface by anisotropic etching. The taper angles may differ between the stacked gate electrode layers or may be the same. Due to the tapered shape, coverage by a film that is stacked thereover is improved and defects are reduced; therefore, reliability is enhanced.

In order to form a source electrode layer or drain electrode layer, a conductive film is formed by a PVD method, a CVD method, an evaporation method, or the like, and the conductive film is etched to have a desired shape. Then, a conductive layer can be selectively formed in a predetermined position by a droplet discharging method, a printing method, a dispenser method, an electrolytic plating method, or the like. Alternatively, a reflow method or a damascene method may be used. The source electrode layer or drain electrode layer is formed using a conductive material such as a metal, specifically, Ag, Au, Cu, Ni, Pt, Pd, Ir, Rh, W, Al, Ta, Mo, Cd, Zn, Fe, Ti, Zr, Ba, Si, or Ge or an alloy or nitride thereof. Alternatively, a stacked-layer structure of these materials may be used.

The insulating layers 523, 526, 527, and 534 may be formed using an inorganic insulating material such as silicon oxide, silicon nitride, silicon oxynitride, aluminum oxide, aluminum nitride, or aluminum oxynitride; an acrylic acid, a methacrylic acid, or a derivative thereof; a heat-resistant high molecule such as polyimide, aromatic polyamide, or polybenzimidazole; or a siloxane resin may be used. Other resin materials such as a vinyl resin, for example, polyvinyl alcohol or polyvinyl butyral, an epoxy resin, a phenol resin, a novolac resin, an acrylic resin, a melamine resin, and a urethane resin may be used. Alternatively, an organic material such as benzocyclobutene, parylene, fluorinated arylene ether, or polyimide, or a composition material containing water-soluble homopolymers and water-soluble copolymers may be used. As a manufacturing method, a vapor deposition method such as a plasma CVD method or a thermal CVD method, or a sputtering method can be used. Alternatively, a droplet discharging method, a dispenser method, or a printing method (a method for forming a pattern, such as screen printing or offset printing) may be used. A film obtained by a coating method, an SOG film, or the like may be used.

The structure of the thin film transistor is not limited to that of this embodiment mode. A single-gate structure in which one channel formation region is formed, a double-gate structure in which two channel formation regions are formed, or a triple-gate structure in which three channel formation regions are formed may be employed. Further, the thin film transistor in the peripheral driver circuit region may also employ a single gate structure, a double gate structure, or a triple gate structure.

It is to be noted the present invention is not limited to the thin film transistor described in this embodiment mode, and may be applied to a top gate structure (such as a staggered type or a coplanar type), a bottom gate structure (such as an inverse coplanar type), a dual gate structure in which two gate electrode layers are arranged above or below a channel formation region, each with a gate insulating film interposed therebetween, or another structure.

Figure 7A:
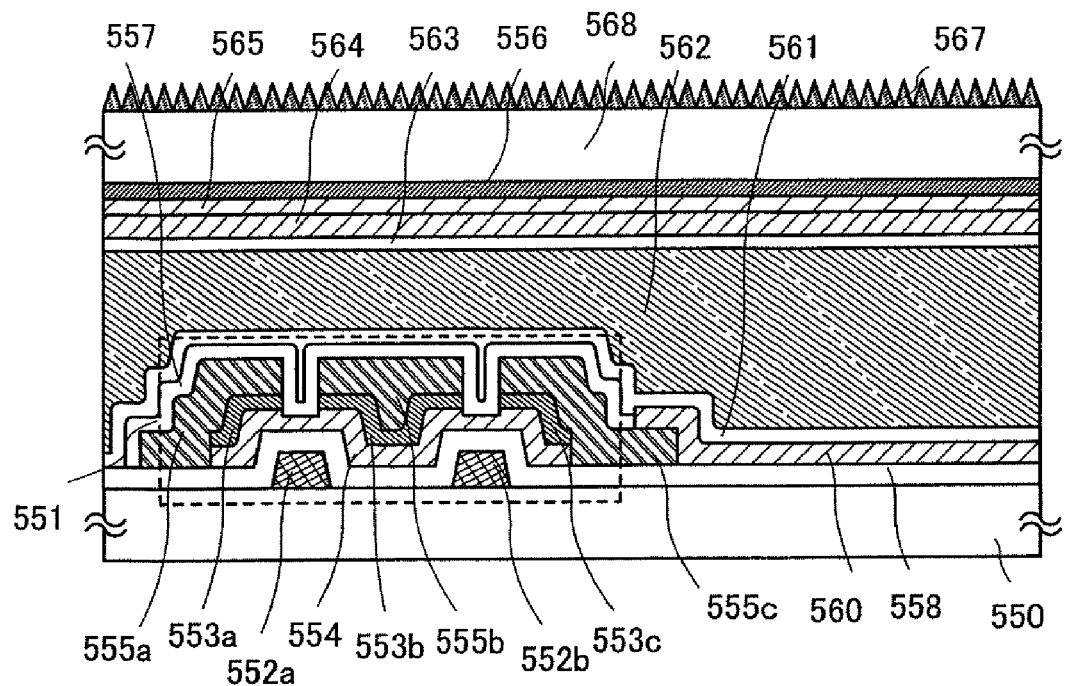
FIGS. 7A and 7B are cross-sectional views each showing a display device of the present invention.
Figure 7B:
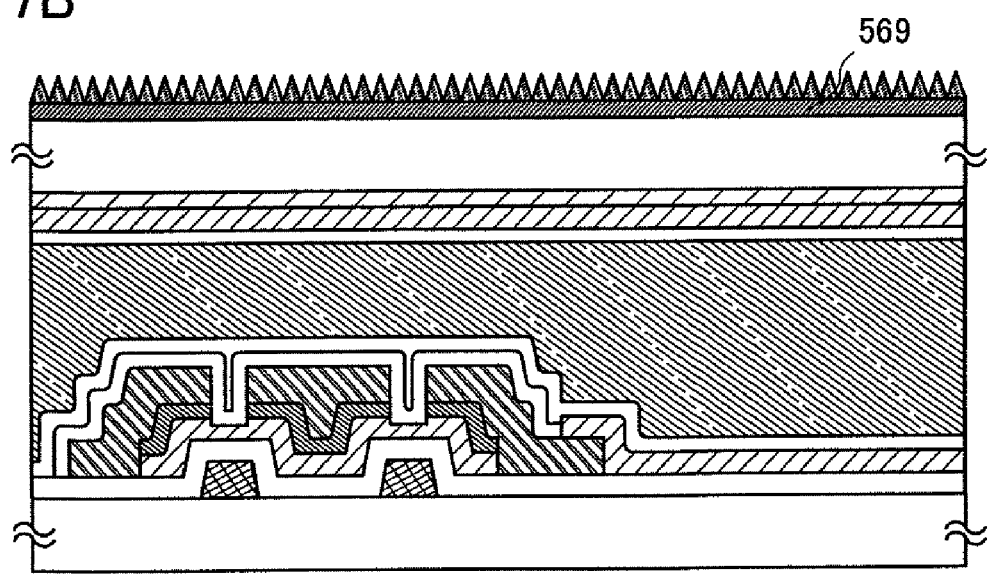

Each of FIGS. 7A and 7B shows an active-matrix liquid crystal display device to which the present invention is applied. In each of FIGS. 7A and 7B, a substrate 550 provided with a transistor 551 having a multi-gate structure, a pixel electrode layer 560, and an insulating layer 561 functioning as an orientation film faces a substrate 568 provided with an insulating layer 563 functioning as an orientation film, a conductive layer 564 functioning as a counter electrode layer, a colored layer 565 functioning as a color filter, and a substrate 568 provided with a polarizer (also referred to as a polarizing plate) 556, with a liquid crystal layer 562 interposed therebetween. A surface of the substrate 568 on the viewer side is provided with a plurality of pyramidal projections 567 of the present invention.

An example where the transistor 551 is a multigate channel-etch inversed-staggered transistor is described. In FIGS. 7A and 7B, the transistor 551 includes gate electrode layers 552a and 552b, a gate insulating layer 558, a semiconductor layer 554, semiconductor layers 553a, 553b, and 553c having one conductivity type, and wiring layers 555a, 555b, and 555c each serving as a source electrode layer or a drain electrode layer. An insulating layer 557 is provided over a transistor 551.

The display device of FIG. 7A is an example in which the plurality of pyramidal projections 567 are provided on an outer side of the substrate 568, and the polarizer 556, the colored layer 565, and the conductive layer 564 are sequentially provided on an inner side. However, the polarizer 569 may be provided on the outer side of the substrate 568 (on the viewer side) as shown in FIG. 7B, and in that case, the plurality of pyramidal projections 567 may be provided on a surface of the polarizer 569. The stacked-layer structure of the polarizer and the colored layer is also not limited to that of FIG. 7A and may be appropriately determined depending on materials of the polarizer and the colored layer or conditions of a manufacturing process.

Figure 13:
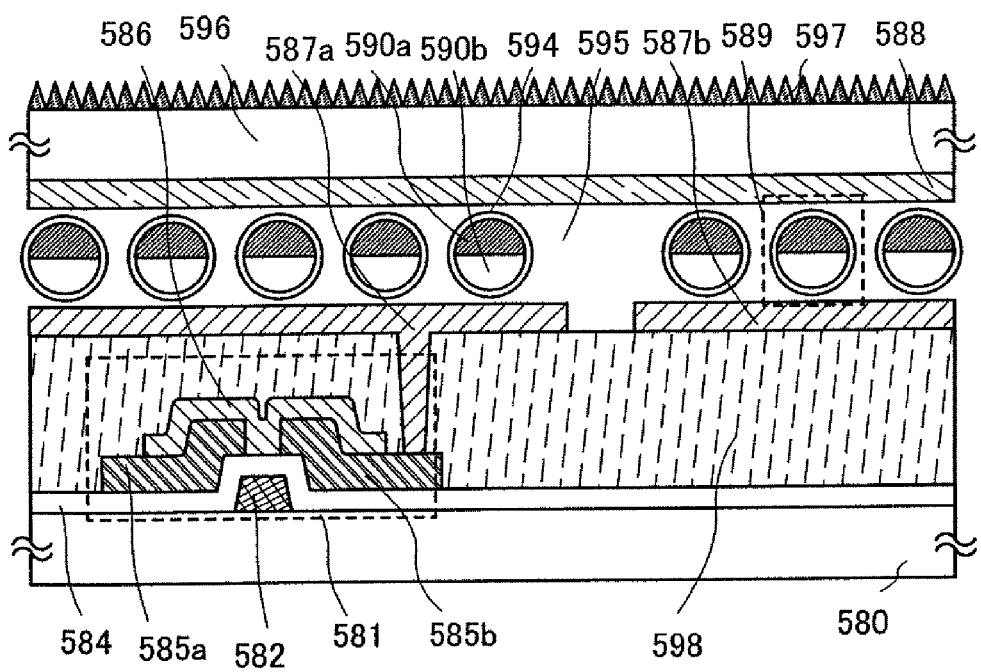
FIG. 13 is a cross-sectional view showing a display device of the present invention.

FIG. 13 shows an active matrix type electronic paper to which the present invention is applied. Although FIG. 13 shows an active matrix type, the present invention can also be applied to a passive matrix type.

Although FIGS. 7A and 7B show examples using a liquid crystal display element as a display element, a display device using a twist ball display mode may be used. A twist ball display mode means a method in which spherical particles each colored in black and white are arranged between a first electrode layer and a second electrode layer, and a potential difference is generated between the first electrode layer and the second electrode layer to control directions of the spherical particles, so that display is performed.

A transistor 581 is an inverse coplanar thin film transistor, and includes a gate electrode layer 582, a gate insulating layer 584, wiring layers 585a and 585b, and a semiconductor layer 586. In addition, the wiring layer 585b is in contact with and electrically connected to first electrode layers 587a through an opening formed in an insulating layer 598. Between the first electrode layers 587a, and a second electrode layer 588, spherical particles 589 each including a black region 590a and a white region 590b, and a cavity 594 filled with liquid around the black region 590a and the white region 590b are provided. The circumference of the spherical particle 589 is filled with a filler 595 such as a resin or the like (see FIG. 13). The plurality of pyramidal projections 597 of the present invention are provided on a surface of a substrate 596 on the viewer side.

Instead of the twist ball, an electrophoretic element may be used. A microcapsule having a diameter of approximately 10 to 20 μm in which transparent liquid, positively charged white microparticles, and negatively charged black microparticles are encapsulated is used. In the microcapsule provided between the first electrode layer and the second electrode layer, when an electric field is applied by the first electrode layer and the second electrode layer, the white microparticles and black microparticles move to opposite sides from each other, so that white or black can be displayed. A display element using this principle is an electrophoretic display element and is called an electronic paper in general. The electrophoretic display element has higher reflectivity than a liquid crystal display element, and thus an assistant light is unnecessary, power consumption is low, and a display portion can be recognized even in a dim place. Further, even when electric power is not supplied to the display portion, an image which has been displayed once can be stored. Thus, a displayed image can be stored even if a semiconductor device having a display function is distanced from a source of an electronic wave.

The transistor may have any structure as long as the transistor can function as a switching element. As a semiconductor layer, various semiconductors such as an amorphous semiconductor, a crystalline semiconductor, a polycrystalline semiconductor, and a microcrystal semiconductor may be used, or an organic transistor may be formed using an organic compound.

The display device of this embodiment mode is acceptable as long as it has a structure having pyramidal projections which are densely arranged so as to be adjacent to each other. A structure may be employed in which pyramidal projections are formed directly into a surface part of a substrate (film) forming the display screen, as an integrated continuous structure. For example, a surface of a substrate (film) may be processed so that pyramidal projections are formed thereinto, or a shape with pyramidal projections may be selectively formed by a printing method such as nanoimprinting. Alternatively, pyramidal projections may be formed on a substrate (film) in another step.

The plurality of pyramidal projections may be formed as an integrated continuous film, or may be densely arranged on a substrate.

In this embodiment mode, the display device has the plurality of pyramidal projections on the display screen surface provided with an anti-reflection function with which reflection of incident light from external is prevented. In a case where the display screen has a plane with respect to incident light from external (a side parallel to the display screen surface), incident light from external are reflected to the viewer side. Therefore, the display screen having fewer plane regions has a higher anti-reflection function. In order that incident light from external are further scattered, a plurality of sides each forming an angle with respect to a surface of the display screen is preferably formed on the surface of the display screen.

In the present invention, since the plurality of pyramidal projections are geometrically densely arranged with no space therebetween, a refractive index varies from the display screen surface side to the outside (the air) due to the physical shape of a pyramidal projection. In this embodiment mode, the tops of the plurality of pyramidal projections are arranged so as to be evenly spaced and each side of the base of a pyramidal projection is in contact with one side of the base of an adjacent pyramidal projection. That is, one pyramidal projection is surrounded by other pyramidal projections, and the base of the pyramidal projection and the base of the adjacent pyramidal projection have a side in common.

Thus, since the pyramidal projections are arranged densely so that the tops thereof are evenly spaced, the display screen has a high anti-reflection function with which incident light from external can be efficiently scattered in many directions.

Since a plurality of the pyramidal projections 567, 597, and 529 of this embodiment mode are arranged so that the tops thereof are evenly spaced, the cross sectional surfaces of the plurality of the pyramidal projections 567, 597, and 529 have the same shape as shown in FIGS. 7A, 7B, 13, 26A, and 26B. The plurality of the pyramidal projections 567, 597, and 529 are arranged so as to be in contact with each other and each side of the base of the pyramidal projection is in contact with one side of the base of the adjacent pyramidal projection. Therefore, in this embodiment mode, the plurality of pyramidal projections are arranged with no space therebetween and cover the display screen surface as shown in FIGS. 7A, 7B, 13, 26A, and 26B. A plane portion of the display screen surface is not exposed by the plurality of pyramidal projections and incident light from external is incident on sloped surfaces of the plurality of pyramidal projections, so that reflection of incident light from external on the plane portion can be reduced.

In this embodiment mode, the distance between the tops of the plurality of pyramidal projections and the width of the base of the pyramidal projection are preferably equal to or shorter than 350 nm, and the height of each of the plurality of pyramidal projections is preferably equal to or longer than 800 nm. The fill rate of bases of the plurality of pyramidal projections per unit area of the surface of a display screen (the rate of the display screen which is filled (occupied)) is equal to or more than 80%, preferably equal to or more than 90%. A fill rate is a rate of a formation region of pyramidal projections over a display screen surface. When the fill rate is equal to or more than 80%, the rate of plane portions where no pyramidal projection is formed (which is parallel to the display screen) is equal to or less than 20%. The ratio of the height of a pyramidal projection to the width of a base thereof is preferably equal to or more than 5. Under the above-described condition, the rate of light incident from external on the plane portion is reduced and thus reflection with respect to the viewer side can be prevented.

Further, the plurality of pyramidal projections preferably have many more sides having angles with respect to the bases thereof because incident light from external are scattered in many more directions. In this embodiment mode, a pyramidal projection has six sides which are in contact with and at an angle to a base. In addition, since the base of a pyramidal projection shares a vertex with bases of two other pyramidal projections and the pyramidal projection has a plurality of sides which are provided at an angle, incident light is more easily reflected in many directions. Therefore, the more vertices the base of a pyramidal projection has, the more easily an anti-reflection function thereof can be exerted, and the pyramidal projection has six vertices of the base. The pyramidal projections each having a hexagonal pyramidal base of this embodiment mode have shapes capable of being densely arranged with no space therebetween, which are optimal shapes each having the largest number of sides of any pyramidal projection and a high anti-reflection function with which incident light can be scattered efficiently in many directions.

The pyramidal projection can be formed of a material having a refractive index which is nonuniform and varies from the side surface toward a display screen. For example, in each of the plurality of pyramidal projections, a portion closer to the side surface is formed of a material having a refractive index equivalent to that of the air to reduce reflection, by the side surface of the pyramidal projection, of light incident on each pyramidal projection from external through the air. On the other hand, a portion of each of the plurality of pyramidal projections, which is closer to the substrate on the display screen side, is formed of a material having a refractive index equivalent to that of the substrate to further reduce reflection by an interface between each pyramidal projection and the substrate, of incident light from external which propagates inside each pyramidal projection and is incident on the substrate. Since the refractive index of air is smaller than that of a glass substrate, when a glass substrate is used as the substrate, each pyramidal projection may have such a structure in which a portion closer to the top of the pyramidal projection is formed of a material having a lower refractive index and a portion closer to the base of the pyramidal projection is formed of a material having a higher refractive index, so that the refractive index increases from the top to the base of the pyramidal projection.

A material used for forming the pyramidal projection may be appropriately selected in accordance with a material of the substrate forming a display screen surface, such as silicon, nitrogen, fluorine, oxide, nitride, or fluoride. As the oxide, the following can be used: silicon oxide ($SiO_2$), boric oxide ($B_2O_3$), sodium oxide ($NaO_2$), magnesium oxide (MgO), aluminum oxide (alumina) ($Al_2O_3$), potassium oxide ($K_2O$), calcium oxide (CaO), diarsenic trioxide (arsenious oxide) ($As_2O_3$), strontium oxide (SrO), antimony oxide ($Sb_2O_3$), barium oxide (BaO), indium tin oxide (ITO), zinc oxide (ZnO), indium zinc oxide (IZO) in which indium oxide is mixed with zinc oxide (ZnO), a conductive material in which indium oxide is mixed with silicon oxide ($SiO_2$), organic indium, organic tin, indium oxide containing tungsten oxide, indium zinc oxide containing tungsten oxide, indium oxide containing titanium oxide, indium tin oxide containing titanium oxide, or the like. As the nitride, aluminum nitride (AlN), silicon nitride (SiN), or the like can be used. As the fluoride, lithium fluoride (LiF), sodium fluoride (NaF), magnesium fluoride ($MgF_2$), calcium fluoride ($CaF_2$), lanthanum fluoride ($LaF_3$), or the like can be used. The antireflective film may include one or more kinds of the above-described silicon, nitrogen, fluorine, oxide, nitride, and fluoride. A mixing ratio thereof may be appropriately set in accordance with the ratio of components (a composition ratio) of the substrate.

The pyramidal projection can be formed in such a manner that a thin film is formed by a sputtering method, a vacuum evaporation method, a PVD (physical vapor deposition) method, or a CVD (chemical vapor deposition) method such as a low-pressure CVD (LPCVD) method or a plasma CVD method, and then etched to have a desired shape. Alternatively, a droplet discharging method by which a pattern can be selectively formed, a printing method by which a pattern can be transferred or drawn (a method for forming a pattern such as screen printing or offset printing), a coating method such as a spin coating method, a dipping method, a dispenser method, a brush coating method, a spraying method, a flow coating method, or the like may be employed. Still alternatively, an imprinting technique or a nanoimprinting technique with which a nanoscale three-dimensional structure can be formed by a transfer technology may be employed. Imprinting and nanoimprinting are techniques with which a minute three-dimensional structure can be formed without using a photolithography process.

The display device of this embodiment mode has a plurality of pyramidal projections on the surface thereof. Reflected external light incident on the antireflective film is reflected to not the viewer side but another adjacent pyramidal projection because a side surface of each pyramidal projection is not horizontal. Alternatively, reflected incident light propagates between adjacent pyramidal projections. External light incident on the antireflective film is partly transmitted through a pyramidal projection, and the rest of the external light incident on the antireflective film, which is reflected light, is then incident on an adjacent pyramidal projection. In this manner, the external light incident on the antireflective film which is reflected by a side surface of the pyramidal projection repeats incidence on adjacent pyramidal projections.

That is, the number of times that incident light from external is incident on the pyramidal projections, of the incident light from external which is incident on the display device, is increased; therefore, the amount of light transmitted through the pyramidal projections is increased. Thus, the amount of incident light from external which is reflected to the viewer side is reduced, and the cause of a reduction in visibility such as reflection can be prevented.

This embodiment mode can provide a high-visibility display device having an anti-reflection function with which reflection of incident light from external can be further reduced by being provided with a plurality of pyramidal projections on their surface. Accordingly, a more high-quality and high-performance display device can be manufactured.

This embodiment mode can be freely combined with Embodiment Mode 1.

Embodiment Mode 4

In this embodiment mode, an example of a display device having an anti-reflection function with which reflection of incident light from external can be further reduced, for the purpose of providing excellent visibility, is described. Specifically, a liquid crystal display device using a liquid crystal display element as a display element is described.

Figure 8A:
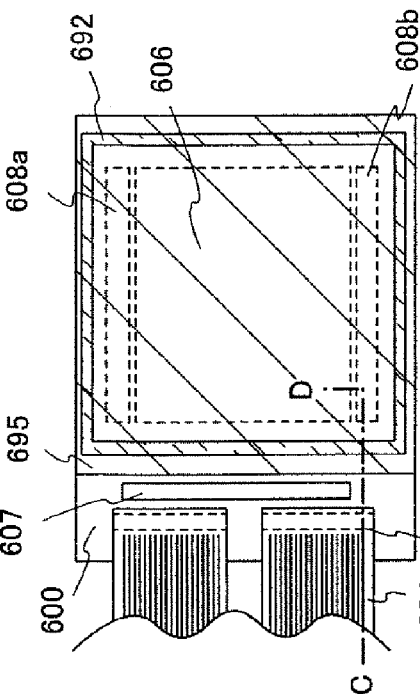
FIGS. 8A and 8B are a top plan view and a cross-sectional view which show a display device of the present invention.

FIG. 8A is a top plan view of a liquid crystal display device having a plurality of pyramidal projections, and FIG. 813 is a cross-sectional view taken along line C-D in FIG. 8A. In the top plan view of FIG. 8A, the plurality of pyramidal projections are omitted.

As shown in FIG. 8A, a pixel region 606, a driver circuit region 608a which is a scan line driver circuit region, and a driver circuit region 608b which is a scan line driver circuit region are sealed between a substrate 600 and a counter substrate 695 with a sealing material 692. A driver circuit region 607 which is a signal line driver circuit formed with a driver IC is provided over the substrate 600. A transistor 622 and a capacitor 623 are provided in the pixel region 606. A driver circuit having transistors 620 and 621 is provided in the driver circuit region 608b. An insulating substrate can be used as the substrate 600 as in the above embodiment modes. Although there is a concern that a substrate formed of a synthetic resin generally has a lower temperature limit than other substrates, the substrate formed of a synthetic resin can be used when a manufacturing process is performed using a substrate with high heat resistance and then the substrate formed of a synthetic resin displaces the substrate with high heat resistance.

In the pixel region 606, the transistor 622 which is to be a switching element is provided with base films 604*a* and 604*b* interposed therebetween. In this embodiment mode, a multi-gate thin film transistor (TFT) is used as the transistor 622, which includes a semiconductor layer having impurity regions serving as a source region and a drain region, a gate insulting layer, a gate electrode layer having a stacked-layer structure of two layers, a source electrode layer, and a drain electrode layer. The source electrode layer or drain electrode layer is in contact with and electrically connected to an impurity region of the semiconductor layer and a pixel electrode layer 630. The thin film transistor can be manufactured by various methods. For example, a crystalline semiconductor film is used for an active layer, a gate electrode is formed over the crystalline semiconductor film with a gate insulating film interposed therebetween, and an impurity element can be added to the active layer with use of the gate electrode. Thus, when the gate electrode is used for adding the impurity element, a mask for adding the impurity element is not necessarily formed. The gate electrode can have a single-layer structure or a stacked-layer structure. The impurity region can be a high-concentration impurity region or a low-concentration impurity region with its concentration being controlled. A structure of a thin film transistor having a low-concentration impurity region is called an LDD (light doped drain) structure. Alternatively, the low-concentration impurity region may be formed so as to overlap with the gate electrode and a structure of such a thin film transistor is called a GOLD (gate overlapped LDD) structure. The polarity of the thin film transistor is an n type when phosphorus (P) or the like is used for the impurity region. The polarity of the thin film transistor is a p type when boron (B) or the like is added. After that, insulating films 611 and 612 covering the gate electrode and the like are formed. A dangling bond of the crystalline semiconductor film can be terminated by a hydrogen element mixed into the insulating film 611 (and the insulating film 612).

In order to further improve planarity, insulating films 615 and 616 may be formed as interlayer insulating films. For the insulating films 615 and 616, an organic material, an inorganic material, or a stacked-layer structure thereof can be used. For example, a material selected from silicon oxide, silicon nitride, silicon oxynitride, silicon nitride oxide, aluminum nitride, aluminum oxynitride, aluminum nitride oxide containing more nitrogen than oxygen, aluminum oxide, diamond-like carbon (DLC), polysilazane, nitrogen-containing carbon (CN), PSG (phosphosilicate glass), BPSG (borophosphosilicate glass), alumina, and any other substance containing an inorganic insulating material can be used. Alternatively, an organic insulating material may be used. As the organic insulating material, either a photosensitive material or a nonphotosensitive material can be used, and polyimide, acrylic, polyamide, polyimide amide, resist, benzocyclobutene, a siloxane resin, or the like can be used. It is to be noted that a siloxane resin is a resin containing a Si—O—Si bond. The skeletal structure of siloxane is formed of a bond of silicon (Si) and oxygen (O). As a substituent, an organic group containing at least hydrogen (such as an alkyl group or aromatic hydrocarbon) is used. Alternatively, a fluoro group or a fluoro group and an organic group containing at least hydrogen may be used as the substituent.

The pixel region and the driver circuit region can be formed over one substrate when the crystalline semiconductor film is used. In this case, a transistor in the pixel portion and a transistor in the driver circuit region 608*b* are formed at the same time. The transistor used in the driver circuit region 608*b* forms a CMOS circuit. Although a thin film transistor included in the CMOS circuit has a GOLD structure, it may have an LDD structure like the transistor 622.

A structure of the thin film transistor in the pixel region is not limited to those in this embodiment mode, and a single-gate structure in which one channel formation region is formed, a double-gate structure in which two channel formation regions are formed, or a triple-gate structure in which three channel formation regions are formed may be employed. A thin film transistor in a peripheral driver circuit region may also have a single-gate structure, a double-gate structure, or a triple-gate structure.

It is to be noted that a method for manufacturing a thin film transistor is not limited to those described in this embodiment mode. The thin film transistor may have a top gate structure (such as a staggered type), a bottom gate structure (such as a inverse staggered type), a dual gate structure in which two gate electrode layers are arranged above or below a channel region, each with a gate insulating film interposed therebetween, or another structure.

Then, an insulating layer 631 called an alignment film is formed by a printing method or a droplet discharging method so as to cover the pixel electrode layer 630 and the insulating film 616. It is to be noted that the insulating layer 631 can be selectively formed by a screen printing method or an off-set printing method. Thereafter, rubbing treatment is performed. This rubbing treatment is not performed in some cases when a liquid crystal mode is, for example, a VA mode. An insulating layer 633 serving as an alignment film is similar to the insulating layer 631. Then, the sealing material 692 is formed in a peripheral region of the pixels by a droplet discharging method.

After that, the counter substrate 695 provided with the insulating layer 633 serving as the alignment film, a conductive layer 634 serving as a counter electrode, a colored layer 635 serving as a color filter, a polarizer 641 (also referred to as a polarizing plate), and pyramidal projections 642 is attached to the substrate 600 which is a TFT substrate with a spacer 637 interposed therebetween. A liquid crystal layer 632 is provided in a space therebetween. Since the liquid crystal display device of this embodiment mode is a transmissive type, a polarizer (polarizing plate) 643 is also provided on the substrate 600 side, which is opposite to a side where an element is formed. The polarizer can be provided over the substrate with the use of an adhesive layer. A filler may be mixed into the sealing material, and a shielding film (black matrix) or the like may be formed over the counter substrate 695. It is to be noted that a color filter or the like may be formed of materials which exhibit red (R), green (G), and blue (B) when the liquid crystal display device performs full-color display, and the colored layer may be omitted or may be formed of a material which exhibits at least one color when the liquid crystal display device performs single-color display.

Figure 8B:
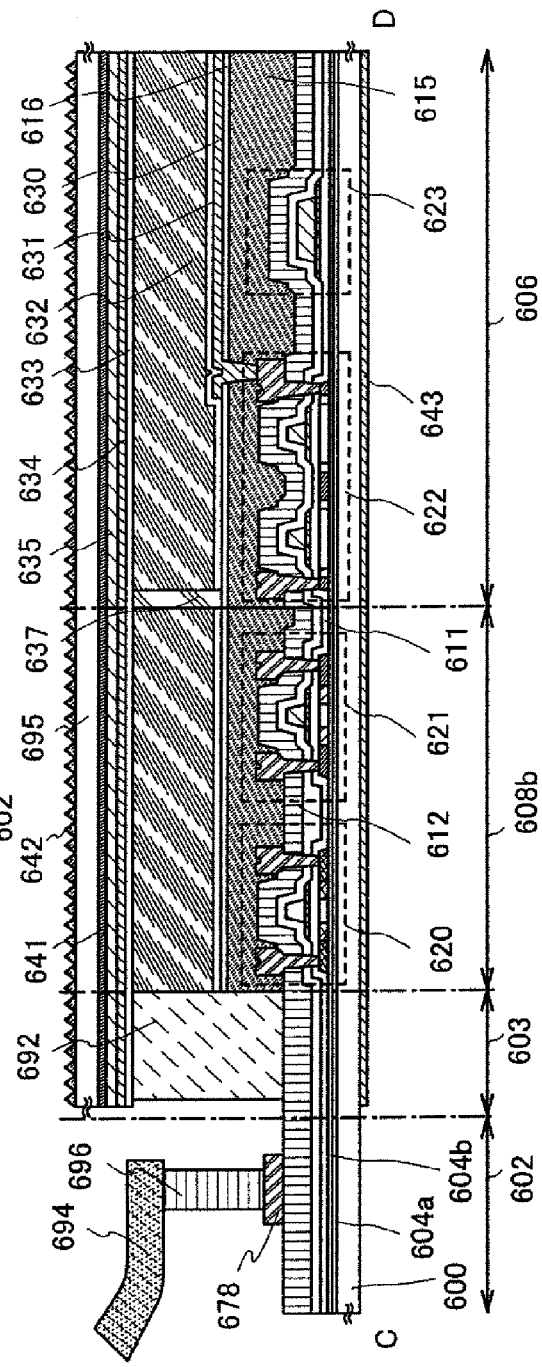

The display device of FIGS. 8A and 8B is an example in which the plurality of pyramidal projections 642 are provided on an outer side of the counter substrate 695, and the polarizer 641, the colored layer 635, and the conductive layer 634 are provided in this order on an inner side. However, the polarizer 641 may be provided on the outer side of the counter substrate 695 (on the viewer side), and in that case, the plurality of pyramidal projections may be provided on a surface of the polarizer (polarizing plate). The stacked-layer structure of the polarizer and the colored layer is also not limited to that of FIGS. 8A and 8B and may be appropriately determined depending on materials of the polarizer and the colored layer or conditions of a manufacturing process.

It is to be noted that when ROB light-emitting diodes (LEDs) or the like are provided in a backlight and a field sequential method for performing color display by time division is employed, there is the case where a color filter is not provided. The black matrix may be provided so as to overlap with the transistor and the CMOS circuit because the black matrix reduces the reflection of incident light from external by the wiring in the transistor and the CMOS circuit. Alternatively, the black matrix may be provided so as to overlap with the capacitor. It is because the black matrix can prevent reflection due to a metal film included in the capacitor.

As a method for forming the liquid crystal layer, a dispenser method (dripping method) or an injection method by which the substrate 600 provided with an element and the counter substrate 695 are attached and then a liquid crystal is injected with the use of capillary phenomenon can be used. A dripping method may be employed when a large substrate to which an injection method is difficult to be applied is used.

A spacer may be provided by a method by which particles each having a size of several μm are sprayed. In this embodiment mode, a method by which a resin film is formed over the entire surface of the substrate and then etched is employed. A material for the spacer is applied by a spinner and then, light exposure and developing treatment are performed to form a predetermined pattern. Further, the material is heated at 150 to 200° C. in a clean oven or the like to be cured. The spacer manufactured in this manner can have various shapes depending on the conditions of light exposure and the developing treatment. It is preferable that the spacer have a columnar shape with a flat top so that mechanical strength of the liquid crystal display device can be secured when the counter substrate is attached. The shape of the spacer is not particularly limited and may be conical, pyramidal, or the like.

Then, an FPC 694, which is a wiring board for connection, is provided over a terminal electrode layer 678 electrically connected to the pixel region, with an anisotropic conductive layer 696 interposed therebetween. The FPC 694 transmits a signal and a potential from external. Through the aforementioned steps, a liquid crystal display device having a display function can be manufactured.

The wiring and the gate electrode layer, which are included in the transistor, the pixel electrode layer 630, and the conductive layer 634 serving as the counter electrode layer can be formed using indium tin oxide (ITO), indium zinc oxide (IZO) in which zinc oxide (ZnO) is mixed with indium oxide, a conductive material in which silicon oxide ($SiO_2$) is mixed with indium oxide, organic indium, organic tin, indium oxide containing tungsten oxide, indium zinc oxide containing tungsten oxide, indium oxide containing titanium oxide, indium tin oxide containing titanium oxide; a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy of such metals; or metal nitride thereof.

A retardation plate may be provided between the polarizing plate and the liquid crystal layer.

In this embodiment mode, the display device has the plurality of pyramidal projections on the display screen surface provided with an anti-reflection function with which reflection of incident light from external is prevented. In this embodiment mode, the pyramidal projections 642 are provided on a surface of the counter substrate 695, which is on a display screen viewer side. In a case where the display screen has a plane with respect to incident light from external (a side parallel to the display screen), incident light from external are reflected to the viewer side. Therefore, the display screen having fewer plane regions has a higher anti-reflection function. In order that incident light from external are further scattered, a plurality of sides each forming an angle with respect to a surface of the display screen is preferably formed on the surface of the display screen.

In the present invention, since the plurality of pyramidal projections are geometrically densely arranged with no space therebetween, a refractive index varies from the display screen surface side to the outside (the air) due to the physical shape of a pyramidal projection. In this embodiment mode, the tops of the plurality of pyramidal projections are arranged so as to be evenly spaced and each side of the base of a pyramidal projection is in contact with one side of the base of an adjacent pyramidal projection. That is, one pyramidal projection is surrounded by other pyramidal projections, and the base of the pyramidal projection and the base of the adjacent pyramidal projection have a side in common.

Thus, since the pyramidal projections are arranged densely so that the tops thereof are evenly spaced, the display screen has a high anti-reflection function with which incident light from external can be efficiently scattered in many directions.

Since a plurality of the pyramidal projections 642 of this embodiment mode are arranged so that the tops thereof are evenly spaced, the cross sectional surfaces of the plurality of the pyramidal projections 642 have the same shape as shown in FIG. 8B. The plurality of the pyramidal projections 642 are arranged so as to be in contact with each other and each side of the base of the pyramidal projection is in contact with one side of the base of the adjacent pyramidal projection. Therefore, in this embodiment mode, the plurality of pyramidal projections are arranged with no space therebetween and cover the display screen surface as shown in FIG. 5B. A plane portion of the display screen surface is not exposed by the plurality of pyramidal projections and incident light from external is incident on sloped surfaces of the plurality of pyramidal projections, so that reflection of incident light from external on the plane portion can be reduced.

In this embodiment mode, the distance between the tops of the plurality of pyramidal projections and the width of the base of the pyramidal projection are preferably equal to or shorter than 350 nm, and the height of each of the plurality of pyramidal projections is preferably equal to or longer than 800 nm. The fill rate of bases of the plurality of pyramidal projections per unit area of the surface of a display screen (the rate of the display screen which is filled (occupied)) is equal to or more than 80%, preferably equal to or more than 90%. A fill rate is a rate of a formation region of pyramidal projections over a display screen surface. When the fill rate is equal to or more than 80%, the rate of plane portions where no pyramidal projection is formed (which is parallel to the display screen) is equal to or less than 20%. The ratio of the height of a pyramidal projection to the width of a base thereof is equal to or more than 5. Under the above-described condition, the rate of light incident from external on the plane portion is reduced and thus reflection with respect to the viewer side can be prevented.

Further, the plurality of pyramidal projections preferably have many more sides having angles with respect to the bases thereof because incident light from external are scattered in many more directions. In this embodiment mode, a pyramidal projection has six sides which are in contact with and at an angle to a base. In addition, since the base of a pyramidal projection shares a vertex with bases of two other pyramidal projections and the pyramidal projection has a plurality of sides which are provided at an angle, incident light is more easily reflected in many directions. Therefore, the more vertices the base of a pyramidal projection has, the more easily an anti-reflection function thereof can be exerted, and the pyramidal projection has six vertices of the base. The pyramidal projections each having a hexagonal pyramidal base of this embodiment mode have shapes capable of being densely arranged with no space therebetween, which are optimal shapes each having the largest number of sides any pyramidal projection and a high anti-reflection function with which incident light can be scattered efficiently in many directions.

The display device of this embodiment mode is acceptable as long as it has a structure having pyramidal projections which are densely arranged so as to be adjacent to each other. A structure may be employed in which pyramidal projections are formed directly into a surface part of a substrate (film) forming the display screen, as an integrated continuous structure. For example, a surface of a substrate (film) may be processed so that pyramidal projections are formed thereinto, or a shape with pyramidal projections may be selectively formed by a printing method such as nanoimprinting. Alternatively, pyramidal projections may be formed on a substrate (film) in another step.

The plurality of pyramidal projections may be formed as an integrated continuous film, or may be densely arranged on a substrate.

The pyramidal projection can be formed of a material having a refractive index which is nonuniform and varies from the side surface toward a display screen. For example, in each of the plurality of pyramidal projections, a portion closer to the side surface is formed of a material having a refractive index equivalent to that of the air to reduce reflection, by the side surface of the pyramidal projection, of light incident on each pyramidal projection from external through the air. On the other hand, a portion of each of the plurality of pyramidal projections, which is closer to the substrate on the display screen side, is formed of a material having a refractive index equivalent to that of the substrate to further reduce reflection by an interface between each pyramidal projection and the substrate, of incident light from external which propagates inside each pyramidal projection and is incident on the substrate. Since the refractive index of air is smaller than that of a glass substrate, when a glass substrate is used as the substrate, each pyramidal projection may have such a structure in which a portion closer to the top of the pyramidal projection is formed of a material having a lower refractive index and a portion closer to the base of the pyramidal projection is formed of a material having a higher refractive index, so that the refractive index increases from the top to the base of the pyramidal projection.

The display device of this embodiment mode has a plurality of pyramidal projections on the surface thereof. Reflected incident light from external is reflected to not the viewer side but another adjacent pyramidal projection because a side surface of each pyramidal projection is not horizontal. Alternatively, reflected incident light propagates between adjacent pyramidal projections. Incident light from external is partly transmitted through a pyramidal projection, and the rest of the incident light from external, which is reflected light, is then incident on an adjacent pyramidal projection. In this manner, the incident light from external which is reflected by a side surface of the pyramidal projection repeats incidence on adjacent pyramidal projections.

That is, the number of times that incident light from external is incident on the pyramidal projections, of the incident light from external which is incident on the display device, is increased; therefore, the amount of light transmitted through the pyramidal projections is increased. Thus, the amount of incident light from external which is reflected to the viewer side is reduced, and the cause of a reduction in visibility such as reflection can be prevented.

This embodiment mode can provide a high-visibility display device having an anti-reflection function with which reflection of incident light from external can be further reduced by being provided with a plurality of pyramidal projections on their surface. Accordingly, a more high-quality and high-performance display device can be manufactured.

This embodiment mode can be freely combined with Embodiment Mode 1.

Embodiment Mode 5

In this embodiment mode, an example of a display device having an anti-reflection function with which reflection of incident light from external can be further reduced, for the purpose of providing excellent visibility, is described. Specifically, a light-emitting display device using a light-emitting element as a display element is described. A method for manufacturing the display device in this embodiment mode is described in detail with reference to FIGS. 9A, 9B, and 12.

Base films 101a and 101b are formed over a substrate 100 having an insulating surface as base films. In this embodiment mode, the base film 101a with a thickness of 10 to 200 nm (preferably, 50 to 150 nm) is formed using a silicon nitride oxide film, and the base film 101b with a thickness of 50 to 200 nm (preferably 100 to 150 nm) is stacked thereover using a silicon oxinitride film. In this embodiment mode, the base films 101a and 101b are formed using a plasma CVD method.

For a material of the base film, an acrylic acid, a methacrylic acid, or a derivative thereof; a heat-resistant high molecule such as polyimide, aromatic polyamide, or polybenzimidazole; or a siloxane resin may be used. Other resin materials such as a vinyl resin, for example, polyvinyl alcohol or polyvinyl butyral, an epoxy resin, a phenol resin, a novolac resin, an acrylic resin, a melamine resin, and a urethane resin may be used. Alternatively, an organic material such as benzocyclobutene, parylene, fluorinated arylene ether, or polyimide, or a composition material containing water-soluble homopolymers and water-soluble copolymers may be used. Further alternatively, an oxazole resin such as photo-curable polybenzoxazole may be used.

The base films can be formed by a sputtering method, a PVD (physical vapor deposition) method, or a CVD (chemical vapor deposition) method such as a low-pressure CVD (LPCVD) method or a plasma CVD method. Alternatively, a droplet discharging method, a printing method (a method for forming a pattern such as screen printing or offset printing), a coating method such as a spin coating method, a dipping method, a dispenser method, or the like may be employed.

As the substrate 100, a glass substrate, or a quartz substrate may be used. Alternatively, a plastic substrate having heat resistance which can withstand the processing temperature in this embodiment mode, or a flexible substrate such as a film may be used. As a plastic substrate, a substrate made of PET (polyethylene terephthalate), PEN (polyethylene naphthalate), or PES (polyethersulfone) can be used. As a flexible substrate, a synthetic resin such as acrylic can be used. Since a display device manufactured in this embodiment mode has a structure in which light is extracted from the light-emitting element through the substrate 100, it is necessary for the substrate 100 to have a light-transmitting property.

As the base film, silicon oxide, silicon nitride, silicon oxynitride, silicon nitride oxide, or the like can be used, and either a single layer structure or a stacked-layer structure including two or three layers may be employed.

Next, a semiconductor film is formed over the base film. The semiconductor film may be formed to a thickness of 25 to 200 nm (preferably, 30 to 150 nm) by various methods (such as a sputtering method, an LPCVD method, and a plasma CVD method). In this embodiment mode, it is preferable to use a crystalline semiconductor layer which is obtained by crystallization of an amorphous semiconductor film by laser.

The semiconductor film obtained as described above may be doped with a slight amount of an impurity element (boron or phosphorus) in order to control a threshold voltage of a thin film transistor. Such doping with the impurity element may be performed to the amorphous semiconductor film before the crystallization step. When the amorphous semiconductor film is doped with an impurity element and then subjected to heat treatment to be crystallized, activation of the impurity element can also be performed. In addition, a defect caused in doping or the like can be ameliorated.

Then, the crystalline semiconductor film is processed by etching into a desired shape, so that a semiconductor layer is formed.

Concerning an etching process, either plasma etching (dry etching) or wet etching may be employed. In the case of processing a large substrate, plasma etching is suitable. As an etching gas, a fluorine-based gas such as $CF_4$ or $NF_3$ or a chlorine-based gas such as $Cl_2$ or $BCl_3$ is used, and an inert gas such as He or Ar may be added to the etching gas as appropriate. When an etching process using an atmospheric discharge is employed, local discharge process is also possible, and it is not necessary to form the mask layer over the entire surface of the substrate.

In the present invention, a conductive layer for forming a wiring layer or an electrode layer, a mask layer for forming a predetermined pattern, or the like may be formed by a method by which a pattern can be selectively formed, such as a droplet discharging method. By a droplet discharging (jetting) method (also called an ink-jet method depending on its system), a droplet of a composition which is mixed for a particular purpose is selectively discharged (jetted) to form a predetermined pattern (such as a conductive layer or an insulating layer). At that time, treatment to control wettability or adhesion may be performed on a formation region. Alternatively, a method by which a pattern can be transferred or drawn, for example, a printing method (a method for forming a pattern, such as screen printing or offset printing), a dispenser method, or the like may be used.

A mask used in this embodiment mode is formed using a resin material such as an epoxy resin, an acrylic resin, a phenol resin, a novolac resin, a melamine resin, or a urethane resin. Alternatively, an organic material such as benzocyclobutene, parylene, fluorinated arylene ether, or polyimide having a light-transmitting property; a compound material made by polymerization of a siloxane-based polymer or the like; a composition material containing a water-soluble homopolymer and a water-soluble copolymer; or the like may be used. Still alternatively, a commercial resist material containing a photosensitizer may be used. For example, a positive type resist or a negative type resist may be used. In a case of using a droplet discharging method, even when using any of the above materials, a surface tension and a viscosity are appropriately controlled by, for example, adjusting the concentration of a solvent or adding a surfactant or the like.

A gate insulating layer 107 which covers the semiconductor layer is formed. The gate insulating layer is formed using an insulating film containing silicon to a thickness of 10 to 150 nm by a plasma CVD method, a sputtering method, or the like. The gate insulating layer may be formed using a known material such as an oxide material or a nitride material of silicon, typified by silicon nitride, silicon oxide, silicon oxynitride, and silicon nitride oxide, and may be a stacked layer or a single layer. The gate insulating layer may have a stacked-layer structure of three layers including a silicon nitride film, a silicon oxide film, and a silicon nitride film, or a single-layer structure or a stacked-layer structure of two layers of a silicon oxynitride film.

Next, a gate electrode layer is formed over the gate insulating layer 107. The gate electrode layer can be formed by a sputtering method, an evaporation method, a CVD method, or the like. The gate electrode layer may be formed using an element selected from tantalum (Ta), tungsten (W), titanium (Ti), molybdenum (Mo), aluminum (Al), copper (Cu), chromium (Cr), and neodymium (Nd), or an alloy material or a compound material containing these elements as its main component. Alternatively, as the gate electrode layer, a semiconductor film typified by a polycrystalline silicon film doped with an impurity element such as phosphorus, or AgPdCu alloy may be used. The gate electrode layer may have a single-layer structure or a stacked-layer structure.

In this embodiment mode, the gate electrode layer is formed into a tapered shape; however, the present invention is not limited thereto. The gate electrode layer may have a stacked layer structure, where only one layer has a tapered shape while the other is given a perpendicular side surface by anisotropic etching. The taper angles may differ between the stacked gate electrode layers as in this embodiment mode or may be the same. Due to the tapered shape, coverage by a film that is stacked thereover is improved and defects are reduced; therefore, reliability is enhanced.

The gate insulating layer 107 may be etched to some extent and reduced in thickness (so-called film reduction) by the etching step for forming the gate electrode layer.

An impurity element is added to the semiconductor layer to form an impurity region. The impurity region can be formed as a high concentration impurity region and a low concentration impurity region by the control of the concentration of the impurity element. A thin film transistor having a low concentration impurity region is referred to as a thin film transistor having an LDD (light doped drain) structure. In addition, the low concentration impurity region can be formed so as to overlap with the gate electrode. Such a thin film transistor is referred to as a thin film transistor having a GOLD (gate overlapped LDD) structure. The polarity of the thin film transistor is made to be an n type by addition of phosphorus (P) or the like to an impurity region thereof. In a case of forming a p-channel thin film transistor, boron (B) or the like may be added.

In this embodiment mode, a region of the impurity region, which overlaps with the gate electrode layer with the gate insulating layer interposed therebetween, is denoted as an Lov region. Further, a region of the impurity region, which does not overlap with the gate electrode layer with the gate insulating layer interposed therebetween, is denoted as an Loff region. In FIG. 15B, the impurity regions are shown by hatching and a blank. This does not mean that the blank is not doped with an impurity element but makes it easy to understand that the concentration distribution of the impurity element in the impurity regions reflects the mask and the doping condition. It is to be noted that this also applies to other drawings in this specification.

In order to activate the impurity element, heat treatment, intense light irradiation, or laser beam irradiation may be performed. At the same time as the activation, plasma damage to the gate insulating layer and plasma damage to the interface between the gate insulating layer and the semiconductor layer can be ameliorated.

Next, a first interlayer insulating layer covering the gate electrode layer and the gate insulating layer is formed. In this embodiment mode, a stacked-layer structure of insulating films 167 and 168 is employed. As the insulating films 167 and 168, a silicon nitride film, a silicon nitride oxide film, a silicon oxynitride film, a silicon oxide film, or the like can be formed by a sputtering method or a plasma CVD method. Alternatively, other insulating film containing silicon may be used as a single layer or a stacked-layer structure including three or more layers.

Further, heat treatment is performed at 300 to 550° C. for 1 to 12 hours in a nitrogen atmosphere to hydrogenate the semiconductor layer. Preferably, this heat treatment is performed at 400 to 500° C. In this step, dangling bonds in the semiconductor layer are terminated by hydrogen contained in the insulating film 167 that is an interlayer insulating layer. In this embodiment mode, heat treatment is performed at 410° C.

The insulating films 167 and 168 may be formed using a material selected from aluminum nitride (AlN), aluminum oxynitride (AlON), aluminum nitride oxide containing more nitrogen than oxygen (AlNO), aluminum oxide, diamond-like carbon (DLC), nitrogen-containing carbon (CN), polysilazane, and other substances containing an inorganic insulating material. A material containing siloxane may be used. Alternatively, an organic insulating material such as polyimide, acrylic, polyamide, polyimide amide, resist, or benzocyclobutene may be used. Further alternatively, an oxazole resin can be used, and for example, photo-curable polybenzoxazole or the like can be used.

Next, a contact hole (opening) is formed in the insulating film 167, the insulating film 168, and the gate insulating layer 107 using a mask made of a resist so as to reach the semiconductor layer. A conductive film is formed to cover the opening, and the conductive film is etched to form a source electrode layer or a drain electrode layer which is electrically connected to a part of a source region or a drain region. In order to form the source electrode layer or drain electrode layer, a conductive film is formed by a PVD method, a CVD method, an evaporation method, or the like, and the conductive film is etched to have a desired shape. Then, a conductive layer can be selectively formed in a predetermined position by a droplet discharging method, a printing method, a dispenser method, an electrolytic plating method, or the like, Alternatively, a reflow method or a damascene method may be used. The source electrode layer or drain electrode layer is formed using a metal such as Ag, Au, Cu, Ni, Pt, Pd, Ir, Rh, W, Al, Ta, Mo, Cd, Zn, Fe, Ti, Zr, or Ba; Si; Ge; or an alloy or metal nitride thereof. Alternatively, a stacked-layer structure of these materials may be used.

Through the above steps, an active matrix substrate can be manufactured, in which a p-channel thin film transistor 285 having a p-type impurity region in an Lov region and an n-channel thin film transistor 275 having an n-channel impurity region in an Lov region are provided in a peripheral driver circuit region 204; and a multi-channel type n-channel thin film transistor 265 having an n-type impurity region in an Loff region and a p-channel thin film transistor 245 having a p-type impurity region in an Lov region are provided in a pixel region 206.

The structure of the thin film transistor is not limited to that of this embodiment mode. A single-gate structure in which one channel formation region is formed, a double-gate structure in which two channel formation regions are formed, or a triple-gate structure in which three channel formation regions are formed may be employed. Further, the thin film transistor in the peripheral driver circuit region may also employ a single gate structure, a double gate structure, or a triple gate structure.

Next, an insulating film 181 is formed as a second interlayer insulating layer. In FIGS. 9A and 9B, a separation region 201 for separation by scribing, an external terminal connection region 202 to which an FPC is attached, a wiring region 203 that is a lead wiring region for the peripheral portion, the peripheral driver circuit region 204, and the pixel region 206 are provided. Wirings 179a and 179b are provided in the wiring region 203, and a terminal electrode layer 178 connected to an external terminal is provided in the external terminal connection region 202.

The insulating film 181 can be formed using a material selected from silicon oxide, silicon nitride, silicon oxynitride, silicon nitride oxide, aluminum nitride (AlN), aluminum oxide containing nitrogen (also referred to as aluminum oxynitride) (AlON), aluminum nitride containing oxygen (also referred to as aluminum nitride oxide) (AlNO), aluminium oxide, diamond-like carbon (DLC), nitrogen-containing carbon (CN), PSG (phosphosilicate glass), BPSG (borophosphosilicate glass), alumina, and any other substance containing an inorganic insulating material. A siloxane resin may also be used. Alternatively, an organic insulating material which is photosensitive or non-photosensitive such as polyimide, acrylic, polyamide, polyimide amide, resist, benzocyclobutene, polysilazane, or any other low-dielectric constant material may be used. Further alternatively, an oxazole resin may be used. For example, photo-curable polybenzoxazole or the like may be used. It is necessary that an interlayer insulating layer provided for planarization have high heat resistance, a high insulating property, and a high level of planarity. Thus, the insulating film 181 is preferably formed by a coating method typified by a spin coating method.

The insulating film 181 can be formed by a dipping method, spray coating, a doctor knife, a roll coater, a curtain coater, a knife coater, a CVD method, an evaporation method, or the like. Instead, the insulating film 181 may be formed by a droplet discharging method. In the case of a droplet discharging method, a material solution can be economized on. Alternatively, a method by which a pattern can be transferred or drawn, like a droplet discharging method, for example, a printing method (a method for forming a pattern, such as screen printing or offset printing), a dispenser method, or the like may be used.

A minute opening, that is, a contact hole, is formed in the insulating film 181 in the pixel region 206.

Next, a first electrode layer (also referred to as pixel electrode layer) 185 is formed so as to be in contact with a source electrode layer or a drain electrode layer. The first electrode layer 185 functions as an anode or a cathode and may be formed from a film mainly containing an element selected from Ti, Ni, W, Cr, Pt, Zn, Sn, In, and Mo, or an alloy material or a compound material containing the above element as its main component, such as titanium nitride, $TiSi_xN_y$, $WSi_x$, tungsten nitride, $WSi_xN_y$, or NbN; or a stacked film thereof with a total thickness of 100 to 800 nm.

In this embodiment mode, a light-emitting element is used as a display element, and the first electrode layer 185 has a light-transmitting property so that light from the light-emitting element is extracted from the first electrode layer 185 side. The first electrode layer 185 is formed using a transparent conductive film which is etched into a desired shape.

In the present invention, the first electrode layer 185 that is a light-transmitting electrode layer may be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. It is needless to say that indium tin oxide (ITO), indium zinc oxide (IZO), indium tin oxide added with silicon oxide (ITSO), or the like may be used instead.

In addition, even in the case of a material that does not have a light-transmitting property, such as a metal film, when the thickness is made thin (preferably, approximately 5 to 30 nm) so that light can be transmitted, light can be emitted through the first electrode layer 185. As a metal thin film that can be used for the first electrode layer 185, a conductive film formed of titanium, tungsten, nickel, gold, platinum, silver, aluminum, magnesium, calcium, lithium, or alloy thereof or the like can be used.

The first electrode layer 185 can be formed by an evaporation method, a sputtering method, a CVD method, a printing method, a dispenser method, a droplet discharging method, or the like. In this embodiment mode, the first electrode layer 185 is formed by a sputtering method using indium zinc oxide containing tungsten oxide. The first electrode layer 185 is preferably formed to a total thickness of 100 to 800 nm.

The first electrode layer 126 may be cleaned and polished by a CMP method or with the use of a polyvinyl alcohol-based porous material so that the surface thereof is planarized. In addition, after being polished using a CMP method, the surface of the first electrode layer 126 may be subjected to ultraviolet light irradiation, oxygen plasma treatment, or the like.

Heat treatment may be performed after the first electrode layer 185 is formed. By the heat treatment, moisture contained in the first electrode layer 185 is discharged. Accordingly, degassing or the like does not occur in the first electrode layer 185. Thus, even when a light-emitting material that easily deteriorates due to moisture is formed over the first electrode layer, the light-emitting material does not deteriorate. Therefore, a highly reliable display device can be manufactured.

Next, an insulating layer 186 (also referred to as a partition or a barrier) covering the edge of the first electrode layer 185 and the source electrode layer or drain electrode layer is formed.

The insulating layer 186 may be formed using silicon oxide, silicon nitride, silicon oxynitride, silicon nitride oxide, or the like and has a single layer structure or a stacked-layer structure of two or three layers. Alternatively, the insulating layer 186 may be formed using a material selected from aluminum nitride, aluminum oxynitride containing more oxygen than nitrogen, aluminum nitride oxide containing more nitrogen than oxygen, aluminum oxide, diamond-like carbon (DLC), nitrogen-containing carbon, polysilazane, and any other substance containing an inorganic insulating material. A material containing siloxane may be used. Alternatively, an organic insulating material which is photosensitive or non-photosensitive such as polyimide, acrylic, polyamide, polyimide amide, resist, or benzocyclobutene may be used. Further alternatively, an oxazole resin can be used. For example, photo-curable polybenzoxazole or the like can be used.

The insulating layer 186 can be formed by a sputtering method, a PVD (physical vapor deposition) method, a CVD (chemical vapor deposition) method such as a low-pressure CVD (LPCVD) method or a plasma CVD method, or the like. Alternatively, a droplet discharging method by which a pattern can be selectively formed, a printing method by which a pattern can be transferred or drawn (a method for forming a pattern, such as screen printing or offset printing), a dispenser method, a coating method such as a spin-coating method, a dipping method, or the like may be used.

As for an etching process for the processing into desired shapes, either plasma etching (dry etching) or wet etching may be employed. In the case of processing a large substrate, plasma etching is suitable. As an etching gas, a fluorine-based gas such as $CF_4$ or $NF_3$ or a chlorine-based gas such as $Cl_2$ or $BCl_3$ is used. An inert gas such as He or Ar may be added to the etching gas as appropriate. When an etching process using an atmospheric discharge is employed, local electric discharging process is also possible, and it is not necessary to form the mask layer over the entire surface of the substrate.

In FIG. 9A, a wiring layer formed of the same material and in the same step as a second electrode layer is electrically connected to a wiring layer formed of the same material and in the same step as the gate electrode layer.

A light-emitting layer 188 is formed over the first electrode layer 185. Although only one pixel is shown in FIGS. 9A and 9B, electroluminescent layers corresponding to R (red), G (green) and B (blue) are formed separately in this embodiment mode.

Then, a second electrode layer 189 formed of a conductive film is provided over the light-emitting layer 188. As the second electrode layer 189, Al, Ag, Li, Ca, or an alloy or a compound thereof such as MgAg, MgIn, AlLi, or $CaF_2$, or calcium nitride may be used. Thus, a light-emitting element 190 including the first electrode layer 185, the light-emitting layer 188, and the second electrode layer 189 is formed (see FIG. 9B).

In the display device of this embodiment mode shown in FIGS. 9A and 9B, light from the light-emitting element 190 is emitted through the first electrode layer 185 side and transmitted in a direction indicated by the arrow in FIG. 9B.

In this embodiment mode, an insulating layer may be provided as a passivation film (protective film) over the second electrode layer 189. It is effective to provide a passivation film in this manner so as to cover the second electrode layer 189. The passivation film may be formed using an insulating film containing silicon nitride, silicon oxide, silicon oxynitride, silicon nitride oxide, aluminum nitride, aluminum oxynitride, aluminum nitride oxide containing more nitrogen than oxygen, aluminum oxide, diamond-like carbon (DLC), or nitrogen-containing carbon, and the insulating film can have a single-layer structure or a stacked-layer structure. Alternatively, a siloxane resin may be used.

In that case, it is preferable to use a film by which favorable coverage is provided as the passivation film, and it is effective to use a carbon film, particularly, a DLC film as the passivation film. A DLC film can be formed in the range from room temperature to 100° C.; therefore, it can also be formed easily over the light-emitting layer 188 with low heat resistance. A DLC film can be formed by a plasma CVD method (typically, an RF plasma CVD method, a microwave CVD method, an electron cyclotron resonance (ECR) CVD method, a thermal-filament CVD method, or the like), a combustion flame method, a sputtering method, an ion beam evaporation method, a laser evaporation method, or the like. As a reaction gas for deposition, a hydrogen gas and a hydrocarbon-based gas (for example, $CH_4$, $C_2H_2$, $C_6H_6$, and the like) are used to be ionized by glow discharge, and the ions are accelerated to impact against a cathode to which negative self bias is applied. Further, a CN film may be formed with the use of a $C_2H_4$ gas and a $N_2$ gas as a reaction gas. A DLC film has a high blocking effect against oxygen; therefore, oxidization of the light-emitting layer 188 can be suppressed. Accordingly, a problem such as oxidation of the light-emitting layer 188 during a sealing step which is subsequently performed can be prevented.

The substrate 100 over which the light-emitting element 190 is formed and a sealing substrate 195 are firmly attached to each other with a sealing material 192, so that the light-emitting element is filled and sealed (see FIGS. 9A and 9B). As the sealing material 192, typically, a visible light curable resin, an ultraviolet curable resin, or a thermosetting resin is preferably used. For example, a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis epoxy resin, a glycidyl ester resin, a glycidyl amine-based resin, a heterocyclic epoxy resin, a modified epoxy resin, or the like can be used. It is to be noted that a region surrounded by the sealing material may be filled with a filler 193, and sealing may be performed in a nitrogen atmosphere to fill the space between the substrate with nitrogen or the like. Since a bottom emission type is employed in this embodiment mode, it is not necessary for the filler 193 to have a light-transmitting property. However, in the case where light is extracted through the filler 193, it is necessary for the filler to have a light-transmitting property. Typically, a visible light curable epoxy resin, an ultraviolet curable epoxy resin, or a thermosetting epoxy resin may be used. Through the aforementioned steps, a display device having a display function using the light-emitting element of this embodiment mode is completed. Further, the filler may be dripped in a liquid state to fill the display device. In the case of using a hygroscopic substance such as a drying agent as the filler, a further moisture absorption effect can be obtained. Therefore, deterioration of the element can be prevented.

A drying agent is provided in an EL display panel to prevent deterioration due to moisture in the element. In this embodiment mode, the drying agent is provided in a concave portion that is formed on the sealing substrate so as to surround the pixel region and thus, a thin design is not spoiled. Further, since the drying agent is also formed in a region corresponding to a gate wiring layer so that a moisture absorbing area is increased, moisture can be effectively absorbed. In addition, since the drying agent is formed over a gate wiring layer which is not self-emitting, light extraction efficiency is not decreased.

The light-emitting element is sealed by a glass substrate in this embodiment mode. It is to be noted that sealing treatment is treatment for protecting a light-emitting element from moisture, and any of a method for mechanically sealing the light-emitting element by a cover material, a method for sealing the light-emitting element with a thermosetting resin or an ultraviolet light curable resin, and a method for sealing the light-emitting element by a thin film having a high barrier property such as a metal oxide film or a metal nitride film is used. As the cover material, glass, ceramics, plastics, or metal can be used, and it is necessary to use a material having a light-transmitting property in the case where light is emitted to the cover material side. The cover material and the substrate over which the light-emitting element is formed are attached to each other with a sealing material such as a thermosetting resin or an ultraviolet curable resin, and the resin is cured by heat treatment or ultraviolet light irradiation treatment to form a sealed space. It is also effective to provide a moisture absorbing material typified by barium oxide in this sealed space. This moisture absorbing material may be provided on and be in contact with the sealing material, or may be provided over or in the periphery of the partition so as not to shield light from the light-emitting element. Further, the space between the cover material and the substrate over which the light-emitting element is formed can be filled with a thermosetting resin or an ultraviolet light curable resin. In this case, it is effective to add a moisture absorbing material typified by barium oxide in the thermosetting resin or the ultraviolet light curable resin.

Figure 12:
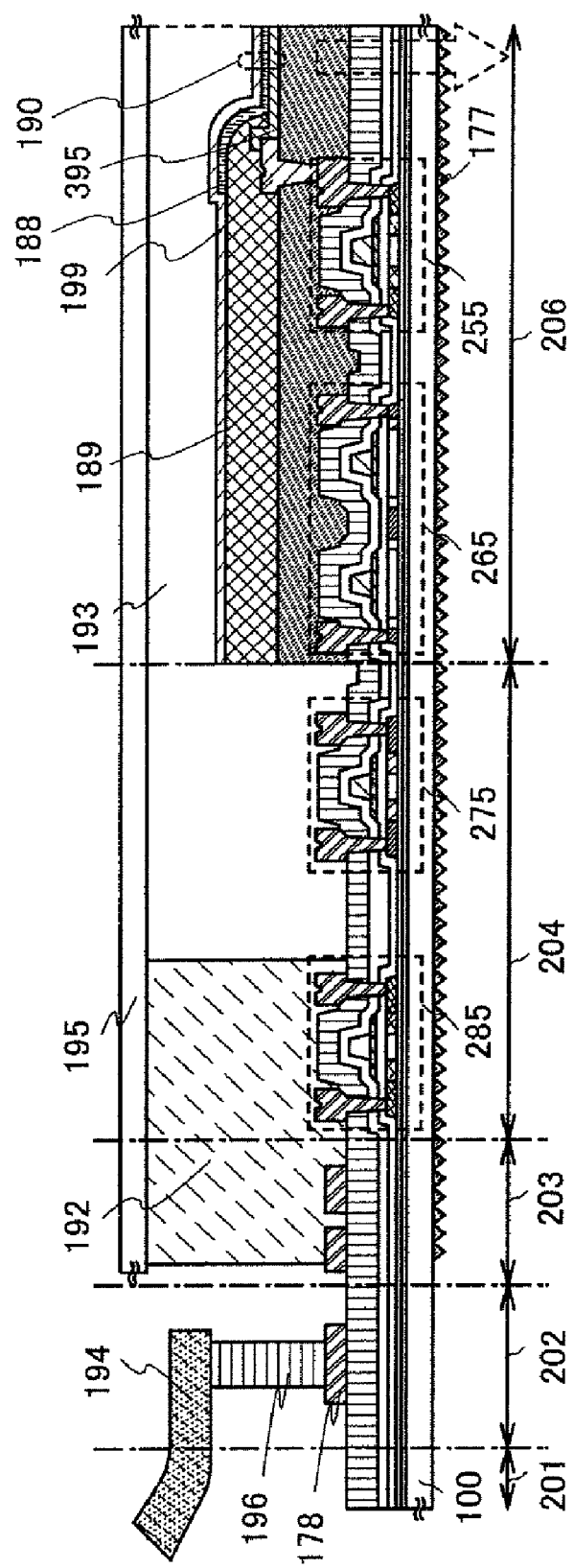
FIG. 12 is a cross-sectional view showing a display device of the present invention.

FIG. 12 shows an example in which the source electrode layer or the drain electrode layer is connected to the first electrode layer through a wiring layer so as to be electrically connected instead of being directly in contact with each other, in the display device of FIGS. 9A and 9B manufactured in this embodiment mode. In the display device shown in FIG. 12, the source electrode layer or the drain electrode layer of the thin film transistor which drives the light-emitting element is electrically connected to a first electrode layer 395 through a wiring layer 199. Moreover, in FIG. 12, the first electrode layer 395 is partially stacked over the wiring layer 199; however, the first electrode layer 395 may be formed first and then the wiring layer 199 may be formed on the first electrode layer 395.

In this embodiment mode, the terminal electrode layer 178 is connected to an FPC 194 with an anisotropic conductive layer 196 interposed therebetween in the external terminal connection region 202, and is electrically connected to an external portion. In addition, as shown in FIG. 15A, which is a top plan view of the display device, the display device manufactured in this embodiment mode includes a peripheral driver circuit region 207 and a peripheral driver circuit region 208 each including a scan line driver circuit in addition to the peripheral driver circuit region 204 and the peripheral driver circuit region 209 each including a signal line driver circuit.

A circuit such as that described above is formed in this embodiment mode; however, the present invention is not limited thereto. An IC chip may be mounted by the aforementioned COG method or TAB method as the peripheral driver circuit. Further, one or a plurality of gate line driver circuits and source line driver circuits may be provided.

In the display device of the present invention, there is no particular limitation on a driving method for image display, and for example, a dot sequential driving method, a line sequential driving method, a frame sequential driving method, or the like may be used. Typically, a line sequential driving method may be used, and a time division gray scale driving method and an area gray scale driving method may be used as appropriate. Further, a video signal which is inputted to the source line of the display device may be an analog signal or a digital signal. The driver circuit and the like may be appropriately designed in accordance with the video signal.

Since each of the display devices shown in FIGS. 9A and 9B and FIG. 12 has a bottom-emission structure, light is emitted through the substrate 100. Therefore, the viewer side is on the substrate 100 side. Thus, a light-transmitting substrate is used as the substrate 100, and pyramidal projections 177 are provided on an outer side that corresponds to the viewer side.

The display device of this embodiment mode is acceptable as long as it has a structure having pyramidal projections which are densely arranged so as to be adjacent to each other. A structure may be employed in which pyramidal projections are formed directly into a surface part of a substrate (film) forming the display screen, as an integrated continuous structure. For example, a surface of a substrate (film) may be processed so that pyramidal projections are formed thereinto, or a shape with pyramidal projections may be selectively formed by a printing method such as nanoimprinting. Alternatively, pyramidal projections may be formed on a substrate (film) in another step.

The plurality of pyramidal projections may be formed as an integrated continuous film, or may be densely arranged on a substrate.

In this embodiment mode, the display device has the plurality of pyramidal projections on the display screen surface provided with an anti-reflection function with which reflection of external light incident on the antireflective film is prevented. In a case where the display screen has a plane with respect to incident light from external (a side parallel to the display screen), external light incident on the antireflective film is reflected to the viewer side. Therefore, the display screen having fewer plane regions has a higher anti-reflection function. In order that external light incident on the antireflective film is further scattered, a plurality of sides each forming an angle with respect to a surface of the display screen is preferably formed on the surface of the display screen.

In the present invention, since the plurality of pyramidal projections are geometrically densely arranged with no space therebetween, a refractive index varies from the display screen surface side to the outside (the air) due to the physical shape of a pyramidal projection. In this embodiment mode, the tops of the plurality of pyramidal projections are arranged so as to be evenly spaced and each side of the base of a pyramidal projection is in contact with one side of the base of an adjacent pyramidal projection. That is, one pyramidal projection is surrounded by other pyramidal projections, and the base of the pyramidal projection and the base of the adjacent pyramidal projection have a side in common.

Thus, since the pyramidal projections are arranged densely so that the tops thereof are evenly spaced, the display screen has a high anti-reflection function with which external light incident on the antireflective film can be efficiently scattered in many directions.

Since a plurality of the pyramidal projections 177 of this embodiment mode are arranged so that the tops thereof are evenly spaced, the cross sectional surfaces of the plurality of the pyramidal projections 177 have the same shape as shown in FIGS. 9A, 9B, and 12. The plurality of the pyramidal projections 177 are arranged so as to be in contact with each other and each side of the base of the pyramidal projection is in contact with one side of the base of the adjacent pyramidal projection. Therefore, in this embodiment mode, the plurality of pyramidal projections are arranged with no space therebetween and cover the display screen surface as shown in FIGS. 9A, 9B, and 12. A plane portion of the display screen surface is not exposed by the plurality of pyramidal projections and incident light from external is incident on sloped surfaces of the plurality of pyramidal projections, so that reflection of incident light from external on the plane portion can be reduced.

In this embodiment mode, the distance between the tops of the plurality of pyramidal projections and the width of the base of the pyramidal projection are preferably equal to or shorter than 350 nm, and the height of each of the plurality of pyramidal projections is preferably equal to or longer than 800 nm. The fill rate of bases of the plurality of pyramidal projections per unit area of the surface of a display screen (the rate of the display screen which is filled (occupied)) is equal to or more than 80%, preferably equal to or more than 90%. A fill rate is a rate of a formation region of pyramidal projections over a display screen surface. When the fill rate is equal to or more than 80%, the rate of plane portions where no pyramidal projection is formed (which is parallel to the display screen) is equal to or less than 20%. The ratio of the height of a pyramidal projection to the width of a base thereof is equal to or more than 5. Under the above-described condition, the rate of light incident from external on the plane portion is reduced and thus reflection with respect to the viewer side can be prevented.

Further, the plurality of pyramidal projections preferably have many more sides having angles with respect to the bases thereof because incident light from external are scattered in many more directions. In this embodiment mode, a pyramidal projection has six sides which are in contact with and at an angle to a base. In addition, since the base of a pyramidal projection shares a vertex with bases of two other pyramidal projections and the pyramidal projection has a plurality of sides which are provided at an angle, incident light is more easily reflected in many directions. Therefore, the more vertices the base of a pyramidal projection has, the more easily an anti-reflection function thereof can be exerted, and the pyramidal projection has six vertices of the base. The pyramidal projections each having a hexagonal pyramidal base of this embodiment mode have shapes capable of being densely arranged with no space therebetween, which are optimal shapes each having the largest number of sides of any pyramidal projection and a high anti-reflection function with which incident light can be scattered efficiently in many directions.

Since the plurality of pyramidal projections 177 of this embodiment mode are arranged so that the tops thereof are evenly spaced, isosceles triangles having the same shapes are adjacent to each other in cross section.

The display device of this embodiment mode has a plurality of pyramidal projections on the surface thereof. Reflected incident light from external is reflected to not the viewer side but another adjacent pyramidal projection because a side surface of each pyramidal projection is not horizontal. Alternatively, reflected incident light propagates between adjacent pyramidal projections. Incident light from external is partly transmitted through a pyramidal projection, and the rest of the incident light from external, which is reflected light, is then incident on an adjacent pyramidal projection. In this manner, the incident light from external which is reflected by a side surface of the pyramidal projection repeats incidence on adjacent pyramidal projections.

That is, the number of times that incident light from external is incident on the pyramidal projections, of the incident light from external which is incident on the display device, is increased; therefore, the amount of light transmitted through the pyramidal projections is increased. Thus, the amount of light from external reflected to the viewer side is reduced, and the cause of a reduction in visibility such as reflection can be prevented.

This embodiment mode can provide a high-visibility display device having an antireflection function with which reflection of incident light from external can be further reduced by being provided with a plurality of pyramidal projections on their surface. Accordingly, a more high-quality and high-performance display device can be manufactured.

This embodiment mode can be freely combined with Embodiment Mode 1.

Embodiment Mode 6

By applying the present invention, a display device having a light-emitting element can be formed. Note that light is emitted from the light-emitting element in the following manner: bottom emission, top emission, or dual emission. In this embodiment mode, examples of dual emission and top emission are described with reference to FIGS. 10 and 11.

Figure 11:
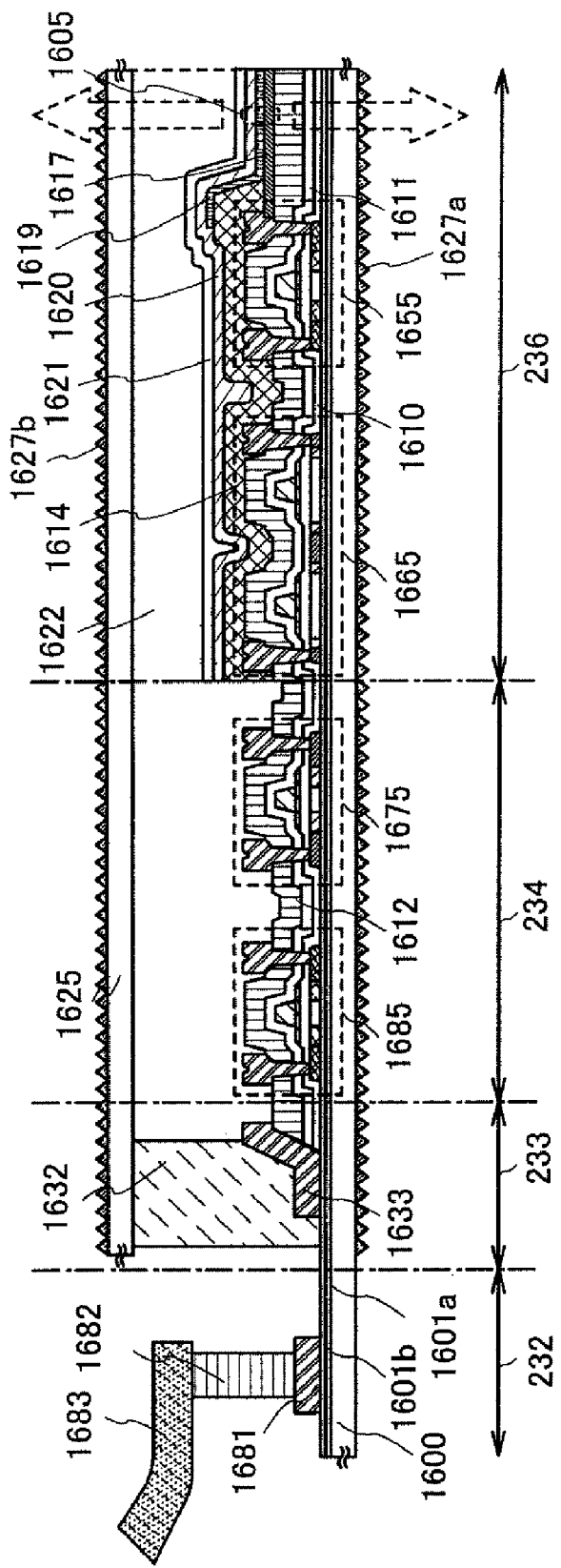
FIG. 11 is a cross-sectional view showing a display device of the present invention.

A display device shown in FIG. 11 includes an element substrate 1600, a thin film transistor 1655, a thin film transistor 1665, a thin film transistor 1675, a thin film transistor 1685, a first electrode layer 1617, an electroluminescent layer 1619, a second electrode layer 1620, a filler 1622, a sealing material 1632, an insulating film 1601a, an insulating film 1601b, a gate insulating layer 1610, an insulating film 1611, an insulating film 1612, an insulating layer 1614, a sealing substrate 1625, a wiring layer 1633, a terminal electrode layer 1681, an anisotropic conductive layer 1682, an FPC 1683, and pyramidal projections 1627a and 1627b. The display device also includes an external terminal connection region 232, a sealing region 233, a peripheral driver circuit region 234, and a pixel region 236. The filler 1622 can be formed by a dropping method using a composition in a liquid state. A light-emitting display device is sealed by attaching the element substrate 1600 provided with the filler by a dropping method and the sealing substrate 1625 to each other.

The display device shown in FIG. 11 has a dual-emission structure, in which light is emitted through both the element substrate 1600 and the sealing substrate 1625 in directions of arrows. Therefore, light-transmitting electrode layers are used as the first electrode layer 1617 and the second electrode layer 1620.

In this embodiment mode, the first electrode layer 1617 and the second electrode layer 1620 which are light-transmitting electrode layers may be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. It is needless to say that indium tin oxide (ITO), indium zinc oxide (IZO), indium tin oxide added with silicon oxide (ITSO), or the like may be used instead.

In addition, even in the case of a material that does not have a light-transmitting property, such as a metal film, when the thickness is made thin (preferably, approximately 5 to 30 nm) so that light can be transmitted, light can be emitted through the first electrode layer 1617 and the second electrode layer 1620. As a metal thin film that can be used for the first electrode layer 1617 and the second electrode layer 1620, a conductive film formed of titanium, tungsten, nickel, gold, platinum, silver, aluminum, magnesium, calcium, lithium, or alloy thereof, or the like can be used.

As described above, the display device of FIG. 11 has a structure in which light emitted from a light-emitting element 1605 is emitted from both sides through both the first electrode layer 1617 and the second electrode layer 1620.

Figure 10:
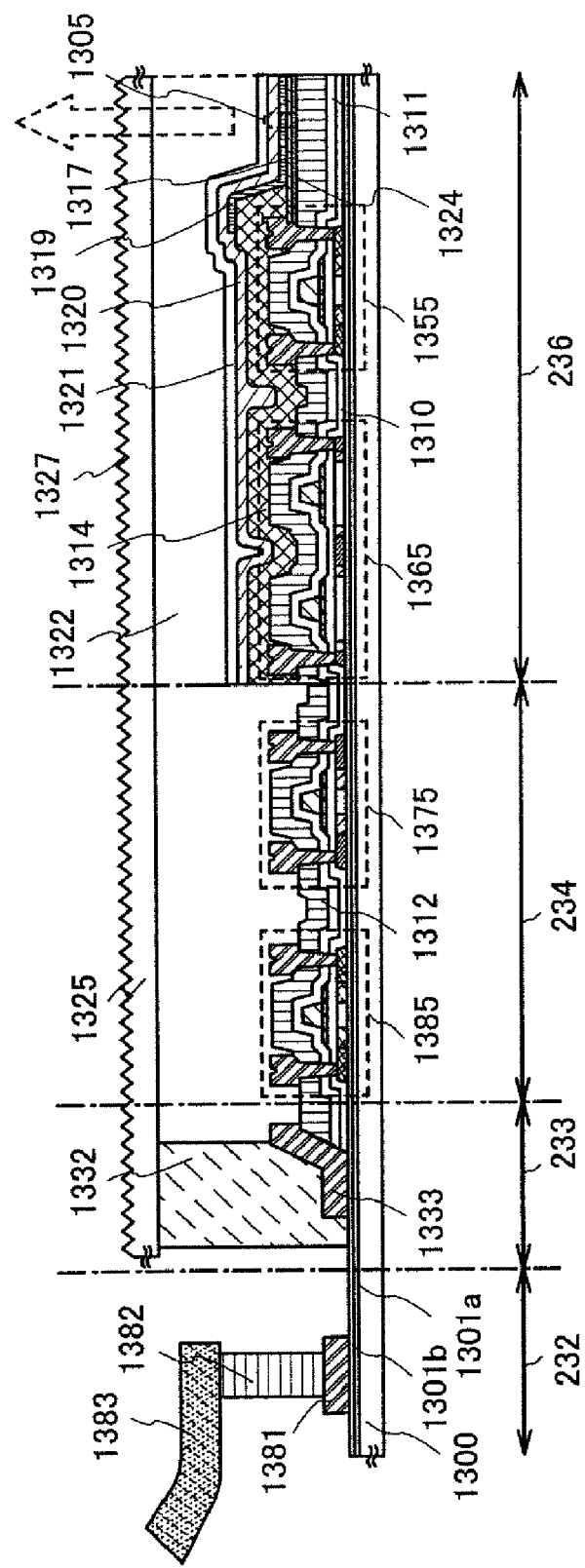
FIG. 10 is a cross-sectional view showing a display device of the present invention.

A display device of FIG. 10 has a structure for top emission in a direction of an arrow. The display device shown in FIG. 10 includes an element substrate 1300, a thin film transistor 1355, a thin film transistor 1365, a thin film transistor 1375, a thin film transistor 1385, a wiring layer 1324, a first electrode layer 1317, an electroluminescent layer 1319, a second electrode layer 1320, a protective film 1321, a filler 1322, a sealing material 1332, an insulating film 1301a, an insulating film 1301b, a gate insulating layer 1310, an insulating film 1311, an insulating film 1312, an insulating layer 1314, a sealing substrate 1325, a wiring layer 1333, a terminal electrode layer 1381, an anisotropic conductive layer 1382, and an FPC 1383.

In each of the display devices in FIGS. 10 and 11, an insulating layer stacked over the terminal electrode layer is removed by etching. When the display device has a structure in which an insulating layer having moisture permeability is not provided in the vicinity of a terminal electrode layer, reliability is improved. The display device of FIG. 10 includes an external terminal connection region 232, a sealing region 233, a peripheral driver circuit region 234, and a pixel region 236. In the display device of FIG. 10, the wiring layer 1324 that is a metal layer having reflectivity is formed below the first electrode layer 1317 in the display device having a dual emission structure shown in FIG. 1. The first electrode layer 1317 that is a transparent conductive film is formed over the wiring layer 1324. Since it is acceptable as long as the wiring layer 1324 has reflectivity, the wiring layer 1324 may be formed using a conductive film made of titanium, tungsten, nickel, gold, platinum, silver, copper, tantalum, molybdenum, aluminum, magnesium, calcium, lithium, or an alloy thereof. It is preferable to use a substance having reflectivity in a visible light range, and a titanium nitride film is used in this embodiment mode. In addition, the first electrode layer 1317 may be formed using a conductive film, and in that case, the wiring layer 1324 having reflectivity may be omitted.

The first electrode layer 1317 and the second electrode layer 1320 may be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. It is needless to say that indium tin oxide (ITO), indium zinc oxide (IZO), indium tin oxide added with silicon oxide (ITSO), or the like may be used instead.

Even in the case of a material that does not have a light-transmitting property, such as a metal film, when the thickness is made thin preferably, approximately 5 to 30 nm) so that light can be transmitted, light can be emitted through the second electrode layer 1320. As a metal thin film that can be used for the second electrode layer 1320, a conductive film formed of titanium, tungsten, nickel, gold, platinum, silver, aluminum, magnesium, calcium, lithium, or an alloy thereof, or the like can be used.

A pixel of a display device which is formed using a light-emitting element can be driven by a simple matrix mode or an active matrix mode. In addition, either digital driving or analog driving can be applied.

A color filter (colored layer) may be formed over a sealing substrate. The color filter (colored layer) can be formed by an evaporation method or a droplet discharging method. High-definition display can be performed with the use of the color filter (colored layer). This is because a broad peak can be modified to be sharp in an emission spectrum of each of R, G, and B by the color filter (colored layer).

A material emitting light of a single color is formed and it is combined with a color filter or a color conversion layer, so that full color display can be performed. The color filter (colored layer) or the color conversion layer may be formed over, for example, the sealing substrate and attached to an element substrate.

It is needless to say that display of a single color emission may be performed. For example, an area color type display device may be formed using single color emission. The area color type display device is suitable for a passive matrix display portion and can mainly display characters and symbols.

Since the display device shown in FIG. 11 has a dual-emission structure, light is emitted through both the element substrate 1600 and the sealing substrate 1625. Therefore, the viewer side is on each of the element substrate 1600 side and the sealing substrate 1625 side. Thus, a light-transmitting substrate is used as each of the element substrate 1600 and the sealing substrate 1625, and the pyramidal projections 1627a and 627b are provided on respective outer sides that correspond to viewer sides. On the other hand, since the display device shown in FIG. 10 has a top-emission structure, the sealing substrate 1325 on the viewer side is a light-transmitting substrate. Pyramidal projections 1327 are provided on an outer side thereof.

The display device of this embodiment mode is acceptable as long as it has a structure having pyramidal projections which are densely arranged so as to be adjacent to each other. A structure may be employed in which pyramidal projections are formed directly into a surface part of a substrate (film) forming the display screen, as an integrated continuous structure. For example, a surface of a substrate (film) may be processed so that pyramidal projections are formed thereinto, or a shape with pyramidal projections may be selectively formed by a printing method such as nanoimprinting. Alternatively, pyramidal projections may be formed on a substrate (film) in another step.

The plurality of pyramidal projections may be formed as an integrated continuous film, or may be densely arranged on a substrate. Alternatively, pyramidal projections may be formed into a substrate in advance. FIG. 10 is an example in which a plurality of pyramidal projections 1327 are provided on a surface of a substrate 1325 as an integrated continuous structure.

In this embodiment mode, the display device has the plurality of pyramidal projections on the display screen surface provided with an anti-reflection function with which reflection of incident light from external is prevented. In a case where the display screen has a plane with respect to incident light from external (a side parallel to the display screen), incident light from external are reflected to the viewer side. Therefore, the display screen having fewer plane regions has a higher anti-reflection function. In order that incident light from external are further scattered, a plurality of sides each forming an angle with respect to a surface of the display screen is preferably formed on the surface of the display screen.

In the present invention, since the plurality of pyramidal projections are geometrically densely arranged with no space therebetween, a refractive index varies from the display screen surface side to the outside (the air) due to the physical shape of a pyramidal projection. In this embodiment mode, the tops of the plurality of pyramidal projections are arranged so as to be evenly spaced and each side of the base of a pyramidal projection is in contact with one side of the base of an adjacent pyramidal projection. That is, one pyramidal projection is surrounded by other pyramidal projections, and the base of the pyramidal projection and the base of the adjacent pyramidal projection have a side in common.

Thus, since the pyramidal projections are arranged densely so that the tops thereof are evenly spaced, the display screen has a high anti-reflection function with which incident light from external can be efficiently scattered in many directions.

Since a plurality of the pyramidal projections 1327, 1627a, and 1627b of this embodiment mode are arranged so that the tops thereof are evenly spaced, the cross sectional surfaces of the plurality of the pyramidal projections 1327, 1627a, and 1627b have the same shape as shown in FIGS. 10 and 11. The plurality of the pyramidal projections 1327, 1627a, and 1627b are arranged so as to be in contact with each other and each side of the base of the pyramidal projection is in contact with one side of the base of the adjacent pyramidal projection. Therefore, in this embodiment mode, the plurality of pyramidal projections are arranged with no space therebetween and cover the display screen surface as shown in FIGS. 10 and 11. A plane portion of the display screen surface is not exposed by the plurality of pyramidal projections and incident light from external is incident on sloped surfaces of the plurality of pyramidal projections, so that reflection of incident light from external on the plane portion can be reduced.

In this embodiment mode, the distance between the tops of the plurality of pyramidal projections and the width of the base of the pyramidal projection are preferably equal to or shorter than 350 nm, and the height of each of the plurality of pyramidal projections is preferably equal to or longer than 800 nm. The fill rate of bases of the plurality of pyramidal projections per unit area of the surface of a display screen (the rate of the display screen which is filled (occupied)) is equal to or more than 80%, preferably equal to or more than 90%. A fill rate is a rate of a formation region of pyramidal projections over a display screen surface. When the fill rate is equal to or more than 80%, the rate of plane portions where no pyramidal projection is formed (which is parallel to the display screen) is equal to or less than 20%. The ratio of the height of a pyramidal projection to the width of a base thereof is equal to or more than 5. Under the above-described condition, the rate of light incident from external on the plane portion is reduced and thus reflection with respect to the viewer side can be prevented.

Further, the plurality of pyramidal projections preferably have many more sides having angles with respect to the bases thereof because incident light from external are scattered in many more directions. In this embodiment mode, a pyramidal projection has six sides which are in contact with and at an angle to a base. In addition, since the base of a pyramidal projection shares a vertex with bases of two other pyramidal projections and the pyramidal projection has a plurality of sides which are provided at an angle, incident light is more easily reflected in many directions. Therefore, the more vertices the base of a pyramidal projection has, the more easily an anti-reflection function thereof can be exerted, and the pyramidal projection has six vertices of the base. The pyramidal projections each having a hexagonal pyramidal base of this embodiment mode have shapes capable of being densely arranged with no space therebetween, which are optimal shapes each having the largest number of sides of any pyramidal projection and a high anti-reflection function with which incident light can be scattered efficiently in many directions.

Since the plurality of pyramidal projections 1327, 1627a, and 1627b of this embodiment mode are arranged so that the tops thereof are evenly spaced, isosceles triangles having the same shapes are adjacent to each other in cross section.

The display device of this embodiment mode has a plurality of pyramidal projections on the surface thereof. Reflected incident light from external is reflected to not the viewer side but another adjacent pyramidal projection because a side surface of each pyramidal projection is not horizontal. Alternatively, reflected incident light propagates between adjacent pyramidal projections. Incident light from external is partly transmitted through a pyramidal projection, and the rest of the incident light from external, which is reflected light, is then incident on an adjacent pyramidal projection. In this manner, the incident light from external which is reflected by a side surface of the pyramidal projection repeats incidence on adjacent pyramidal projections.

That is, the number of times that incident light from external is incident on the pyramidal projections, of the incident light from external which is incident on the display device, is increased; therefore, the amount of light transmitted through the pyramidal projections is increased. Thus, the amount of light from external reflected to the viewer side is reduced, and the cause of a reduction in visibility such as reflection can be prevented.

This embodiment mode can provide a high-visibility display device having an anti-reflection function with which reflection of incident light from external can be further reduced by being provided with a plurality of pyramidal projections on their surface. Accordingly, a more high-quality and high-performance display device can be manufactured.

This embodiment mode can be freely combined with Embodiment Mode 1

Embodiment Mode 7

In this embodiment mode, an example of a display device having an anti-reflection function with which reflection of incident light from external can be further reduced, for the purpose of providing excellent visibility, is described. Specifically, a light-emitting display device using a light-emitting element as a display element is described.

In this embodiment mode, a structure of a light-emitting element applicable to a display element of the display device of the present invention is described with reference to FIGS. 22A to 22D.

FIGS. 22A to 22D each show an element structure of a light-emitting element. In the light-emitting element, an electroluminescent layer 860 in which an organic compound and an inorganic compound are mixed is interposed between a first electrode layer 870 and a second electrode layer 850. The electroluminescent layer 860 includes a first layer 804, a second layer 803, and a third layer 802 as shown, and in particular, the first layer 804 and the third layer 802 are highly characteristic.

First, the first layer 804 is a layer which has a function of transporting holes to the second layer 803, and includes at least a first organic compound and a first inorganic compound showing an electron-accepting property with respect to the first organic compound. It is important that the first organic compound and the first inorganic compound are not simply mixed but the first inorganic compound has an electron-accepting property with respect to the first organic compound. With this structure, many hole-carriers are generated in the first organic compound having originally almost no inherent carriers, and a hole-injecting property and hole-transporting property which are extremely excellent are obtained.

Therefore, as for the first layer 804, not only an advantageous effect that is considered to be obtained by mixing an organic compound and an inorganic compound (such as improvement in heat resistance) but also excellent conductivity (in particular, a hole-injecting property and a hole-transporting property in the first layer 804) can be obtained. This excellent conductivity is an advantageous effect which cannot be obtained in a conventional hole-transporting layer in which an organic compound and an inorganic compound that do not electronically interact with each other are simply mixed. This advantageous effect can make a driving voltage lower than the conventional case. In addition, since the first layer 804 can be made thick without causing a rise in driving voltage, short circuit of the element due to dusts or the like can be suppressed.

It is preferable to use a hole-transporting organic compound as the first organic compound because hole carriers are generated in the first organic compound as described above. The hole-transporting organic compound includes, for example, phthalocyanine (abbreviation: $H_2Pc$), copper phthalocyanine (abbreviation: CuPc), vanadyl phthalocyanine (abbreviation: VOPc), 4,4',4''-tris(N,N-diphenylamino) triphenylamine (abbreviation: TDATA), 4,4',4''-tris[N-(3-methylphenyl)-N-phenylamino]triphenylamine (abbreviation: MTDATA), 1,3,5-tris[N,N-di(m-tolyl)amino] benzene (abbreviation: m-MTDAB), N,N'-diphenyl-N,N'-bis (3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis{N-[4-di(m-tolyl)amino]phenyl-N-phenylamino}biphenyl (abbreviation: DNTPD), 4,4', 4''-tris(N-carbazolyl)triphenylamine (abbreviation: TCTA), and the like. However, the present invention is not limited thereto. Among the compounds described above, aromatic amine compounds typified by TDATA, MTDATA, m-MTDAB, TPD, NPB, DNTPD, and TCTA can easily generate hole carriers and are suitable compound groups for the first organic compound.

On the other hand, the first inorganic compound may be any material as long as the material can easily accept electrons from the first organic compound, and various kinds of metal oxides and metal nitrides may be used. Oxides of any of transition metals that belong to Groups 4 to 12 of the periodic table is preferable because an electron-accepting property is easily provided. Specifically, titanium oxide, zirconium oxide, vanadium oxide, molybdenum oxide, tungsten oxide, rhenium oxide, ruthenium oxide, zinc oxide, and the like can be given. Among the metal oxides described above, oxides of any of transition metals that belong to Groups 4 to 8 of the periodic table mostly has a high electron-accepting property and is a preferable group. In particular, vanadium oxide, molybdenum oxide, tungsten oxide, and rhenium oxide are preferable because they can be treated by vacuum evaporation and can be easily used.

It is to be noted that the first layer 804 may be formed by stacking of a plurality of layers each containing a combination of the organic compound and the inorganic compound described above, or may further contain another organic compound or inorganic compound.

Next, the third layer 802 is described. The third layer 802 is a layer having a function of transporting electrons to the second layer 803 and includes at least a third organic compound and a third inorganic compound showing an electron-donating property to the third organic compound. It is important that the third organic compound and the third inorganic compound are not simply mixed but the third inorganic compound has an electron-donating property with respect to the third organic compound. With this structure, many electron-carriers are generated in the third organic compound which has originally almost no inherent carriers, and an electron-injecting and an electron-transporting property which are highly excellent can be obtained.

Therefore, as for the third layer 802, not only an advantageous effect that is considered to be obtained by mixing an organic compound and an inorganic compound (such as improvement in heat resistance) but also excellent conductivity (in particular, a hole-injecting property and a hole-transporting property in the third layer 802) can be obtained. This excellent conductivity is an advantageous effect which cannot be obtained in a conventional hole-transporting layer in which an organic compound and an inorganic compound that do not electronically interact with each other are simply mixed. This advantageous effect can make a driving voltage lower than the conventional case. In addition, since the third layer 802 can be made thick without causing a rise in driving voltage, short circuit of the element due to dusts or the like can be suppressed.

It is preferable to use an electron-transporting organic compound as the third organic compound because electron carriers are generated in the third organic compound as described above. The electron-transporting organic compound includes, for example, tris(8-quinolinolato)aluminum (abbreviation: $Alq_3$), tris(4-methyl-8-quinolinolato)aluminum (abbreviation: Almq₃), bis(10-hydroxybenzo[h]-quinolinato)beryllium (abbreviation: BeBq₂), bis(2-methyl-8-quinolinolato)(4-phenylphenolato)aluminum (abbreviation: BAlq), bis[2-(2'-hydroxyphenyl)benzoxazolato]zinc (abbreviation: Zn(BOX)₂), bis[2-(2'-hydroxyphenyl)benzothiazolato]zinc (abbreviation: Zn(BTZ)₂), bathophenanthroline (abbreviation: BPhen), bathocuproin (abbreviation: BCP), 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 2,2',2''-(1,3,5-benzenetriyl)-tris(1-phenyl-1H-benzimidazole) (abbreviation: TPBI), 3-(4-biphenylyl)-4-phenyl-5-(4-tert-butylphenyl)-1,2,4-triazole (abbreviation: TAZ), 3-(4-biphenylyl)-4-(4-ethylphenyl)-5-(4-tert-butylphenyl)-1,2,4-triazole (abbreviation: p-EtTAZ), and the like. However, the present invention is not limited thereto. Among the compounds mentioned above, chelate metal complexes each having a chelate ligand including an aromatic ring typified by Alq₃, Almq₃, BeBq₂, BAlq, Zn(BOX)₂, and Zn(BTZ)₂, organic compounds having a phenanthroline skeleton typified by BPhen and BCP, and organic compounds having an oxadiazole skeleton typified by PBD and OXD-7 can easily generate electron carriers and are suitable compound groups for the third organic compound.

On the other hand, the third inorganic compound may be any material as long as the material can easily donate electrons to the third organic compound, and various kinds of metal oxide and metal nitride can be used. Alkali metal oxide, alkaline-earth metal oxide, rare-earth metal oxide, alkali metal nitride, alkaline-earth metal nitride, and rare-earth metal nitride are preferable because an electron-donating property is easily provided. Specifically, for example, lithium oxide, strontium oxide, barium oxide, erbium oxide, lithium nitride, magnesium nitride, calcium nitride, yttrium nitride, lanthanum nitride, and the like can be given. In particular, lithium oxide, barium oxide, lithium nitride, magnesium nitride, and calcium nitride are preferable because they can be treated by vacuum evaporation and can be easily used.

It is to be noted that the third layer 802 may be formed by stacking of a plurality of layers each containing a combination of the organic compound and the inorganic compound described above, or may further contain another organic compound or inorganic compound.

Then, the second layer 803 is described. The second layer 803 is a layer having a function of emitting light and includes a second organic compound having a light-emitting property. The second layer 803 may include a second inorganic compound. The second layer 803 may be formed using various light-emitting organic compounds and inorganic compounds. However, since it is considered that a current does not easily flows through the second layer 803 as compared to through the first layer 804 or the third layer 802, the thickness of the second layer 803 is preferably approximately 10 to 100 nm.

There are no particular limitations on the second organic compound as long as it is a light-emitting organic compound. The second organic compound includes, for example, 9,10-di(2-naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthene, 2,5,8,11-tetra(tert-butyl)perylene (abbreviation: TBP), 9,10-diphenylanthracene (abbreviation: DPA), 5,12-diphenyltetracene, 4-(dicyanomethylene)-2-methyl-[p-(dimethylamino)styryl]-4H-pyran (abbreviation: DCM1), 4-(dicyanomethylene)-2-methyl-6-[2-(julolidin-9-yl)ethenyl]-4H-pyran (abbreviation: DCM2), 4-(dicyanomethylene)-2,6-bis[p-(dimethylamino)styryl]-4H-pyran (abbreviation: BisDCM), and the like. Alternatively, a compound capable of emitting phosphorescence such as bis[2-(4',6'-difluorophenyl)pyridinato-N,C²']iridium (picolinate) (abbreviation: FIrpic), bis{2-[3',5'-bis(trifluoromethyl)phenyl]pyridinato-N,C²'}iridium(picolinate) (abbreviation: Ir(CF₃ ppy)₂(pic)), tris(2-phenylpyridinato-N,C²')iridium (abbreviation: Ir(ppy)₃), bis(2-phenylpyridinato-N,C²')iridium(acetylacetonate) (abbreviation: Ir(ppy)₂(acac)), bis[2-(2'-thienyl)pyridinato-N,C³']iridium (acetylacetonate) (abbreviation: Ir(thp)₂(acac)), bis(2-phenylquinolinato-N,C²')iridium(acetylacetonate) (abbreviation: Ir(pq)₂(acac)), or bis[2-(2'-benzothienyl pyridinato-N,C³']iridium(acetylacetonate) (abbreviation: Ir(btp)₂(acac)) may be used.

Further, a triplet excitation light-emitting material containing a metal complex or the like may be used for the second layer 803 in addition to a singlet excitation light-emitting material. For example, among pixels emitting light of red, green, and blue, the pixel emitting light of red whose luminance is reduced by half in a relatively short time is formed using a triplet excitation light-emitting material and the other pixels are formed using a singlet excitation light-emitting material. A triplet excitation light-emitting material has a feature that light-emitting efficiency is favorable so that less power is consumed to obtain the same luminance. In other words, when a triplet excitation light-emitting material is used for the pixel emitting light of red, only a small amount of current is necessarily applied to a light-emitting element; thus, reliability can be improved. The pixel emitting light of red and the pixel emitting light of green may be formed using a triplet excitation light-emitting material and the pixel emitting light of blue may be formed using a singlet excitation light-emitting material in order to achieve low power consumption. Low power consumption can be further achieved by formation of a light-emitting element emitting light of green that has high visibility for a human eye with the use of a triplet excitation light-emitting material.

The second layer 803 may be added with not only the second organic compound described above, which emits light, but also another organic compound. An organic compound that can be added includes, for example, TDATA, MTDATA, m-MTDAB, TPD, NPB, DNTPD, TCTA, Alq₃, Almq₃, BeBq₂, BAlq, Zn(BOX)₂, Zn(BTZ)₂, BPhen, BCP, PBD, OXD-7, TPBI, TAZ, p-EtTAZ, DNA, t-BuDNA, and DPVBi, which are mentioned above, and 4,4'-bis(N-carbazolyl)biphenyl (abbreviation: CBP), 1,3,5-tris[4-(N-carbazolyl)phenyl]benzene (abbreviation: TCPB), and the like. However, the present invention is not limited thereto. It is preferable that the organic compound which is added in addition to the second organic compound have larger excitation energy than the second organic compound and be added by larger amount than the second organic compound, in order to make the second organic compound emit light efficiently (which makes it possible to prevent concentration quenching of the second organic compound). Alternatively, as another function, the added organic compound may emit light along with the second organic compound (which makes it possible to emit white light or the like).

The second layer 803 may have a structure where color display is performed by formation of a light-emitting layer having a different emission wavelength range for each pixel. Typically, a light-emitting layer corresponding to each of R (red), G (green), and B (blue) is formed. Also in this case, color purity can be improved and a pixel portion can be prevented from having a mirror surface (reflecting) by provision of a filter which transmits light of the emission wavelength range on the light-emission side of the pixel. By provision of the filter, a circularly polarizing plate or the like that has been considered to be necessary can be omitted, and further, the loss of light emitted from the light-emitting layer can be eliminated. Further, change in color tone, which occurs when a pixel portion (display screen) is obliquely seen, can be reduced.

Either a low-molecular organic light-emitting material or a high-molecular organic light-emitting material may be used for a material of the second layer 803. A high-molecular organic light-emitting material has higher physical strength and higher durability of the element than a low-molecular material. In addition, since a high-molecular organic light-emitting material can be formed by coating, the element can be relatively easily formed.

The emission color is determined depending on a material forming the light-emitting layer; therefore, a light-emitting element which emits desired light can be formed by selecting an appropriate material for the light-emitting layer. As a high-molecular electroluminescent material which can be used for forming a light-emitting layer; a polyparaphenylene-vinylene-based material, a polyparaphenylene-based material, a polythiophene-based material, a polyfluorene-based material, and the like can be given.

As the polyparaphenylene-vinylene-based material, a derivative of poly(paraphenylenevinylene) [PPV] such as poly(2,5-dialkoxy-1,4-phenylenevinylene) [RO-PPV], poly (2-(2'-ethyl-hexoxy)-5-methoxy-1,4-phenylenevinylene) [MEH-PPV], or poly(2-(dialkoxyphenyl)-1,4-phenylenevinylene) [ROPh-PPV] can be given. As the polyparaphenylene-based material, a derivative of polyparaphenylene [PPP] such as poly(2,5-dialkoxy-1,4-phenylene) [RO-PPP] or poly(2,5-dihexoxy-1,4-phenylene) can be given. As the polythiophene-based material, a derivative of polythiophene [PT] such as poly(3-alkylthiophene) [PAT], poly(3-hexylthiophen) [PHT], poly(3-cyclohexylthiophen) [PCHT], poly (3-cyclohexyl-4-methylthiophene) [PCHMT], poly(3,4-dicyclohexylthiophene) [PDCHT], poly[3-(4-octylphenyl)-thiophene] [POPT], or poly[3-(4-octylphenyl)-2, 2bithiophene] [PTOPT] can be given. As the polyfluorene-based material, a derivative of polyfluorene [PF] such as poly(9,9-dialkylfluorene) [PDAF] or poly(9,9-dioctylfluorene) [PDOF] can be given.

The second inorganic compound may be any inorganic compound as long as light emission of the second organic compound is not easily quenched by the inorganic compound, and various kinds of metal oxide and metal nitride may be used. In particular, a metal oxide having a metal that belongs to Group 13 or 14 of the periodic table is preferable because light emission of the second organic compound is not easily quenched, and specifically, aluminum oxide, gallium oxide, silicon oxide, and germanium oxide are preferable. However, the second inorganic compound is not limited thereto.

It is to be noted that the second layer 803 may be formed by stacking of a plurality of layers each containing a combination of the organic compound and the inorganic compound, which are described above, or may further include another organic compound or inorganic compound. A layer structure of the light-emitting layer can be changed, and a dedicated electrode layer may be provided or a light-emitting material may be dispersed, instead of provision of no specific electron-injecting region or light-emitting region. Such a change can be permitted unless it departs from the spirit of the present invention.

A light-emitting element formed using the above materials emits light by being forwardly biased. A pixel of a display device which is formed using a light-emitting element can be driven by a simple matrix mode or an active matrix mode. In any case, each pixel emits light by application of forward bias thereto at a specific timing; however, the pixel is in a non-emitting state for a certain period. Reliability of a light-emitting element can be improved by application of reverse bias in the non-emitting time. In a light-emitting element, there is a deterioration mode in which emission intensity is decreased under a constant driving condition or a deterioration mode in which a non-light-emitting region is increased in the pixel and luminance is apparently decreased. However, progression of deterioration can be slowed down by performing of alternating driving where bias is applied forwardly and reversely; thus, reliability of a light-emitting display device can be improved. In addition, either digital driving or analog driving can be applied.

A color filter (colored layer) may be formed over a sealing substrate. The color filter (colored layer) can be formed by an evaporation method or a droplet discharging method. High-definition display can be performed with the use of the color filter (colored layer). This is because a broad peak can be modified to be sharp in an emission spectrum of each of R, G, and B by the color filter (colored layer).

A material emitting light of a single color is formed and it is combined with a color filter or a color conversion layer, so that full color display can be performed. The color filter (colored layer) or the color conversion layer may be formed over, for example, the seating substrate and attached to an element substrate.

It is needless to say that display of a single color emission may be performed. For example, an area color type display device may be formed using single color emission. The area color type display device is suitable for a passive matrix display portion and can mainly display characters and symbols.

Figure 22A:
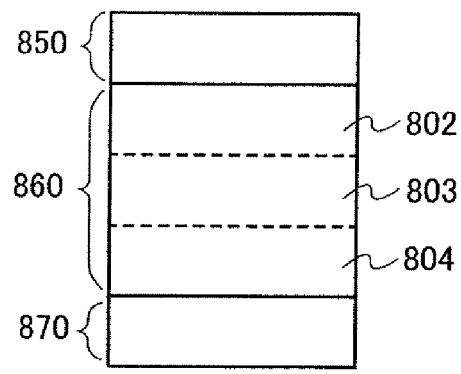
FIGS. 22A to 22D are cross-sectional views each showing a structure of a light-emitting element applicable to the present invention.
Figure 22B:
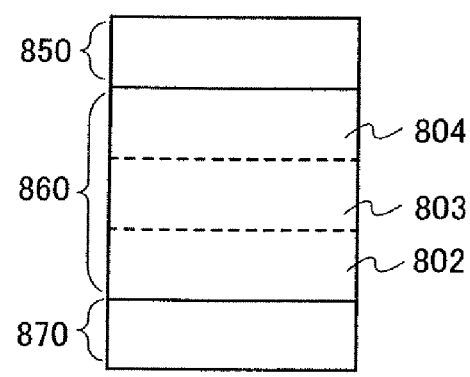

Materials for the first electrode layer 870 and the second electrode layer 850 are necessary to be selected considering the work function. The first electrode layer 870 and the second electrode layer 850 can be either an anode or a cathode depending on the pixel structure. In a case where the polarity of a driving thin film transistor is a p-channel type, the first electrode layer 870 preferably serves as an anode and the second electrode layer 850 preferably serves as a cathode as shown in FIG. 22A. In the case where the polarity of the driving thin film transistor is an n-channel type, the first electrode layer 870 preferably serves as a cathode and the second electrode layer 850 preferably serves as an anode as shown in FIG. 22B. Materials that can be used for the first electrode layer 870 and the second electrode layer 850 are described below. It is preferable to use a material having a high work function (specifically, a material having a work function of 4.5 eV or more) for one of the first electrode layer 870 and the second electrode layer 850, which serves as an anode, and a material having a low work function (specifically, a material having a work function of 3.5 eV or less) for the other electrode layer which serves as a cathode. However, since the first layer 804 is superior in a hole-injecting property and a hole-transporting property and the third layer 802 is superior in an electron-injecting property and an electron transporting property, both the first electrode layer 870 and the second electrode layer 850 are scarcely restricted by a work function and various materials can be used.

The light-emitting elements in FIGS. 22A and 22B each have a structure where light is extracted from the first electrode layer 870 and thus, the second electrode layer 850 is not necessary to have a light-transmitting property. The second electrode layer 850 may be formed from a film mainly containing an element selected from Ti, Ni, W, Cr, Pt, Zn, Sn, In, Ta, Al, Cu, Au, Ag, Mg, Ca, Li and Mo, or an alloy material or a compound material containing the above element as its main component, such as titanium nitride, $TiSi_xN_y$, $WSi_x$, tungsten nitride, $WSi_xN_y$, or NbN; or a stacked film thereof with a total thickness of 100 to 800 nm.

The second electrode layer 850 can be formed by an evaporation method, a sputtering method, a CVD method, a printing method, a dispenser method, a droplet discharging method, or the like.

In addition, when the second electrode layer 850 is formed using a light-transmitting conductive material similarly to the material used for the first electrode layer 870, light can be extracted from the second electrode layer 850 as well, and a dual emission structure can be obtained, in which light emitted from the light-emitting element is emitted from both the first electrode layer 870 and the second electrode layer 850.

It is to be noted that the light-emitting element of the present invention can have variations by changing of types of the first electrode layer 870 and the second electrode layer 850.

FIG. 22B shows the case where the electroluminescent layer 860 is formed by stacking of the third layer 802, the second layer 803, and the first layer 804 in this order on the first electrode layer 870 side.

As described above, in the light-emitting element of the present invention, the layer interposed between the first electrode layer 870 and the second electrode layer 850 is formed of the electroluminescent layer 860 including a layer in which an organic compound and an inorganic compound are combined. The light-emitting element is an organic-inorganic composite light-emitting element provided with layers (that is, the first layer 804 and the third layer 802) that provide functions of a high carrier-injecting property and carrier-transporting property by mixing of an organic compound and an inorganic compound. Such functions as high carrier-injecting property and carrier-transporting property cannot be obtained from only either one of the organic compound or the inorganic compound. In addition, the first layer 804 and the third layer 802 are particularly necessary to be layers in which an organic compound and an inorganic compound are combined when provided on the first electrode layer 870 side, and may contain only one of an organic compound and an inorganic compound when provided on the second electrode layer 850 side.

Further, known various methods can be used as a method for forming the electroluminescent layer 860, which is a layer in which an organic compound and an inorganic compound are mixed. For example, the methods include a co-evaporation method for vaporizing both an organic compound and an inorganic compound by resistance heating. Alternatively, for co-evaporation, an inorganic compound may be vaporized by an electron beam (EB) while an organic compound is vaporized by resistance heating. Further alternatively, a method for sputtering an inorganic compound while vaporizing an organic compound by resistance heating to deposit the both at the same time. Instead, the electroluminescent layer 860 may be formed by a wet method.

In the same manner, for the first electrode layer 870 and the second electrode layer 850, an evaporation method by resistance heating, an EB evaporation method, a sputtering method, a wet method, or the like can be used.

Figure 22C:
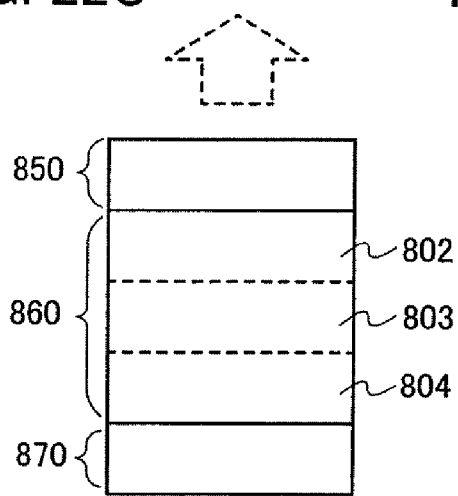
Figure 22D:
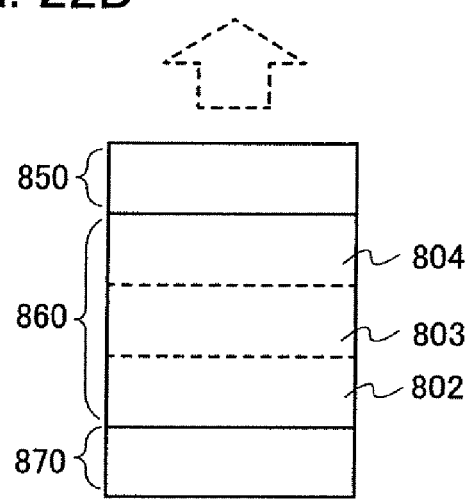

In FIG. 22C, an electrode layer having reflectivity is used for the first electrode layer 870, and an electrode layer having a light-transmitting property is used for the second electrode layer 850 in the structure of FIG. 22A. Light emitted from the light-emitting element is reflected off the first electrode layer 870, transmitted through the second electrode layer 850, and is emitted. Similarly, in FIG. 22D, an electrode layer having reflectivity is used for the first electrode layer 870, and an electrode layer having a light-transmitting property is used for the second electrode layer 850 in the structure of FIG. 22B. Light emitted from the light-emitting element is reflected off the first electrode layer 870, transmitted through the second electrode layer 850, and is emitted.

This embodiment mode can be freely combined with any of the above embodiment modes concerning the display device having a light-emitting element.

In the case of the display device of this embodiment mode, the plurality of pyramidal projections are densely arranged on a display screen surface. The number of times that incident light from external is incident on the pyramidal projections, of the incident light from external which is incident on the display device, is increased; therefore, the amount of light transmitted through the pyramidal projections is increased. Thus, the amount of light from external reflected to the viewer side is reduced, and the cause of a reduction in visibility such as reflection can be prevented.

This embodiment mode can provide a high-visibility display device having an anti-reflection function with which reflection of incident light from external can be further reduced by being provided with a plurality of pyramidal projections on their surface. Accordingly, a more high-quality and high-performance display device can be manufactured.

This embodiment mode can be combined with any of Embodiment Modes 1 to 3, 5, and 6 as appropriate.

Embodiment Mode 8

In this embodiment mode, an example of a display device having an anti-reflection function with which reflection of incident light from external can be further reduced, for the purpose of providing excellent visibility, is described. Specifically, a light-emitting display device using a light-emitting element as a display element is described. In this embodiment mode, a structure of a light-emitting element applicable to a display element of the display device of the present invention is described with reference to FIGS. 23A to 24C.

A light-emitting element utilizing electroluminescence is distinguished depending on whether a tight-emitting material is an organic compound or an inorganic compound. In general, the former is called an organic EL element, and the latter is called an inorganic EL element.

The inorganic EL element is categorized into a dispersion inorganic EL element and a thin-film inorganic EL element depending on its element structure. The former and the latter are different in that the former has an electroluminescent layer where particles of a light-emitting material are dispersed in a binder, and the latter has an electroluminescent layer formed of a thin film of a light-emitting material. However, the former and the latter are the same in that electrons accelerated by a high electric field are necessary. It is to be noted that, as a mechanism of light emission that is obtained, there are donor-acceptor recombination light emission that utilizes a donor level and an acceptor level, and localized light emission that utilizes inner-shell electron transition of a metal ion. In many cases, it is general that a dispersion inorganic EL element has donor-acceptor recombination light emission and a thin-film inorganic EL element has localized light emission.

The light-emitting material that can be used in the present invention includes a base material and an impurity element to be a light-emission center. An impurity element that is contained is changed, so that light emission of various colors can be obtained. As a method for forming the light-emitting material, various methods such as a solid phase method and a liquid phase method (coprecipitation method) may be used. Alternatively, a spray pyrolysis method, a double decomposition method, a method by heat decomposition reaction of a precursor, a reversed micelle method, a method in which such a method is combined with high-temperature baking, a liquid phase method such as a lyophilization method, or the like may be used.

A solid phase method is a method in which a base material, and an impurity element or a compound containing an impurity element are weighed, mixed in a mortar, heated in an electric furnace, and baked to be reacted, so that the impurity element is contained in the base material. The baking temperature is preferably 700 to 1500° C. This is because the solid reaction does not progress when the temperature is too low, whereas the base material is decomposed when the temperature is too high. The baking may be performed in a powder state; however, it is preferable to perform the baking in a pellet state. Although the baking is necessary to be performed at relatively high temperature, the solid phase method is easy; therefore, high productivity can be achieved. Thus, the solid phase method is suitable for mass production.

A liquid phase method (coprecipitation method) is a method in which a base material or a compound containing a base material is reacted with an impurity element or a compound containing an impurity element in a solution, dried, and then baked. Particles of a light-emitting material are distributed uniformly, and the reaction can progress even when the grain size is small and the baking temperature is low.

As a base material used for a light-emitting material, sulfide, oxide, or nitride can be used. As sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. As oxide, zinc oxide (ZnO), yttrium oxide ($Y_2O_3$), or the like can be used. As nitride, aluminum nitride (AlN), gallium nitride (GaN), indium nitride (InN), or the like can be used. Alternatively, zinc selenide (ZnSe), zinc telluride (ZnTe), or the like may be used, or a ternary mixed crystal such as calcium-gallium sulfide ($CaGa_2S_4$), strontium-gallium sulfide ($SrGa_2S_4$), or barium-gallium sulfide ($BaGa_2S_4$) may be used.

As a light-emission center of localized light emission, manganese (Mn), copper (Cu), samarium (Sm), terbium (Tb), erbium (Er), thulium (Tm), europium (Eu), cerium (Ce), praseodymium (Pr), or the like can be used. It is to be noted that a halogen element such as fluorine (F) or chlorine (Cl) may be added. A halogen element may have a function of compensating a charge.

On the other hand, as a light-emission center of donor-acceptor recombination light emission, a light-emitting material containing a first impurity element which forms a donor level and a second impurity element which forms an acceptor level can be used. As the first impurity element, fluorine (F), chlorine (Cl), aluminum (Al), or the like can be used. As the second impurity element, copper (Cu), silver (Ag), or the like can be used.

In the case where the light-emitting material of donor-acceptor recombination light emission is synthesized by a solid phase method, a base material, the first impurity element or a compound containing a first impurity element, and the second impurity element or a compound containing the second impurity element are weighed in each, mixed in a mortar, heated in an electric furnace, and baked. As the base material, any of the above described base materials can be used. As the first impurity element or the compound containing the first impurity element, fluorine (F), chlorine (Cl), aluminum sulfide ($Al_2S_3$), or the like can be used. As the second impurity element or the compound containing the second impurity element, copper (Cu), silver (Ag), copper sulfide ($Cu_2S$), silver sulfide ($Ag_2S$), or the like can be used. The baking temperature is preferably 700 to 1500° C. This is because the solid reaction does not progress when the temperature is too low, whereas the base material is decomposed when the temperature is too high. The baking may be performed in a powder state; however, it is preferable to perform the baking in a pellet state.

As the impurity element in the case of utilizing solid reaction, the compounds containing the first impurity element and the second impurity element may be combined. In this case, since the impurity element is easily diffused and solid reaction progresses easily, a uniform light-emitting material can be obtained. Further, since an unnecessary impurity element is not mixed therein, a light-emitting material having high purity can be obtained. As the compounds containing the first impurity element and the second impurity element, copper chloride (CuCl), silver chloride (AgCl), or the like can be used.

It is to be noted that the concentration of these impurity elements may be 0.01 to 10 atomic % with respect to the base material and is preferably 0.05 to 5 atomic %.

In the case of a thin-film inorganic EL element, an electroluminescent layer is a layer containing the above light-emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like.

Figure 23A:
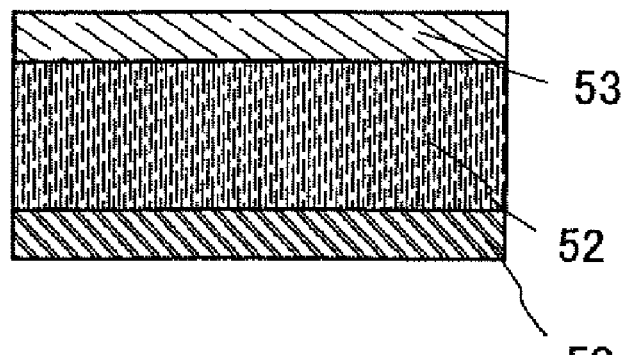
FIGS. 23A to 23C are cross-sectional views each showing a structure of a light-emitting element applicable to the present invention.
Figure 23B:
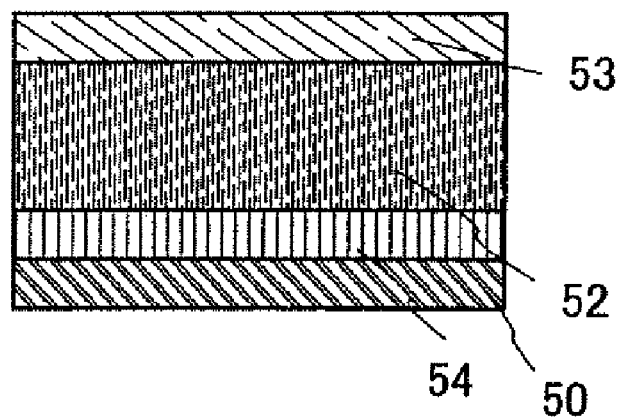
Figure 23C:
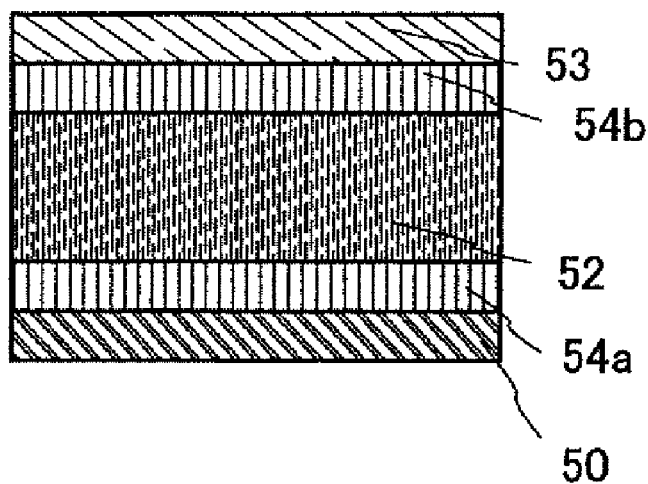

FIGS. 23A to 23C each show an example of a thin-film inorganic EL element that can be used as a light-emitting element. In FIGS. 23A to 23C, each light-emitting element includes a first electrode layer 50, an electroluminescent layer 52, and a second electrode layer 53.

The light-emitting elements shown in FIGS. 23B and 23C each have a structure where an insulating layer is provided between the electrode layer and the electroluminescent layer of the light-emitting element of FIG. 23A. The light-emitting element shown in FIG. 23B has an insulating layer 54 between the first electrode layer 50 and the electroluminescent layer 52. The light-emitting element shown in FIG. 23C includes an insulating layer 54a between the first electrode layer 50 and the electroluminescent layer 52, and an insulating layer 54b between the second electrode layer 53 and the electroluminescent layer 52. Thus, the insulating layer may be provided between the electroluminescent layer and one of the electrode layers that sandwich the electroluminescent layer, or the insulating layer may be provided between the electroluminescent layer and the first electrode layer and between the electroluminescent layer and the second electrode layer. Further, the insulating layer may have a single-layer structure or a stacked-layer structure including a plurality of layers.

In addition, although the insulating layer 54 is provided so as to be in contact with the first electrode layer 50 in FIG. 23B, the insulating layer 54 may be provided so as to be in contact with the second electrode layer 53 by reversing of the positions of the insulating layer and the electroluminescent layer.

In the case of a dispersion inorganic EL element, a film-shaped electroluminescent layer where particles of a light-emitting material are dispersed in a binder is formed. When particles with desired grain sizes cannot be obtained by a manufacturing method of a light-emitting material, a light-emitting material may be processed into a particle state by being crushed in a mortar or the like. The binder is a substance for fixing particles of a light-emitting material in a dispersed state to keep the shape of an electroluminescent layer. The light-emitting material is uniformly dispersed and fixed in the electroluminescent layer by the binder.

In the case of a dispersion inorganic EL element, as a formation method of an electroluminescent layer, a droplet discharging method which can selectively form an electroluminescent layer, a printing method (such as screen printing or offset printing), a coating method such as a spin coating method, a dipping method, a dispenser method, or the like can be used. There are no particular limitations on the thickness of the electroluminescent layer; however, a thickness of 10 to 1000 nm is preferable. In addition, in the electroluminescent layer containing a light-emitting material and a binder, the ratio of the light-emitting material is preferably 50 to 80 wt %.

Figure 24A:
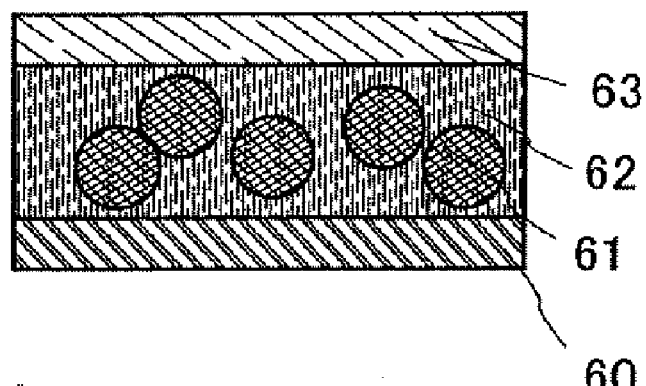
FIGS. 24A to 24C are cross-sectional views each showing a structure of a light-emitting element applicable to the present invention.
Figure 24B:
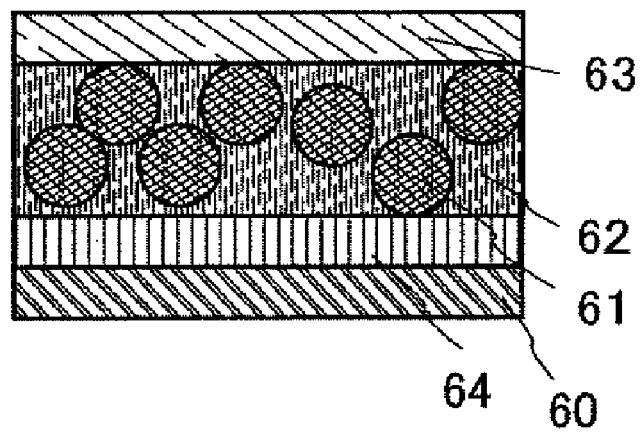
Figure 24C:
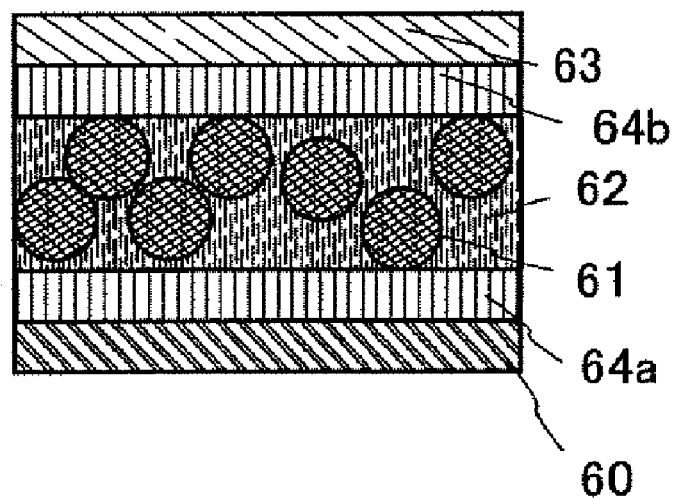

FIGS. 24A to 24C each show an example of a dispersion inorganic EL element that can be used as a light-emitting element. In FIG. 24A, the light-emitting element has a stacked-layer structure of a first electrode layer 60, an electroluminescent layer 62, and a second electrode layer 63, in which a light-emitting material 61 held by a binder is contained in the electroluminescent layer 62.

As the binder that can be used in this embodiment mode, an organic material or an inorganic material can be used, or a mixed material of an organic material and an inorganic material may be used. As the organic material, a polymer having a relatively high dielectric constant like a cyanoethyl cellulose-based resin, or a resin such as polyethylene, polypropylene, a polystyrene-based resin, a silicone resin, an epoxy resin, or vinylidene fluoride can be used. Alternatively, a heat-resistant high molecular such as aromatic polyamide or polybenzimidazole, or a siloxane resin may be used. A siloxane resin corresponds to a resin containing a Si—O—Si bond. Siloxane is composed of a skeleton structure formed by the bond of silicon (Si) and oxygen (O). As a substituent thereof, an organic group containing at least hydrogen (such as an alkyl group or aromatic hydrocarbon) is used. Instead, a fluoro group, or a fluoro group and an organic group containing at least hydrogen may be used as the substituent. Further alternatively, a resin material such as a vinyl resin, for example, polyvinyl alcohol or polyvinyl butyral, a phenol resin, a novolac resin, an acrylic resin, a melamine resin, a urethane resin, or an oxazole resin (polybenzoxazole) may be used. A dielectric constant can be controlled by mixing of these resins with high-dielectric constant microparticles of barium titanate ($BaTiO_3$), strontium titanate ($SrTiO_3$), or the like as appropriate.

As the inorganic material contained in the binder, a material selected from silicon oxide ($SiO_x$), silicon nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), and other substances containing an inorganic insulating material can be used. By mixing of the organic material with a high-dielectric constant inorganic material (by addition or the like), a dielectric constant of an electroluminescent layer containing a light-emitting material and a binder can be controlled much better and further increased. When a mixed layer of an inorganic material and an organic material is used for the binder to have a high dielectric constant, a larger electric charge can be induced by the light-emitting material.

In a manufacturing process, the light-emitting material is dispersed in a solution containing a binder. As a solvent of the solution containing a binder that can be used in this embodiment mode, it is preferable to select a solvent that dissolves a binder material and can make a solution with the viscosity appropriate for a method for forming the electroluminescent layer (various wet processes) and for a desired film thickness. An organic solvent or the like can be used, and for example, when a siloxane resin is used as the binder, propylene glycolmonomethyl ether, propylene glycolmonomethyl ether acetate (also referred to as PGMEA), 3-methoxy-3-methyl-1-butanol (also referred to as MMB), or the like can be used.

The light-emitting elements shown in FIGS. 24B and 24C each have a structure where an insulating layer is provided between the electrode layer and the electroluminescent layer of the light-emitting element of FIG. 24A. The light-emitting element shown in FIG. 24B has an insulating layer 64 between the first electrode layer 60 and the electroluminescent layer 62. The light-emitting element shown in FIG. 24C includes an insulating layer 64a between the first electrode layer 60 and the electroluminescent layer 62, and an insulating layer 64b between the second electrode layer 63 and the electroluminescent layer 62. Thus, the insulating layer may be provided between the electroluminescent layer and one of the electrode layers that sandwich the electroluminescent layer, or the insulating layers may be provided between the electroluminescent layer and the first electrode layer and between the electroluminescent layer and the second electrode layer. Further, the insulating layer may have a single-layer structure or a stacked-layer structure including a plurality of layers.

In addition, although the insulating layer 64 is provided so as to be in contact with the first electrode layer 60 in FIG. 24B, the insulating layer 64 may be provided so as to be in contact with the second electrode layer 63 by reversing of the positions of the insulating layer and the electroluminescent layer.

Although the insulating layers 54 and 64 in FIGS. 23B, 23C, 24B and 24C are not particularly limited, such insulating layers preferably have a high withstand voltage and dense film qualities, and more preferably have a high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, or a mixed film or a staked-layer film of two or more kinds thereof can be used. These insulating films can be formed by sputtering, evaporation, CVD, or the like. Alternatively, the insulating layers may be formed by dispersing of particles of these insulating materials in a binder. The binder material may be formed of the same material and by the same method as the binder contained in the electroluminescent layer. A thickness of the insulating layer is not particularly limited, and a thickness of 10 to 1000 nm is preferable.

The light-emitting element described in this embodiment mode can emit light by application of a voltage between the pair of electrodes which sandwich the electroluminescent layer, and can be operated by direct current driving or alternating current driving.

In the case of the display device of this embodiment mode, the plurality of pyramidal projections are densely arranged on a display screen surface. The number of times that incident light from external is incident on the pyramidal projections, of the incident light from external which is incident on the display device, is increased; therefore, the amount of light transmitted through the pyramidal projections is increased. Thus, the amount of light from external reflected to the viewer side is reduced, and the cause of a reduction in visibility such as reflection can be prevented.

This embodiment mode can provide a high-visibility display device having an anti-reflection function with which reflection of incident light from external can be further reduced by being provided with a plurality of pyramidal projections on their surface. Accordingly, a more high-quality and high-performance display device can be manufactured.

This embodiment mode can be combined with any of Embodiment Modes 1 to 3, 5, and 6 as appropriate.

Embodiment Mode 9

In this embodiment mode, a structure of a backlight is described. A backlight is provided in a display device as a backlight unit having a light source, and the light source of the backlight unit is surrounded by a reflection plate for scattering light efficiently.

Figure 16A:
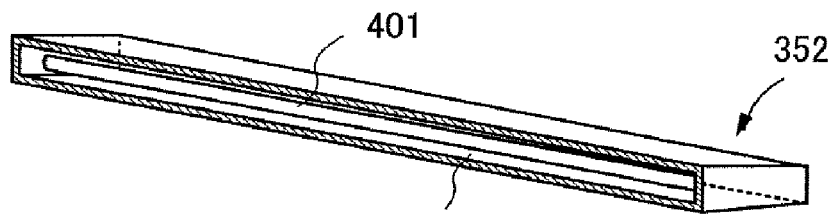
FIGS. 16A to 16D each show a backlight applicable as a display device of the present invention.

As shown in FIG. 16A, a cold cathode fluorescent lamp 401 can be used as a light source of a backlight unit 352. In addition, a lamp reflector 332 can be provided to reflect light from the cold cathode fluorescent lamp 401 efficiently. The cold cathode fluorescent lamp 401 is often used for a large display device for intensity of luminance from the cold cathode fluorescent lamp. Therefore, such a backlight unit having a cold cathode fluorescent lamp can be used for a display of a personal computer.

Figure 16B:
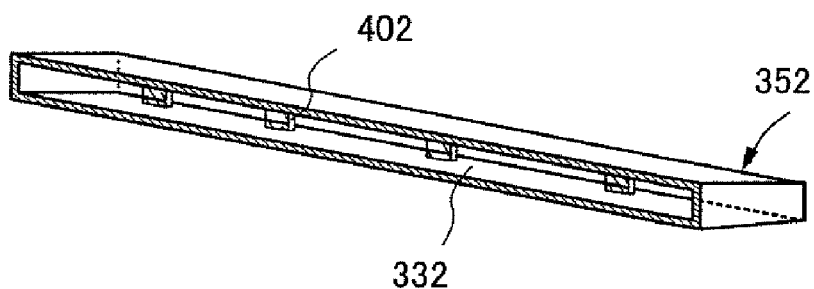

As shown in FIG. 16B, light-emitting diodes (LED) 402 can be used as light sources of the backlight unit 352. For example, light-emitting diodes (W) 402 which emit white light are provided at predetermined intervals. In addition, the lamp reflector 332 can be provided to reflect light from the light-emitting diode (W) 402 efficiently.

Figure 16C:
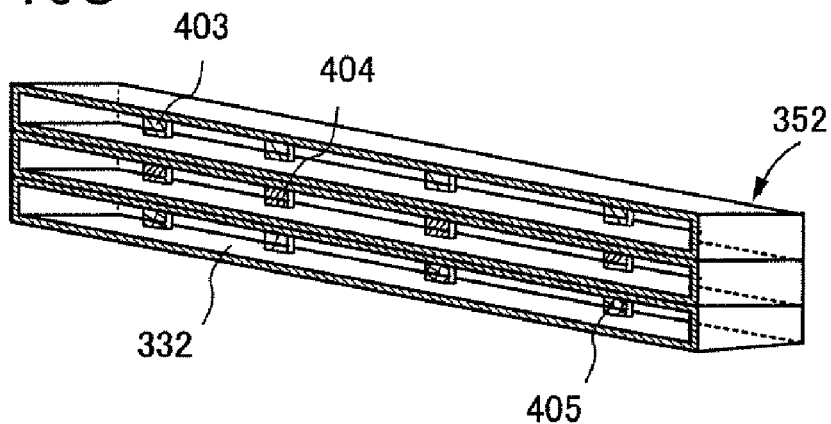

As shown in FIG. 16C, light-emitting diodes (LED) 403, 404, and 405 of RGB colors can be used as light sources of the backlight unit 352. By using the light-emitting diodes (LED) 403, 404, and 405 of RGB colors, higher color reproducibility can be realized in comparison with the case where only the light-emitting diode (W) 402 which emits white light is used. In addition, the lamp reflector 332 can be provided to reflect light from the light-emitting diodes efficiently.

Figure 16D:
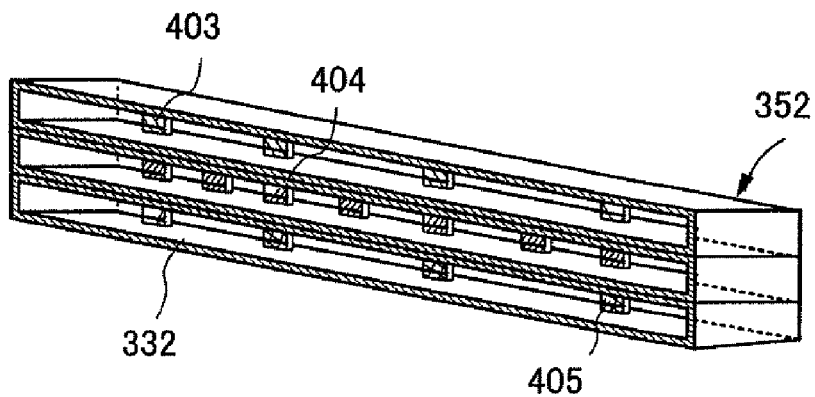

Further, as shown in FIG. 16D, in the case where the light-emitting diodes (LED) 403, 404, and 405 of RGB colors are used as light sources, the number and arrangement thereof are not necessarily the same. For example, a plurality of light-emitting diodes of a color having low emission intensity (for example, green) may be arranged.

Further, the light-emitting diode 402 which emits white light may be used in combination with the light-emitting diodes (LED) 403, 404, and 405 of RGB colors.

Note that in the case of having the light-emitting diodes of RGB colors, the light-emitting diodes sequentially emit light in accordance with time by applying a field sequential mode, so that color display can be performed.

Using a light-emitting diode is suitable for a large display device since luminance is high. Further, purity of ROB colors is high; therefore, a light-emitting diode has excellent color reproducibility as compared to a cold cathode fluorescent lamp. In addition, an area required for arrangement can be reduced; therefore, a narrower frame can be achieved when a light-emitting diode is applied to a small display device.

Further, a light source is not necessarily provided as the backlight unit shown in FIGS. 16A to 16D. For example, in the case where a backlight having a light-emitting diode is mounted on a large display device, the light-emitting diode can be arranged on a back side of the substrate. In this case, the light-emitting diodes of ROB colors can be sequentially arranged at predetermined intervals. Depending on arrangement of the light-emitting diodes, color reproducibility can be enhanced.

By densely arranging a plurality of pyramidal projections on a surface of a display device using such a backlight, a high-visibility display device having a high anti-reflection function with which reflection of incident light from external can be further reduced can be provided. Therefore, according to the present invention, a high-quality and high-performance display device can be manufactured. A backlight having a light-emitting diode is particularly suitable for a large display device, and a high-quality image can be produced even in a dark place by enhancing the contrast ratio of the large display device.

This embodiment mode can be combined with any of Embodiment Modes 1 to 4 as appropriate.

Embodiment Mode 10

Figure 15:
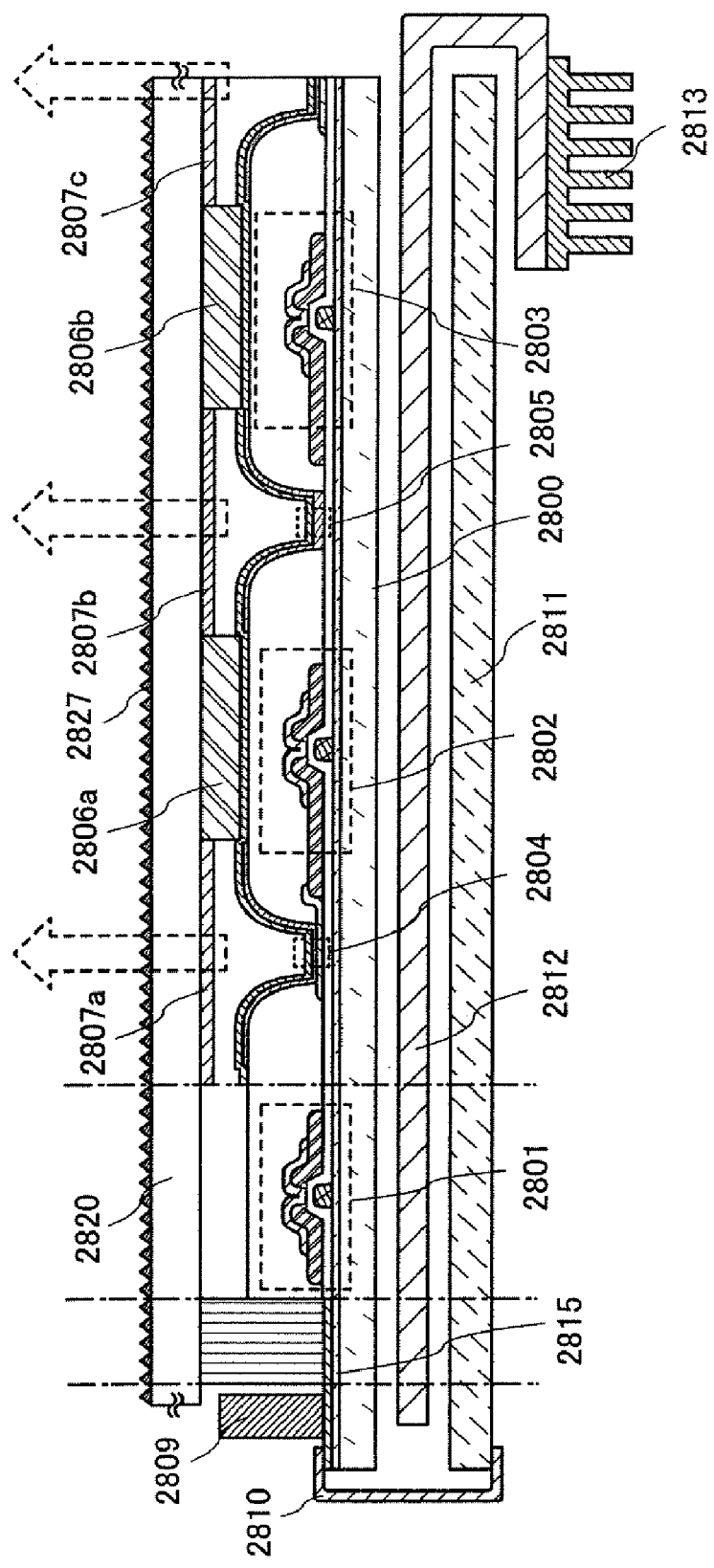
FIG. 15 is a cross-sectional view showing a display module of the present invention.

FIG. 15 shows an example in which an EL display module manufactured by the present invention is formed. In FIG. 15, a pixel portion including pixels is formed over a substrate 2800. As the substrate 2800 and a sealing substrate 2820, flexible substrates are used.

In FIG. 15, outside the pixel portion, a TFT similar to that formed in a pixel or a protective circuit portion 2801 operated similarly to a diode by connection of a gate of the TFT and a source or a drain of the TFT is provided between a driver circuit and the pixel. A driver IC formed using a single crystalline semiconductor, a stick driver IC formed using a polycrystalline semiconductor film over a glass substrate, a driver circuit formed using an SAS, or the like is applied to a driver circuit 2809.

The substrate 2800 to which an element layer is transferred is attached firmly to a sealing substrate 2820 with spacers 2806a and 2806b formed by a droplet discharging method interposed therebetween. The spacers are preferably provided to keep the distance between two substrates constant even when the substrate is thin or an area of the pixel portion is increased. A space between the substrate 2800 and the sealing substrate 2820 over light-emitting elements 2804 and 2805 connected to TFTs 2802 and 2803, respectively, may be filled with a resin material having a light-transmitting property, and the resin material may be solidified. Alternatively, the space may be filled with anhydrous nitrogen or an inert gas. A plurality of pyramidal projections 2827 are provided on an outer side of the sealing substrate 2820, which is the viewer side.

FIG. 15 shows the case where the light-emitting elements 2804 and 2805 are top-emission type and emit light in the direction of arrows shown in the drawing. Multicolor display can be performed by making each pixel emit light of a different color of red, green, or blue. At this time, color purity of light emitted to an external portion can be improved by formation of colored layers 2807a, 2807b, and 2807c corresponding to respective colors on the sealing substrate 2820 side. Alternatively, pixels as white light-emitting elements may be combined with the colored layers 2807a, 2807b, and 2807c.

The driver circuit 2809 which is an external circuit is connected to a scan line or signal line connection terminal, which is provided at one end of an external circuit board 2811, through a wiring board 2810. In addition, a heat pipe 2813 which is a highly efficient thermal conductive device with a pipe shape and a heat sink 2812, which are used for radiating heat to the external portion of the device, may be provided in contact with or adjacent to the substrate 2800 to increase a heat radiation effect.

It is to be noted that FIG. 15 shows the top-emission EL module; however, a bottom-emission structure may be employed by changing of the structure of the light-emitting element or the position of the external circuit board. It is needless to say that a dual-emission structure in which light is emitted from both of a top surface and a bottom surface may be used. In the case of the top-emission structure, an insulating layer serving as a partition may be colored and used as a black matrix. This partition can be formed by a droplet discharging method, and it may be formed by mixing of a black resin of a pigment material, carbon black, or the like into a resin material such as polyimide. Instead, a stacked layer thereof may be used.

In addition, in an EL display module, reflected incident light from external may be blocked with the use of a retardation plate or a polarizing plate. An insulating layer serving as a partition may be colored to be used as a black matrix. This partition can be formed by a droplet discharging method or the like. Carbon black or the like may be mixed into a black resin of a pigment material or a resin material such as polyimide to be used, and instead, a stacked layer thereof may be used. By a droplet discharging method, different materials may be discharged to the same region plural times to form the partition. A quarter wave plate or a half wave plate may be used as the retardation plate and may be designed to be able to control light. As the structure, the light-emitting element, the sealing substrate (sealing material), the retardation plates (a quarter wave plate ($\lambda/4$) and a half wave plate ($\lambda/2$)), and the polarizing plate are sequentially formed over a TFT substrate, and light emitted from the light-emitting element is transmitted therethrough and is emitted to an external portion from the polarizing plate side. The retardation plate or polarizing plate may be provided on a side to which light is emitted or may be provided on both sides in the case of a dual-emission display device in which light is emitted from the both sides. In addition, a plurality of pyramidal projections may be provided on the outer side of the polarizing plate. Accordingly, higher-definition and precise images can be displayed.

Although the plurality of pyramidal projections are densely arranged over the substrate on the viewer side, a sealing structure may be formed by attaching a resin film to the side where the pixel portion is formed, with the use of a sealing material or an adhesive resin, as for a sealing structure on a side opposite to the viewer side with an element interposed therebetween. Various sealing methods such as resin sealing using a resin, plastic sealing using plastics, and film sealing using a film may be employed. A gas barrier film which prevents water vapor from penetrating the resin film is preferably provided on the surface of the resin film. By employing a film sealing structure, further reduction in thickness and weight can be achieved.

In the case of the display device of this embodiment mode, the plurality of pyramidal projections are densely arranged on a display screen surface. The number of times that incident light from external is incident on the pyramidal projections, of the incident light from external which is incident on the display device, is increased; therefore, the amount of light transmitted through the pyramidal projections is increased. Thus, the amount of light from external which is reflected to the viewer side is reduced, and the cause of a reduction in visibility such as reflection can be prevented.

This embodiment mode can provide a high-visibility display device having an anti-reflection function with which reflection of incident light from external can be further reduced by being provided with a plurality of pyramidal projections on their surface. Accordingly, a more high-quality and high-performance display device can be manufactured.

This embodiment mode can be combined with any of Embodiment Modes 1 to 3, 5, and 8 as appropriate.

Embodiment Mode 11

This embodiment mode is described with reference to FIGS. 14A and 14B. FIGS. 14A and 14B show an example in which a display device (liquid crystal display module) is formed using a TFT substrate 2600 manufactured according to the present invention.

FIG. 14A is an example of a liquid crystal display module. The TFT substrate 2600 and a counter substrate 2601 are firmly attached to each other with a sealing material 2602, and a pixel portion 2603 including TFTs or the like, a display element a liquid crystal layer 2604 including a liquid crystal layer, a colored layer 2605, and a polarizing plate 2606 are provided therebetween, thereby forming a display region. The colored layer 2605 is necessary for performing color display, and colored layers corresponding to red, green, and blue are provided for each pixel in the case of an RGB mode. The polarizing plate 2606 and pyramidal projections 2626 are provided on an outer side of the counter substrate 2601, and a polarizing plate 2607 and a diffusing plate 2613 are provided on an outer side of the TFT substrate 2600. A light source includes a cold cathode fluorescent lamp 2610 and a reflective plate 2611, and a circuit substrate 2612 is connected to the TFT substrate 2600 through a flexible wiring board 2609 and includes an external circuit such as a control circuit or a power source circuit. In addition, a retardation plate may be provided between the polarizing plate and the liquid crystal layer.

The display device of FIG. 14A is an example in which the pyramidal projections 2626 are provided on an outer side of the counter substrate 2601, and the polarizing plate 2606 and the colored layer 2605 are sequentially provided on an inner side. However, the polarizing plate 2606 may be provided on the outer side of the counter substrate 2601 (on the viewer side), and in that case, the pyramidal projections 2626 may be provided on a surface of the polarizing plate 2606. The stacked-layer structure of the polarizing plate 2606 and the colored layer 2605 is also not limited to that of FIG. 14A and may be appropriately determined depending on materials of the polarizing plate 2606 and the colored layer 2605 or conditions of a manufacturing process.

For the liquid crystal display module, a TN (twisted nematic) mode, an IPS (In-Plane-Switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

FIG. 14B shows an example of an FS-LCD (field sequential-LCD) in which an OCB mode is applied to the liquid crystal display module of FIG. 14A. The FS-LCD emits light of red, green, and blue during one frame period and can perform color display by combining images using time division. Light of each color is emitted by a light-emitting diode, a cold cathode fluorescent lamp, or the like; therefore, a color filter is not necessary. Thus, it is not necessary to arrange color filters of three primary colors and restrict the display region of each color, and display of all three colors can be performed in any region. On the other hand, since light of three colors is emitted during one frame period, high-speed response is necessary for a liquid crystal. An FLC mode, an OCB mode, or the like each using an FS method is employed for a display device of the present invention, so that a display device or a liquid crystal television set with high performance and high image quality can be completed.

A liquid crystal layer of an OCB mode has a so-called π-cell structure. In the π-cell structure, liquid crystal molecules are aligned so that their pretilt angles are plane-symmetric with respect to the center plane between an active matrix substrate and a counter substrate. An orientation state in a π-cell structure is splay orientation when a voltage is not applied between the substrates, and then shifts to bend orientation when a voltage is applied therebetween. In this bend orientation state, white display is obtained. When a voltage is applied further, liquid crystal molecules of bend orientation get orientated perpendicular to the both substrates so that light is not transmitted. With the OCB mode, response which is 10 times as rapid as that of a conventional TN mode can be achieved.

Moreover, as a mode for the FS method, an HV (Half-V)-FLC or an SS (surface stabilized)-FLC using ferroelectric liquid crystal (FLC) capable of high-speed operation, or the like may be used. The OCB mode can use nematic liquid crystal having relatively low viscosity, and the HV-FLC or the SS-FLC can use a smectic liquid crystal having a ferroelectric phase.

Moreover, optical response speed of a liquid crystal display module gets higher by narrowing of the cell gap of the liquid crystal display module. In addition, the optical response speed can also get higher by decrease in viscosity of the liquid crystal material. The increase in response speed is particularly effective when a pixel pitch in a pixel region of a TN mode liquid crystal display module is 30 μm or less. Also, further increase in response speed is possible by an overdrive method in which an applied voltage is increased (or decreased) for a moment.

FIG. 14B shows a transmissive liquid crystal display module, in which a red light source 2910a, a green light source 2910b, and a blue light source 2910c are provided as light sources. The light sources are provided with a control portion 2912 in order to switch on or off of the red light source 2910a, the green light source 2910b, and the blue light source 2910c. The control portion 2912 controls light emission of each color, light enters the liquid crystal, and images are combined using time division, so that color display is performed.

In the case of the display device of this embodiment mode, the plurality of pyramidal projections are densely arranged on a display screen surface. The number of times that incident light from external is incident on the pyramidal projections, of the incident light from external which is incident on the display device, is increased; therefore, the amount of light transmitted through the pyramidal projections is increased. Thus, the amount of light from external reflected to the viewer side is reduced, and the cause of a reduction in visibility such as reflection can be prevented.

This embodiment mode can provide a high-visibility display device having an anti-reflection function with which reflection of incident light from external can be further reduced by being provided with a plurality of pyramidal projections on their surface. Accordingly, a more high-quality and high-performance display device can be manufactured.

This embodiment mode can be combined with any of Embodiment Modes 1 to 4, and 9.

Embodiment Mode 12

Figure 19:
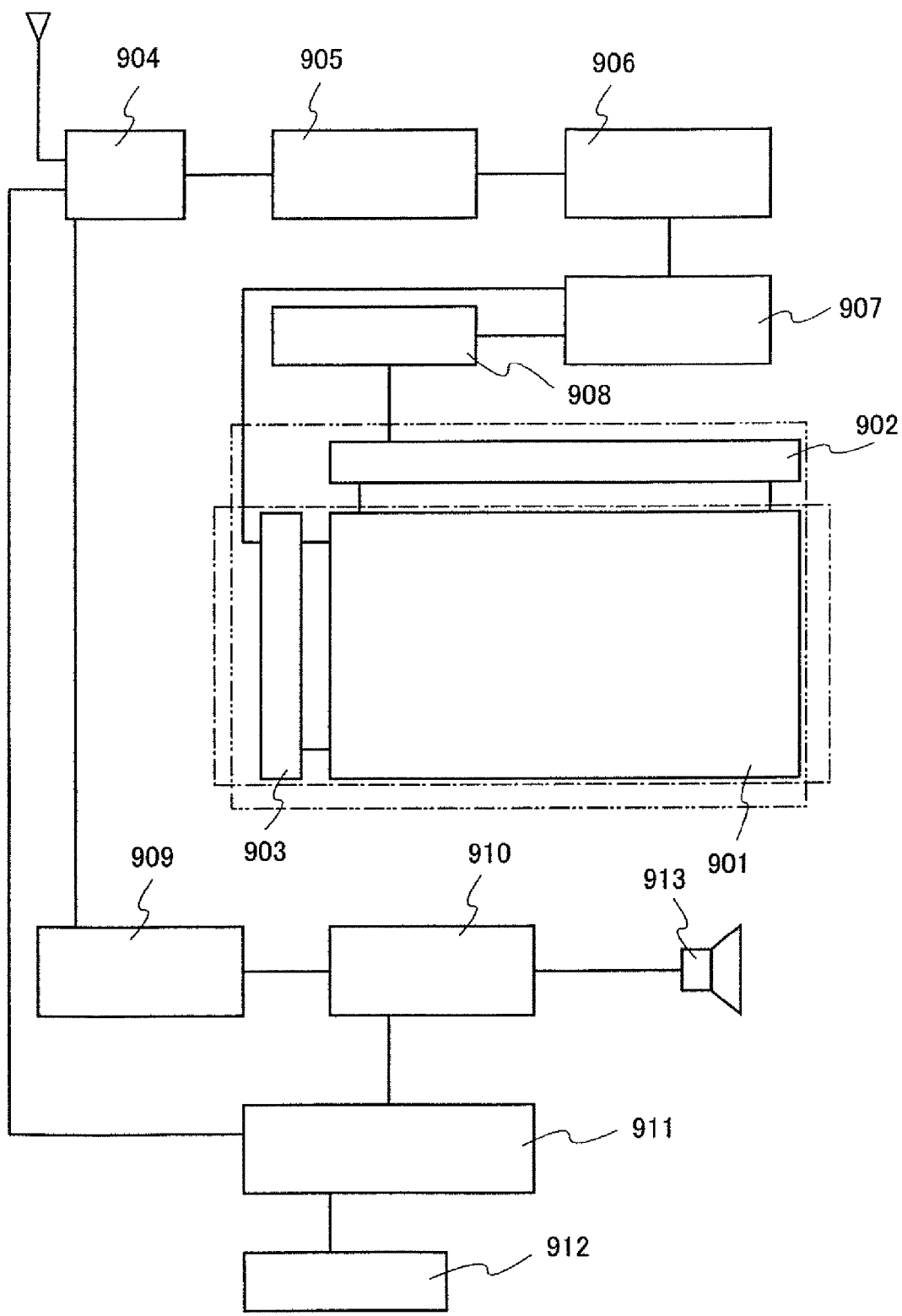
FIG. 19 is a block diagram showing a main structure of an electronic appliance to which the present invention is applied.

A television set (also referred to as a TV simply or a television receiver) can be completed using a display device formed by the present invention. FIG. 19 is a block diagram showing a main structure of a television set.

Figure 17A:
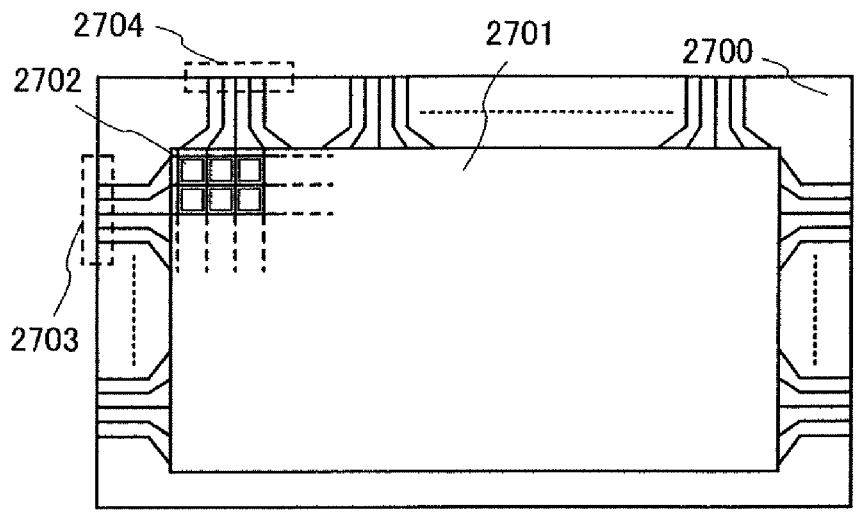
FIGS. 17A to 17C are top plan views each showing a display device of the present invention.

FIG. 17A is a top plan view showing a structure of a display panel of the present invention, in which a pixel portion 2701 where pixels 2702 are arranged in matrix, a scan line input terminal 2703, and a signal line input terminal 2704 are formed over a substrate 2700 having an insulating surface. The number of pixels may be set in accordance with various standards: the number of pixels of XGA for RGB full-color display may be 1024×768×3 (RGB), that of UXGA for RGB full-color display may be 1600×1200×3 (RGB), and that corresponding to a full-speck high vision for RGB full-color display may be 1920×1080×3 (ROB).

Scan lines which extend from the scan line input terminal 2703 intersects with signal lines which extend from the signal line input terminal 2704, so that the pixels 2702 are arranged in matrix. Each pixel in the pixel portion 2701 is provided with a switching element and a pixel electrode layer connected to the switching element. A typical example of the switching element is a TFT. A gate electrode layer side of the TFT is connected to the scan line, and a source or drain side thereof is connected to the signal line, so that each pixel can be controlled independently by a signal inputted externally.

Figure 18A:
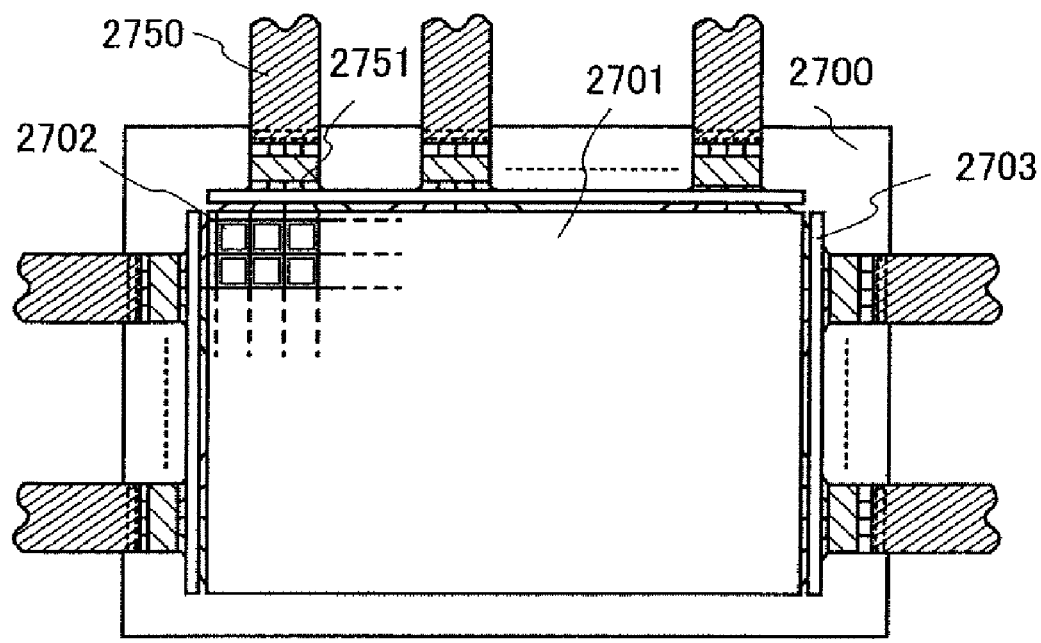
FIGS. 18A and 18B are top plan views each showing a display device of the present invention.
Figure 18B:
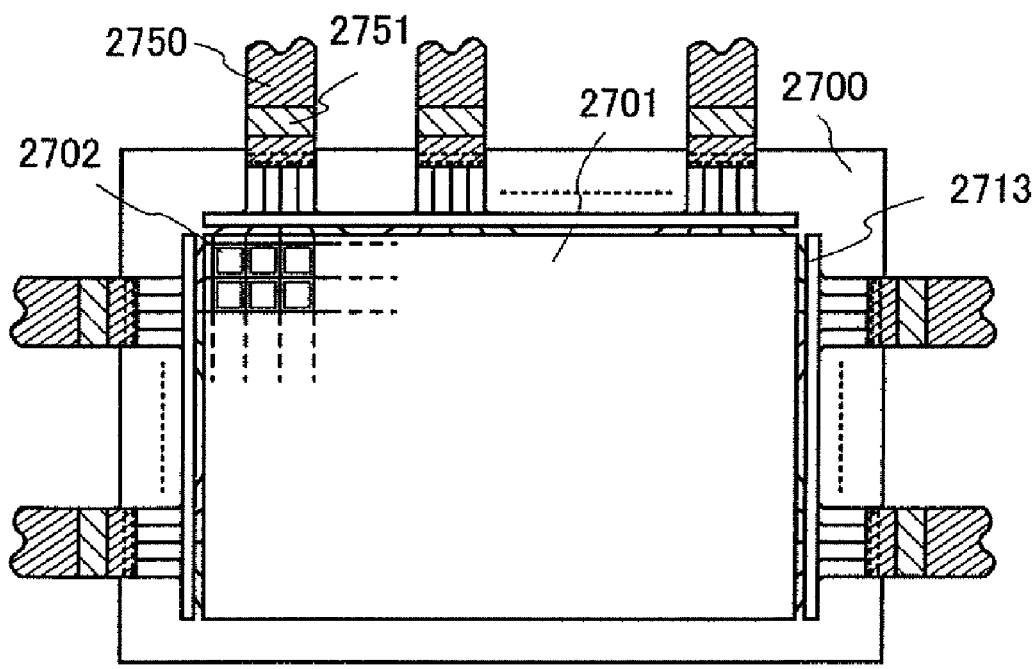

FIG. 17A shows a structure of the display panel in which signals inputted to a scan line and a signal line are controlled by an external driver circuit. Alternatively, driver ICs 2751 may be mounted on the substrate 2700 by a COG (chip on glass) method as shown in FIG. 18A. Alternatively, a TAB (tape automated bonding) method may be employed as shown in FIG. 18B. The driver ICs may be ones formed over a single crystalline semiconductor substrate or may be circuits that are each formed using a TFT over a glass substrate. In FIGS. 18A and 18B, each driver IC 2751 is connected to an FPC (flexible printed circuit) 2750.

Figure 17B:
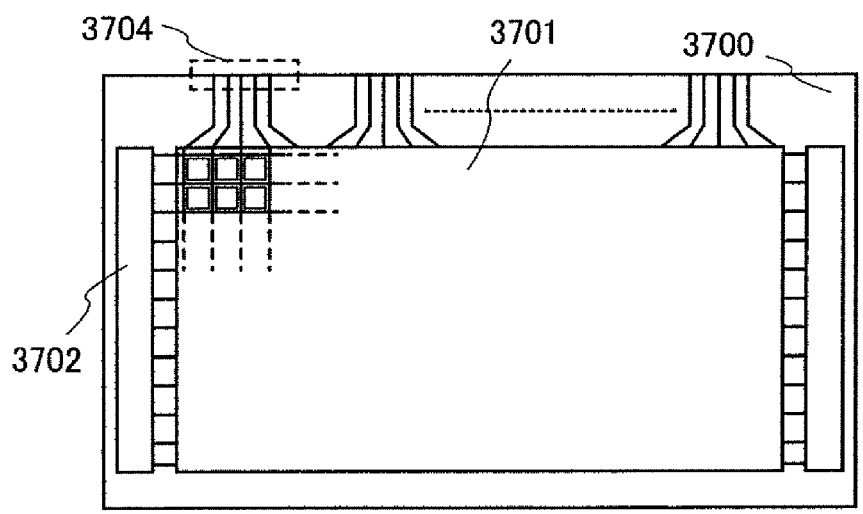

Further, in the case where a TFT provided in a pixel is formed using a semiconductor having high crystallinity, a scan line driver circuit 3702 may be formed over a substrate 3700 as shown in FIG. 17B. In FIG. 17B, a pixel portion 3701 which is connected to a signal line input terminal 3704 is controlled by an external driver circuit similar to that in FIG. 17A. In the case where a TFT provided in a pixel is formed using a polycrystalline (microcrystalline) semiconductor, a single crystalline semiconductor, or the like with high mobility, a pixel portion 4701, a scan line driver circuit 4702, and a signal line driver circuit 4704 can be formed over a substrate 4700 as shown in FIG. 17C.

Figure 17C:
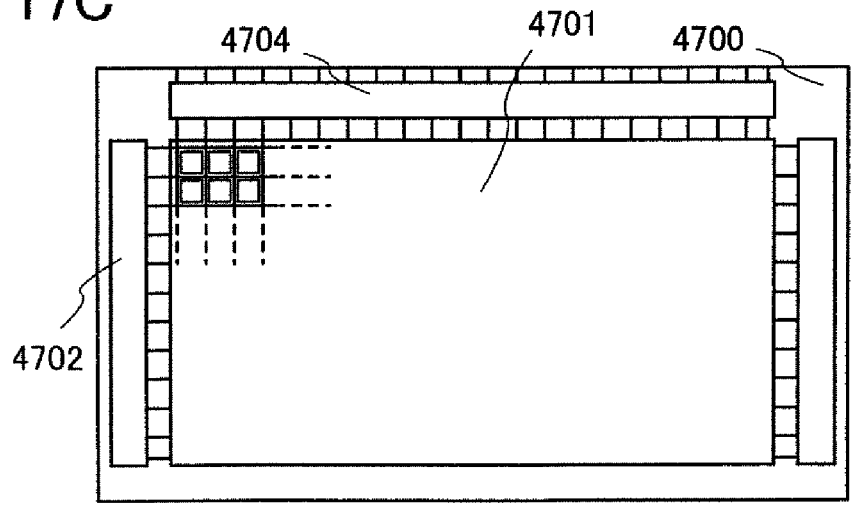

In FIG. 19, a display panel can be formed in any mode as follows: as the structure shown in FIG. 17A, only a pixel portion 901 is formed, and a scan line driver circuit 903 and a signal line driver circuit 902 are mounted by a TAB method as shown in FIG. 18B or by a COG method as shown in FIG. 18A; a TFT is formed, and a pixel portion 901 and a scan line driver circuit 903 are formed over a substrate, and a signal line driver circuit 902 is separately mounted as a driver IC as shown in FIG. 17B; a pixel portion 901, a signal line driver circuit 902, and a scan line driver circuit 903 are formed over one substrate as shown in FIG. 17C; and the like.

In FIG. 19, as a structure of other external circuits, a video signal amplifier circuit 905 for amplifying a video signal among signals received by a tuner 904, a video signal processing circuit 906 for converting the signals outputted from the video signal amplifier circuit 905 into chrominance signals corresponding to colors of red, green, and blue respectively, a control circuit 907 for converting the video signal so as to be inputted to a driver IC, and the like are provided on an input side of the video signal. The control circuit 907 outputs signals to both a scan line side and a signal line side. In the case of digital driving, a signal dividing circuit 908 may be provided on the signal line side and an input digital signal may be divided into m pieces to be supplied.

Among signals received by the tuner 904, an audio signal is transmitted to an audio signal amplifier circuit 909, and the output thereof is supplied to a speaker 913 through an audio signal processing circuit 910. A control circuit 911 receives control information on a receiving station (receiving frequency) or sound volume from an input portion 912 and transmits the signal to the tuner 904 or the audio signal processing circuit 910.

Figure 20A:
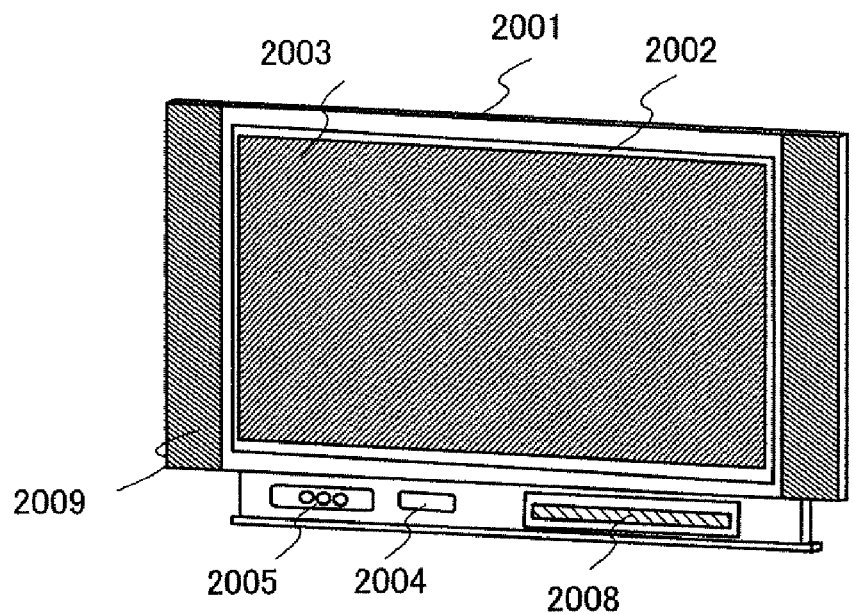
FIGS. 20A and 20B are diagrams each showing an electronic appliance of the present invention.
Figure 20B:
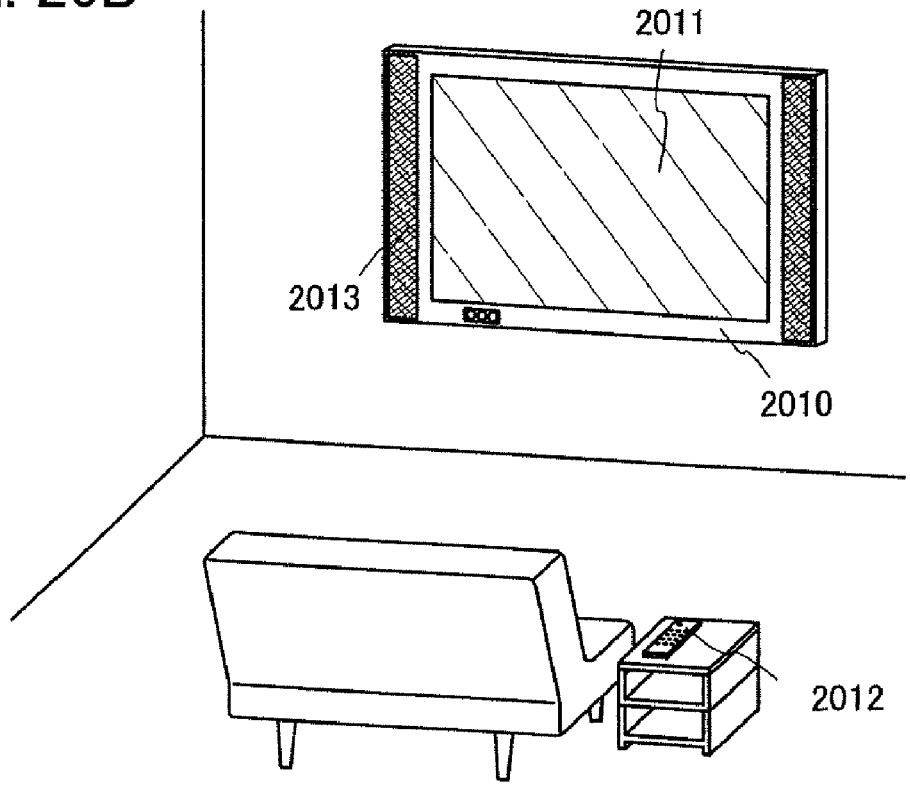

A television set can be completed by incorporating the display module into a chassis as shown in FIGS. 20A and 20B. When a liquid crystal display module is used as a display module, a liquid crystal television set can be manufactured. When an EL display module is used, an EL television set can be manufactured. In FIG. 20A, a main screen 2003 is formed using the display module, and a speaker portion 2009, an operation switch, and the like are provided as its accessory equipment. Thus, a television set can be completed by the present invention.

A display panel 2002 is incorporated in a chassis 2001. With the use of a receiver 2005, in addition to reception of general TV broadcast, communication of information can also be performed in one way (from a transmitter to a receiver) or in two ways (between a transmitter and a receiver or between receivers) by connection to a wired or wireless communication network through a modem 2004. The television set can be operated by switches incorporated in the chassis or by a remote control device 2006 separated from the main body. A display portion 2007 that displays information to be outputted may also be provided in this remote control device.

In addition, in the television set, a structure for displaying a channel, sound volume, or the like may be provided by formation of a subscreen 2008 with a second display panel in addition to the main screen 2003. In this structure, the main screen 2003 and the subscreen 2008 can be formed using a liquid crystal display panel of the present invention. Alternatively, the main screen 2003 may be formed using an EL display panel superior in a viewing angle, and the subscreen 2008 may be formed using a liquid crystal display panel capable of displaying with low power consumption. In order to prioritize low power consumption, a structure in which the main screen 2003 is formed using a liquid crystal display panel, the subscreen 2008 is formed using an EL display panel, and the sub-screen is able to flash on and off may be employed. By the present invention, a highly reliable display device can be manufactured even with the use of such a large substrate, and many TFTs and electronic components.

FIG. 20B shows a television set having a large display portion, for example, 20 to 80-inch display portion, which includes a chassis 2010, a display portion 2011, a remote control device 2012 which is an operation portion, a speaker portion 2013, and the like. The present invention is applied to manufacture of the display portion 2011. The television set shown in FIG. 20B is a wall-hanging type, and does not need a wide space.

It is necessary to say that the present invention is not limited to the television set and is also applicable to various uses such as a monitor of a personal computer, or in particular, a display medium with a large area, for example, an information display board at a train station, an airport, or the like, or an advertisement display board on the street.

This embodiment mode can be combined with any of Embodiment Modes 1 to 11 as appropriate.

Embodiment Mode 13

Examples of electronic devices in accordance with the present invention are as follows: a television device (also referred to as simply a television, or a television receiver), a camera such as a digital camera or a digital video camera, a cellular telephone device (simply also referred to as a cellular phone or a cell-phone), a portable information terminal such as PDA, a portable game machine, a computer monitor, a computer, a sound reproducing device such as a car audio system, an image reproducing device including a recording medium, such as a home-use game machine, and the like. Further, the present invention can be applied to various amusement machines each having a display device, such as a pachinko machine, a slot machine, a pinball machine, and a large game machine. Specific examples of them are described with reference to FIGS. 21A to 21F.

Figure 21A:
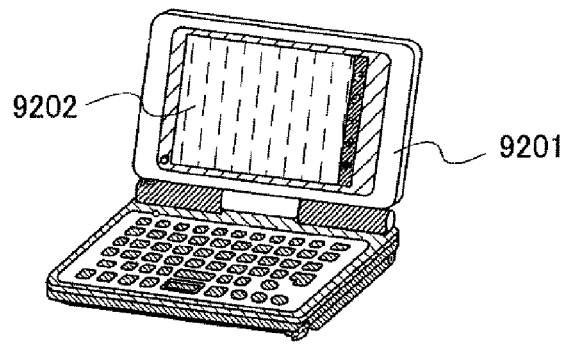
FIGS. 21A to 21F are diagrams each showing an electronic appliance of the present invention.

A portable information terminal device shown in FIG. 21A includes a main body 9201, a display portion 9202, and the like. The display device of the present invention can be applied to the display portion 9202. As a result, a high-performance portable information terminal device which can display a high-quality image with high visibility can be provided.

Figure 21B:
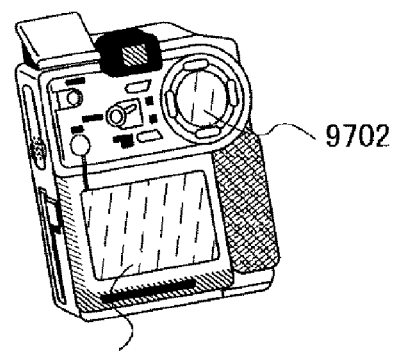

A digital video camera shown in FIG. 21B includes a display portion 9701, a display portion 9702, and the like. The display device of the present invention can be applied to the display portion 9701. As a result, a high-performance digital video camera which can display a high-quality image with high visibility can be provided.

Figure 21C:
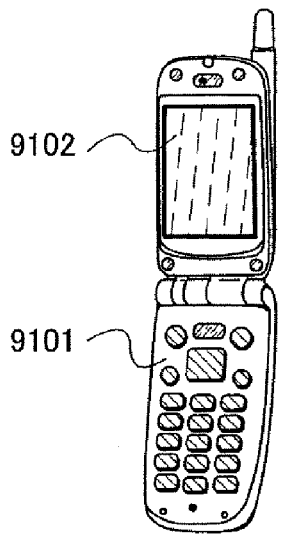

A cellular phone shown in FIG. 21C includes a main body 9101, a display portion 9102, and the like. The display device of the present invention can be applied to the display portion 9102. As a result, a high-performance cellular phone which can display a high-quality image with high visibility can be provided.

Figure 21D:
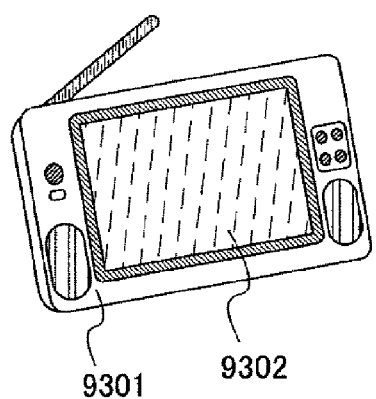

A portable television device shown in FIG. 21D includes a main body 9301, a display portion 9302 and the like. The display device of the present invention can be applied to the display portion 9302. As a result, a high-performance portable television device which can display a high-quality image with high visibility can be provided. The display device of the present invention can be applied to a wide range of television devices ranging from a small-sized television device mounted on a portable terminal such as a cellular phone, a medium-sized television device which can be carried, to a large-sized (for example, 40-inch or larger) television device.

Figure 21E:
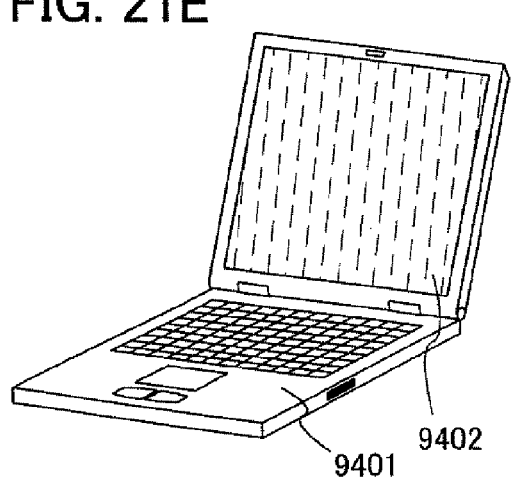

A portable computer shown in FIG. 21E includes a main body 9401, a display portion 9402, and the like. The display device of the present invention can be applied to the display portion 9402. As a result, a high-performance portable computer which can display a high-quality image with high visibility can be provided.

Figure 21F:
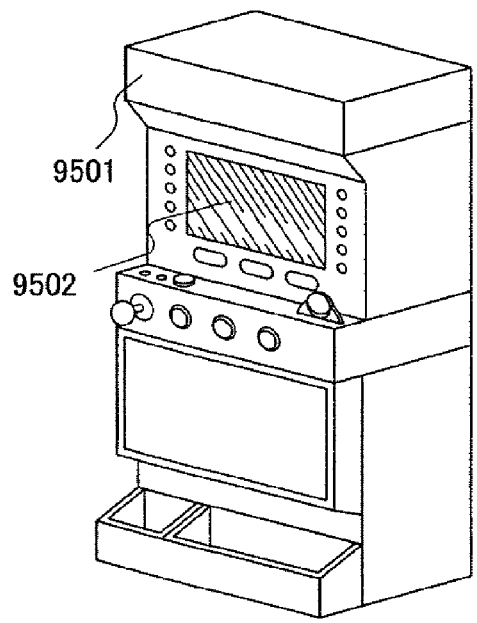

A slot machine shown in FIG. 21F includes a main body 9501, a display portion 9502, and the like. The display device of the present invention can be applied to the display portion 9502. As a result, a high-performance slot machine which can display a high-quality image with high visibility can be provided.

As described above, a high-performance electronic device which can display a high-quality image with high visibility can be provided by using the display device of the present invention.

This embodiment mode can be combined with any of Embodiment Modes 1 to 12 as appropriate.

This application is based on Japanese Patent Application serial no. 2006-327787 filed with Japan Patent Office on Dec. 5, 2006, the entire contents of which are hereby incorporated by reference.

EXPLANATION OF REFERENCE

50: electrode layer, 52: electroluminescent layer, 53: electrode layer, 54: insulating layer, 60: electrode layer, 61: light-emitting material, 62: electroluminescent layer, 63: electrode layer, 64: insulating layer, 100: substrate, 107: gate insulating layer, 167: insulating film, 168: insulating film, 177: pyramidal projection, 178: terminal electrode layer, 181: insulating film, 185: electrode layer, 186: insulating layer, 188: light-emitting layer, 189: electrode layer, 190: light-emitting element, 192: sealing material, 193: a filler, 194: FPC, 195: sealing substrate, 196: anisotropic conductive layer, 199: wiring layer, 201: separation region, 202: external terminal connection region, 203: wiring region, 204: peripheral driver circuit region, 205: connection region, 206: pixel region, 207: peripheral driver circuit region, 208: peripheral driver circuit region, 209: peripheral driver circuit region, 232: external terminal connection region, 233: sealing region, 234: peripheral driver circuit region, 236: pixel region, 245: thin film transistor, 265: thin film transistor, 275: thin film transistor, 285: thin film transistor, 332: lamp reflector, 352: backlight unit, 395: electrode layer, 396: electrode layer, 401: cold cathode fluorescent lamp, 410: display device, 450: display device, 451: pyramidal projection, 460: display device, 461: pyramidal projection, 470: display device, 471: pyramidal projection, 480: display device, 481: pyramidal projection, 486: film, 502: gate electrode layer, 504: semiconductor layer, 520: substrate, 521: transistor, 523: insulating layer 524: substrate, 526: gate insulating layer, 528: partition (insulating layer), 529: pyramidal projection, 530: light-emitting element, 531: electrode layer, 532: electroluminescent layer, 533: electrode layer, 534: insulating layer, 538: substrate, 54a: insulating layer, 54b: insulating layer, 550: substrate, 551: transistor, 554: semiconductor layer, 556: polarizer, 557: insulating layer, 558: gate insulating layer, 560: pixel electrode layer, 561: insulating layer, 562: liquid crystal layer, 563: insulating layer, 564: conductive layer, 565: colored layer, 567: pyramidal projection, 568: substrate, 569: polarizer, 581: transistor, 582: gate electrode layer, 584: gate insulating layer, 586: semiconductor layer, 589: spherical particle, 594: cavity, 595: filler, 596: substrate, 598: insulating layer, 600: substrate, 606: pixel region, 607: driver circuit region, 611: insulating film, 612: insulating film, 615: insulating film, 616: insulating film, 620: transistor, 621: transistor, 622: transistor, 623: capacitor, 630: pixel electrode layer, 631: insulating layer, 632: liquid crystal layer, 633: insulating layer, 634: conductive layer, 635: colored layer, 637: spacer, 641: polarizer, 642: pyramidal projection, 643: polarizer (polarizing plate), 64a: insulating layer, 64b: insulating layer, 678: terminal electrode layer, 692: sealing material, 695: counter substrate, 696: anisotropic conductive layer, 752: electroluminescent layer, 754: insulating layer, 757: pyramidal projection, 758: substrate, 762: electroluminescent layer, 764: insulating layer, 765: partition (insulating layer), 768: protective later, 772: electroluminescent layer, 774: insulating layer, 775: partition (insulating layer), 776: insulating layer, 777: pyramidal projection, 778: substrate, 792: electroluminescent layer, 794: insulating layer, 798: substrate, 802: third layer, 803: second layer, 804: first layer, 850: electrode layer, 860: electroluminescent layer, 870: electrode layer, 901: pixel portion, 902: signal line driver circuit, 903: scan line driver circuit, 904: tuner, 905: video signal amplifier circuit, 906: video signal processing circuit, 907: control circuit, 908: signal dividing circuit, 909: audio signal amplifier circuit, 910: audio signal processing circuit, 911: control circuit, 912: input portion, 913: speaker, 101a: base film, 101b: base film, 1300: element substrate, 1310: gate insulating layer, 1311: insulating film, 1312: insulating film, 1314: insulating layer, 1317: electrode layer, 1319: light-emitting layer, 1320: electrode layer, 1322: filler, 1324: wiring layer, 1325: sealing substrate, 1327: pyramidal projection, 1332: sealing material, 1333: wiring layer, 1355: thin film transistor, 1365: thin film transistor, 1375: thin film transistor, 1381: terminal electrode layer, 1382: anisotropic conductive layer, 1383: FPC, 1385: thin film transistor, 1600: element substrate, 1605: light-emitting element, 1610: gate insulating layer, 1611: insulating film, 1612: insulating film, 1614: insulating layer, 1617: electrode layer, 1619: light-emitting layer, 1620: electrode layer, 1621: protective film, 1622: filler, 1625: sealing substrate, 1632: sealing material, 1633: wiring layer, 1655: thin film transistor, 1665: thin film transistor, 1675: thin film transistor, 1681: terminal electrode layer, 1682: anisotropic conductive layer, 1683: FPC, 1685: thin film transistor, 1700: substrate, 1703: liquid crystal layer, 1704: insulating layer, 1705: counter electrode layer, 1706: colored layer, 1710: substrate, 1712: insulating layer, 1714: polarizing plate, 179a: wiring, 179b: wiring, 2001: chassis, 2002: display panel, 2003: main screen, 2004: modem, 2005: receiver, 2006: remote control device, 2007: display portion, 2008: subscreen, 2009: speaker portion, 2010: chassis, 2011: display portion, 2012: remote control device, 2013: speaker portion, 2600: TFT substrate, 2601: counter substrate, 2602: sealing material, 2603: pixel portion, 2604: display element, 2605: colored layer, 2606: polarizing plate, 2607: polarizing plate, 2609: flexible wiring board, 2610: cold cathode fluorescent lamp, 2611 reflective plate, 2612: circuit substrate, 2613: diffusing plate, 2626: pyramidal projection, 2700: substrate, 2701: pixel portion, 2702: pixel, 2703: scan line input terminal, 2704: signal line input terminal, 2751: driver IC, 2800: substrate, 2801: protective circuit portion, 2802: TFT, 2803: TFT, 2804: light-emitting element, 2805: light-emitting element, 2809: driver circuit, 2810: wiring substrate, 2811: external circuit substrate, 2812: heat sink, 2813: heat pipe, 2820: sealing substrate, 2827: pyramidal projection, 2912: control portion, 3700: substrate, 3701: pixel portion, 3702: scan line driver circuit, 3704: signal line input terminal 411a: pyramidal projection, 411b: pyramidal projection, 411c: pyramidal projection, 412a: incident light ray from external 412b: reflected light ray, 412c: reflected light ray, 412d: reflected light ray, 413a: transmitted light ray, 413b: transmitted light ray, 413c: transmitted light ray, 413d: transmitted light ray, 4700: substrate, 4701: pixel portion, 4702: scan line driver circuit, 4704: signal line driver circuit, 5000: pyramidal projection, 503a: semiconductor layer, 5100: top, 5200: pyramidal projection, 5230: pyramidal projection, 5250: pyramidal projection, 525a: wiring layer, 525b: wiring layer, 552a: gate electrode layer, 553a: semiconductor layer, 555a: wiring layer, 585a: wiring layer, 585b: wiring layer, 587a: electrode layer, 587b: electrode layer, 590a: black region, 590b: white region, 604a: base film, 604b: base film, 608a: driver circuit region, 608b: driver circuit region, 751a: electrode layer, 751b: electrode layer, 751c: electrode layer, 753a: electrode layer, 753b: electrode layer, 753c: electrode layer, 761a: electrode layer, 761b: electrode layer, 761c: electrode layer, 763b: electrode layer, 771a: electrode layer, 771b: electrode layer, 771c: electrode layer, 773b: electrode layer, 791a: electrode layer, 791b: electrode layer, 791c: electrode layer, 793b: electrode layer, 9101: main body, 9102: display portion, 9201: main body, 9202: display portion, 9301: main body, 9302: display portion, 9404: main body, 9402: display portion, 9701: display portion, 9702: display portion, 1301a: insulating film, 1301b: insulating film, 1601a: insulating film, 1601b: insulating film, 1627a: pyramidal projection, 1701a: pixel electrode layer, 2806a: spacer, 2806b: spacer, 2807a: colored layer, 2807b: colored layer, 2807c: colored layer, 2910a: red light source 2910b: green light source, 2910c: blue light source, 5001a: pyramidal projection, 520a: pyramidal projection, 5231a: pyramidal projection, 5251a: pyramidal projection

The invention claimed is:

1. An antireflective film comprising:
a plurality of pyramidal projections,
wherein tops of the plurality of pyramidal projections are evenly spaced,
wherein each side of the base of one pyramidal projection is in contact with one side of the base of an adjacent pyramidal projection, and
wherein a refractive index of each of the plurality of pyramidal projections increases from the top to the base thereof.

2. The antireflective film according to claim 1, wherein six adjacent pyramidal projections are arranged around one pyramidal projection.

3. An antireflective film comprising:
a plurality of pyramidal projections,
wherein tops of the plurality of pyramidal projections are evenly spaced,
wherein each side of the base of one pyramidal projection is in contact with one side of the base of an adjacent pyramidal projection,
wherein the distance between the tops of the plurality of pyramidal projections is equal to or shorter than 350 nm and the height of each of the plurality of pyramidal projections is equal to or longer than 800 nm, and
wherein a refractive index of each of the plurality of pyramidal projections increases from the top to the base thereof.

4. The antireflective film according to claim 3, wherein six adjacent pyramidal projections are arranged around one pyramidal projection.

5. The antireflective film according to claim 3, wherein the fill rate of bases of the plurality of pyramidal projections per unit area is equal to or more than 80%.

6. The antireflective film according to claim 4, wherein the fill rate of bases of the plurality of pyramidal projections per unit area is equal to or more than 80%.

7. The antireflective film according to claim 5, wherein the ratio of the height of a pyramidal projection to the width of a base thereof is equal to or more than 5.

8. The antireflective film according to claim 6, wherein the ratio of the height of a pyramidal projection to the width of a base thereof is equal to or more than 5.

9. A display device comprising:
a pair of substrates at least one of which is a light-transmitting substrate;
a display element provided between the pair of substrates; and
a plurality of pyramidal projections on an outer side of the light-transmitting substrate,
wherein tops of the plurality of pyramidal projections are evenly spaced,
wherein each side of the base of one pyramidal projection is in contact with one side of the base of an adjacent pyramidal projection, and
wherein a refractive index of each of the plurality of pyramidal projections increases from the top to the base thereof.

10. The display device according to claim 9, wherein six adjacent pyramidal projections are arranged around one pyramidal projection.

11. A display device comprising:
a pair of substrates at least one of which is a light-transmitting substrate;
a display element provided between the pair of substrates; and
a plurality of pyramidal projections on an outer side of the light-transmitting substrate,
wherein tops of the plurality of pyramidal projections are evenly spaced,
wherein each side of the base of one pyramidal projection is in contact with one side of the base of an adjacent pyramidal projection,
wherein the distance between the tops of the plurality of pyramidal projections is equal to or shorter than 350 nm and the height of each of the plurality of pyramidal projections is equal to or longer than 800 nm, and
wherein a refractive index of each of the plurality of pyramidal projections increases from the top to the base thereof.

12. The display device according to claim 11, wherein six adjacent pyramidal projections are arranged around one pyramidal projection.

13. The display device according to claim 11, wherein the fill rate of bases of the plurality of pyramidal projections per unit area is equal to or more than 80%.

14. The display device according to claim 12, wherein the fill rate of bases of the plurality of pyramidal projections per unit area is equal to or more than 80%.

15. The display device according to claim 13, wherein the ratio of the height of a pyramidal projection to the width of a base there of is equal to or more than 5.

16. The display device according to claim 14, wherein the ratio of the height of a pyramidal projection to the width of a base there of is equal to or more than 5.

17. The display device according to claim 9, wherein a polarizing plate is provided between the light-transmitting substrate and the plurality of pyramidal projections.

18. The display device according to claim 9, wherein the display element is a light-emitting element.

19. The display device according to claim 9, wherein the display element is a liquid crystal display element.

20. The display device according to claim 11, wherein a polarizing plate is provided between the light-transmitting substrate and the plurality of pyramidal projections.

21. The display device according to claim 11, wherein the display element is a light-emitting element.

22. The display device according to claim 11, wherein the display element is a liquid crystal display element.

* * * * *

UNITED STATES PATENT AND TRADEMARK OFFICE
CERTIFICATE OF CORRECTION

PATENT NO.        : 7,859,627 B2
APPLICATION NO.   : 11/950677
DATED             : December 28, 2010
INVENTOR(S)       : Jiro Nishida et al.

It is certified that error appears in the above-identified patent and that said Letters Patent is hereby corrected as shown below:

Col. 11, line 51, "350 non (white circular dots)" should read "350 nm (white circular dots)"

Col. 11, line 63, "when the height A is 800nm" should read "when the height b is 800nm"

Col. 12, line 7, "height b to be the width a (A/a)" should read "height b to be the width a (b/a)"

Col. 12, lines 10-11, "and 400 nun (quadrangular dots)" should read "and 400 nm (quadrangular dots)"

Col. 12, line 28, "when the ratio of the height (to the width" should read "when the ratio of the height b to the width"

Col. 16, lines 56-57, "element shown in FIG. 613" should read "element shown in FIG. 6B"

Col. 23, line 37, "semiconductor Layer containing a rare gas" should read "semiconductor layer containing a rare gas"

Col. 26, line 34, "wiring layers 555a, 555h" should read "wiring layers 555a, 555b"

Col. 30, line 49, "FIG. 813 is a" should read "FIG. 8B is a"

Col. 33, line 3, "when ROB light-emitting" should read "when RGB light-emitting"

Col. 34, line 34, "screen surface as shown in FIG. 5B" should read "screen surface as shown in FIG. 8B"

Signed and Sealed this
Third Day of July, 2012

David J. Kappos
*Director of the United States Patent and Trademark Office*

CERTIFICATE OF CORRECTION (continued)
U.S. Pat. No. 7,859,627 B2

Col. 35, line 8, "largest number of sides any pyramidal" should read
"largest number of sides of any pyramidal"

Col. 46, line 50, "device having an antireflection function" should read
"device having an anti-reflection function"

Col. 48, line 5, "emission structure shown in FIG. 1" should read
"emission structure shown in FIG. 11"

Col. 48, lines 65-66, "pyramidal projections 1627a and 627b are" should read
"pyramidal projections 1627a and 1627b"

Col. 54, line 12, "bis[2-(2'-benzothienyl" should read
"bis[2-(2'-benzothienyl)"

Col. 55, line 20, "forming a light-emitting layer;" should read
"forming a light-emitting layer,"

Col. 56, line 26, "the seating substrate" should read
"the sealing substrate"

Col. 58, line 41, "a tight-emitting material" should read
"a light-emitting material"

Col. 63, line 56, "purity of ROB colors" should read "purity of RGB colors"

Col. 63, line 67, "light-emitting diodes of ROB colors" should read
"light-emitting diodes of RGB colors"

Col. 68, line 13, "display may be 1920×1080×3 (ROB)." should read
"display may be 1920×1080×3 (RGB)."